United States Patent
Valouch et al.

(10) Patent No.: US 11,496,223 B2
(45) Date of Patent: Nov. 8, 2022

(54) TRANSMITTER FOR TRANSMITTING DATA AND FOR EMITTING ELECTROMAGNETIC RADIATION IN THE VISIBLE SPECTRAL RANGE AND DATA TRANSMISSION SYSTEM

(71) Applicant: BASF SE, Ludwigshafen am Rhein (DE)

(72) Inventors: Sebastian Valouch, Ludwigshafen (DE); Robert Send, Ludwigshafen (DE); Sorin Ivanovici, Ludwigshafen (DE); Hannah Stephanie Mangold, Ludwigshafen (DE); Martin Koenemann, Ludwigshafen (DE)

(73) Assignee: BASF SE

( * ) Notice: Subject to any disclaimer, the term of this patent is extended or adjusted under 35 U.S.C. 154(b) by 167 days.

(21) Appl. No.: 16/639,387

(22) PCT Filed: Aug. 23, 2018

(86) PCT No.: PCT/EP2018/072714
§ 371 (c)(1),
(2) Date: Feb. 14, 2020

(87) PCT Pub. No.: WO2019/038354
PCT Pub. Date: Feb. 28, 2019

(65) Prior Publication Data
US 2020/0259567 A1    Aug. 13, 2020

(30) Foreign Application Priority Data
Aug. 24, 2017   (EP) .................................... 17187793

(51) Int. Cl.
*H04B 10/00*   (2013.01)
*H04B 10/572*  (2013.01)
(Continued)

(52) U.S. Cl.
CPC ............ *H04B 10/572* (2013.01); *C09K 11/06* (2013.01); *H01L 33/502* (2013.01); *H04B 10/502* (2013.01)

(58) Field of Classification Search
CPC .. H04B 10/116; H04B 10/572; H04B 10/502; H04B 10/516; C09K 11/06; H01L 33/502
(Continued)

(56) References Cited

U.S. PATENT DOCUMENTS

| 2,551,731 A | 5/1951 | Napier Drewitt et al. |
| 3,357,985 A | 12/1967 | Fuchs et al. |

(Continued)

FOREIGN PATENT DOCUMENTS

| EP | 3 072 887 A1 | 9/2016 |
| EP | 3 101 087 A1 | 12/2016 |

(Continued)

OTHER PUBLICATIONS

U.S. Appl. No. 16/069,954, filed Jul. 13, 2018, US 2019/0023905 A1, Martin Koenemann, et al.

(Continued)

*Primary Examiner* — Hanh Phan
(74) *Attorney, Agent, or Firm* — Faegre Drinker Biddle & Reath LLP

(57) ABSTRACT

The present invention relates to a transmitter for transmitting data and for emitting electromagnetic radiation in the visible spectral range, wherein the transmitter comprises a) a radiation source for generating and emitting first electromagnetic radiation, b) a modulator being adapted to modulate the first electromagnetic radiation depending on the data to be transmitted generating modulated first electromagnetic radiation, and c) a frequency converter for converting at least a part of the modulated first electromagnetic radiation into modulated second electromagnetic radiation, said modulated second (Continued)

electromagnetic radiation being different from the modulated first electromagnetic radiation, wherein the frequency converter comprises a polymeric matrix material comprising at least one organic fluorescent colorant. Furthermore, the invention relates to an illumination device comprising such transmitter. Moreover, the invention relates to a data transmission system comprising such a transmitter as well as a receiver and a data analyzer.

15 Claims, 1 Drawing Sheet

(51) Int. Cl.
    *C09K 11/06*     (2006.01)
    *H01L 33/50*     (2010.01)
    *H04B 10/50*     (2013.01)

(58) Field of Classification Search
    USPC ....... 398/172, 118, 119, 127, 128, 130, 135,
                   398/136, 189, 182, 183, 158, 159
    See application file for complete search history.

(56) References Cited

U.S. PATENT DOCUMENTS

| | | | |
|---|---|---|---|
| 4,845,223 | A | 7/1989 | Seybold et al. |
| 5,470,502 | A | 11/1995 | Hahn et al. |
| 6,472,050 | B1 | 10/2002 | Buoni |
| 8,071,775 | B2 | 12/2011 | Koenemann et al. |
| 8,554,084 | B2 * | 10/2013 | Song .................... H04B 10/116 398/172 |
| 9,020,355 | B2 | 4/2015 | Yeh et al. |
| 9,236,535 | B2 | 1/2016 | Wagenblast et al. |
| 9,406,848 | B2 | 8/2016 | Koenemann et al. |
| 9,711,665 | B2 | 7/2017 | Wagenblast et al. |
| 9,790,423 | B2 | 10/2017 | Koenemann et al. |
| 9,919,999 | B2 | 3/2018 | Koenemann et al. |
| 10,230,023 | B2 | 3/2019 | Koenemann et al. |
| 2011/0282020 | A1 | 11/2011 | Sipos |
| 2011/0306804 | A1 | 12/2011 | Cortright |
| 2012/0269520 | A1 * | 10/2012 | Hong .................... H01L 33/62 398/172 |
| 2013/0260126 | A1 | 10/2013 | Han et al. |
| 2014/0336349 | A1 | 11/2014 | Sipos et al. |
| 2016/0084477 | A1 * | 3/2016 | Wagenblast ........... C09K 11/06 362/84 |
| 2016/0264860 | A1 | 9/2016 | Lub et al. |
| 2017/0183295 | A1 * | 6/2017 | Koenemann ........ C09K 11/7774 |

FOREIGN PATENT DOCUMENTS

| | | |
|---|---|---|
| EP | 3 523 303 A1 | 8/2019 |
| TW | 201409957 A | 3/2014 |
| WO | WO 2004/029028 A2 | 4/2004 |
| WO | WO 2007/006717 A1 | 1/2007 |
| WO | WO 2009/037283 A1 | 3/2009 |
| WO | WO 2010/132740 A2 | 11/2010 |
| WO | WO 2011/043660 A2 | 4/2011 |
| WO | WO 2011/043661 A1 | 4/2011 |
| WO | WO 2012/152812 A1 | 11/2012 |
| WO | WO 2012/168395 A1 | 12/2012 |
| WO | WO 2014/122549 A1 | 8/2014 |
| WO | WO 2014/131628 A1 | 9/2014 |
| WO | WO 2015/019270 A1 | 2/2015 |
| WO | WO 2015/062916 A1 | 5/2015 |
| WO | WO 2015/137804 A1 | 9/2015 |
| WO | WO 2015/169935 A1 | 11/2015 |
| WO | WO 2016/026863 A1 | 2/2016 |
| WO | WO 2016/151068 A1 | 9/2016 |
| WO | WO 2017/121833 A1 | 7/2017 |
| WO | WO 2018/134261 A1 | 7/2018 |

OTHER PUBLICATIONS

U.S. Appl. No. 16/339,653, filed Apr. 4, 2019, US 2020/0071531 A1, Martin Koenemann, et al.
U.S. Appl. No. 16/478,380, filed Jul. 16, 2019, Martin Koenemann, et al.
U.S. Appl. No. 16/477,750, filed Jul. 12, 2019, US 2019/0359829 A1, Martin Koenemann, et al.
U.S. Appl. No. 16/496,886, filed Sep. 23, 2019, US 2020/0123314 A1, Martin Koenemann, et al.
International Search Report dated Nov. 27, 2018 in PCT/EP2018/072714, 3 pages.
Written Opinion of the International Searching Authority dated Nov. 27, 2018 in PCT/EP2018/072714, 7 pages.
International Preliminary Report on Patentability dated Nov. 14, 2019 in PCT/EP2018/072714 filed Aug. 23, 2018, 7 pages.
Muhammad T. Sajjad, et al., "Fluorescent Red-Emitting BODIPY Oligofluorene Star-Shaped Molecules as a Color Converter Material for Visible Light Communications" Advanced Optical Materials, vol. 3, No. 4, XP055456699, Nov. 12, 2014, pp. 536-540.
Hyunchae Chun, et al., "Visible Light Communication Using a Blue GaN µLED and Fluorescent Polymer Colour Converter" IEEE Photonics Technology Letters, IEEE Service Center, Piscataway, NJ, US, vol. 26, No. 20, XP011559681, Oct. 15, 2014, pp. 2035-2038.
M. T. Sajjad, et al., "A Saturated Red Color Converter for Visible Light Communication Using a Blend of Star-Shaped Organic Semiconductors" Applied Physics Letters, vol. 110, 2017, p. 013302-1-013302-4 and cover page.
Muhammad T. Sajjad, et al., "A Novel Fast Color-Converter for Visible Light Communication Using a Blend of Conjugated Polymers" online: https://pure.strath.ac.uk/portal/files/41605644/Sajjad_etal_ACS_Photonics_2015_Novel_fast_color_converter_for_visible_light_communication.pdf, 2015, 16 pages.

* cited by examiner

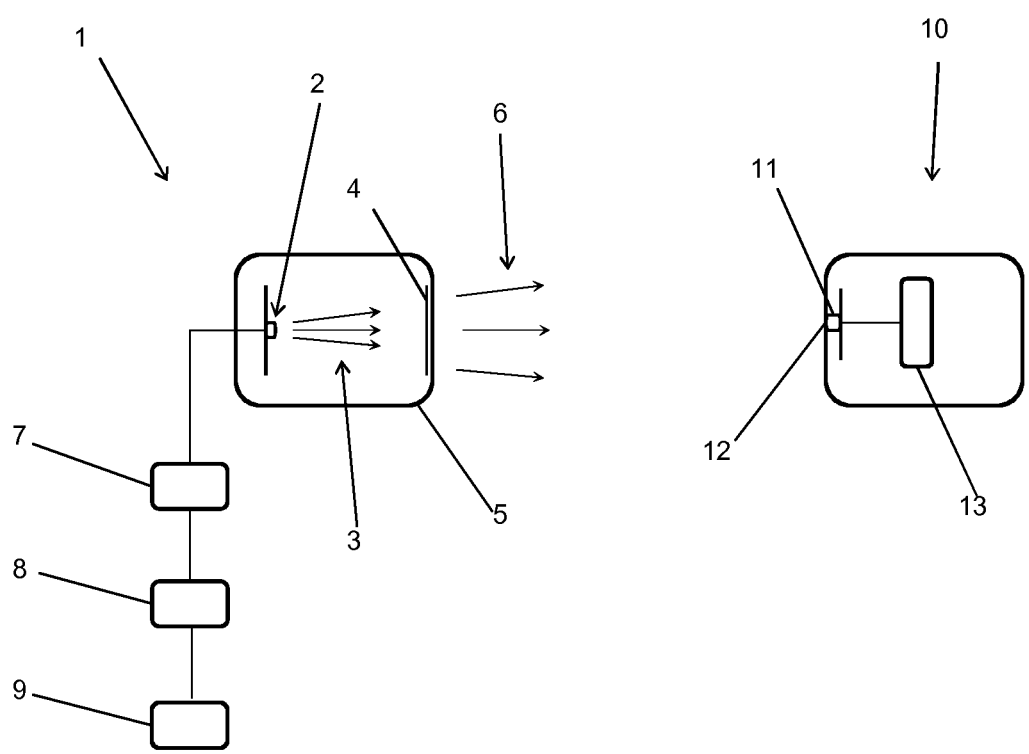

TRANSMITTER FOR TRANSMITTING DATA AND FOR EMITTING ELECTROMAGNETIC RADIATION IN THE VISIBLE SPECTRAL RANGE AND DATA TRANSMISSION SYSTEM

The present invention relates to a transmitter for transmitting data and for emitting electromagnetic radiation in the visible spectral range. The transmitter comprises a radiation source for generating and emitting a first electromagnetic radiation. Furthermore, the transmitter comprises a modulator being adapted to modulate the first electromagnetic radiation depending on the data to be transmitted generating a modulated first electromagnetic radiation. Furthermore, the invention relates to an illumination device comprising such transmitter. Moreover, the invention relates to a data transmission system comprising such a transmitter as well as a receiver and a data analyzer.

BACKGROUND OF THE INVENTION

Visible Light Communication (VLC) is a rapid growing technological field that aims to implement fast and safe wireless communication to replace or complement existing wireless technologies. New technologies like the internet of things (being the basis for industry 4.0, IP 4.0 ®, etc.), wearables (i.e. smart electronic devices with microcontrollers that can be worn on the body as implant or accessories) and the general increase in mobile communication lead to a rapid increase in data streams and the necessity for new communication channels. Organic semiconductors that can be used inter alia as frequency converters in remote phosphor LEDs offer many potential advantages for VLC due to their visible band gaps, short radiative lifetime, and high photoluminescence quantum yield (PLQY). Actually, light emitting diodes (LEDs) are replacing existing lighting sources to an ever increasing extent. LiFi (Light Fidelity) is the term established for the transmission of data through illumination using LED lighting that varies in its intensity for high speed wireless communication. Together with the widespread use of LED lighting in offices, streetlights and homes, LiFi is an added benefit to the existing lighting infrastructure.

A key problem that still needs to be solved is the slow response of commercial white LEDs. So far, there exists no LED which can emit white light directly. White-light LEDs can be created from blue- or near-ultraviolet-emitting LED chips (emission wavelength of blue-emitting LED around 450 nm) coated or covered with a yellow luminescent material. According to this concept, the luminescent material is applied directly and without intervening space to the LED light source (LED chip). This concept is also referred to as "phosphor on a chip". In phosphor on a chip LEDs, the luminescent material used is generally an inorganic material (e.g. doped YAG) that absorbs part of the blue LED emission and re-emits a broad yellow spectrum. Often LEDs of this type generate cool white light (i.e. they have a correlated color temperature CCT of greater than 6 000 K) and their average color rendering index CRI is low, usually about 70 to 85.

To provide a more pleasing and natural white light having a CCT of below 6 000 K, a different concept may be used. According to this concept, the luminescent material is dissolved or dispersed in a polymeric matrix which is at a certain distance from the blue LED chip. This structure is referred to as "remote phosphor".

However, the photoluminescence lifetime (fluorescent/phosphorescent lifetime or excited-state lifetime) of conventional phosphors is too long (ranging in the order of greater than 10 nanoseconds and up to some microseconds) to support high rates of data transmission. To transmit data via LED lighting the IEEE 802.15.7-2011 standard specifies optical clock frequencies up to 120 Mhz, which requires on-off times of the LEDs in the order of nanoseconds. One solution for LiFi applications is currently the use of RGB-LEDs that combine the colors red, green and blue to provide white light. To be fast enough for data transmission another option is to use only the blue LED emission and filter out the other wavelengths converted by the phosphors with too long fluorescent lifetimes. As only a small amount (typically about 6%) of the energy is in the blue part of the spectrum these systems are limited in range. First commercial LiFi products that enable a wireless network through a bidirectional line, like the Lucibel LiFi system, are already available but still need remarkable improvement.

To be useful as frequency converter material in VLC applications, the organic fluorescent colorant must have a high photostability under irradiation conditions. A further important characteristic for the frequency converter material is a short excited-state lifetime in combination with a high fluorescence quantum yield because the capacity of a communication channel is proportional to its bandwidth and modulation bandwidth depends on excited-state lifetime and fluorescence quantum yield of the frequency converter material. Organic fluorescent colorants known from prior art, however, often suffer from an insufficient photostability and/or long excited-state lifetime in combination with insufficient fluorescence quantum yield which limits the intrinsic system bandwidth to a few MHz.

H. Chun et al describe in their online article with the title "Visible Light Communication using a Blue GaN pLED and Fluorescent Polymer Colour Converter" (https://pure.strath.ac.uk/portal/files/44580356/Chun_etal_IEEE_PTL_2015_Visible_light_communication_using_a_blue_GaN_uLED_and_fluorescent.pdf) a novel technique to achieve high-speed visible light communication using white light generated by a blue GaN μLED and a yellow fluorescent copolymer, namely a conjugated copolymer of poly para-phenylene vinylene. By this technique the ratio between the blue electroluminescence of the μLED and the yellow photoluminescence of the copolymer frequency converter is improved. The conjugated copolymer of poly para-phenylene vinylene ("Super Yellow") has a photoluminescence quantum yield in solution of 60%. No mention is made regarding the photostability of the conjugated copolymer of poly para-phenylene vinylene under irradiation conditions.

M. T. Sajjad et al. describe in Adv. Optical Mater. 2015, 3, 536-540 fluorescent red-emitting boron dipyrromethene (BODIPY)-oligofluorene star-shaped molecules as a frequency converter material for VLC. The measured excited-state lifetimes in solution are in the range of 3.36-5.22 ns and the emissive lifetimes (ratio of the measured lifetime and photoluminescence quantum yield) in solution are in the range of 4.49-8.80 ns. Usually, the photoluminescence quantum yield of organic fluorescent colorants in solid films is lower than in solution. Thus, the data of Sajjad do not allow any conclusions to be made with regard to emissive lifetime of the specific fluorescent compounds in a solid film, which would represent real application conditions. No mention is made regarding the photostability of the BODIPY compounds under irradiation conditions.

None of the above-mentioned documents describes any photophysical properties of organic fluorescent colorants in solid films by measuring photoluminescence quantum yield and photoluminescence lifetime under real application conditions.

M. T. Sajjad et al. describe in Appl. Phys. Lett. 110, 013302 (2017) a saturated red frequency converter for visible light communication using a blend of starshaped organic semiconductors.

M. T. Sajjad et al. describe in their online published article "A novel fast color-converter for visible light communication using a blend of conjugated polymers" (https://pure.strath.ac.uk/portal/files/41605644/Sajjad_etal_ACS_Photonics_2015 Novel_fast_color_converter_for_visible_light_communication.pdf) to use a blend of semiconducting polymers, in particular the highly fluorescent green emitting poly[2,5-bis (2/,5/-bis(2//-ethylhexyloxy)phenyl)-p-phenylenevinylene) (BBEHP-PPV) and the orange-red emitting poly[2-methoxy-5-(2-ethyl-hexyloxy)-1,4-phenylenevinylene] (MEH-PPV) as fast color-converters to replace commercial phosphors in hybrid LEDs for visible light communication. It was possible to achieve a broadband, balanced frequency converter with a very high modulation bandwidth to replace commercial phosphors in hybrid LEDs for visible light communications. The resulting frequency converter exploits partial Förster energy transfer from green-emitting BBEHP-PPV to orange-red emitting MEH-PPV. The achieved 3 dB modulation bandwidth (electrical-electrical) was 40 times higher than with commercially available phosphor LEDs, and 5 times higher than with the afore-mentioned red-emitting organic frequency converters.

There is a great demand in phosphors that have fluorescent lifetimes in the order of a few nanoseconds and preferably even lower while maintaining good emission efficiency, preferably in combination with high photostability. Further, it should at the same time be possible to provide a lighting device having a good color reproduction and color temperature. Preferably, the lighting device should have a CCT below 6 000 K, preferably below 4 000 K and an average color rendering index CRI greater than 90 and a pleasant R9 value.

It is therefore an object of the present invention to provide organic fluorescent colorants for use in frequency converters with a very high modulation bandwidth for LiFi applications comprising a transmitter for transmitting data and for emitting electromagnetic radiation in the visible spectral range having short excited-state lifetimes in combination with a high fluorescence quantum yield, a high photostability and a good color reproduction with data transmission and good correlated color temperature. Preferably, the organic fluorescent colorant(s) should be significantly excited by the light emitted from the radiation source.

Preferably, the organic fluorescent colorants should have one or more of the following characteristics:
  short fluorescent lifetimes (excited-state lifetime) in the order of a few nanoseconds;
  short emissive lifetime in the order of a few nanoseconds;
  high light stability (photostability) under blue light and/or white light irradiation conditions;
  high heat stability under blue light and/or white light irradiation conditions;
  high chemical stability with respect to moisture and oxygen;
  high fluorescence quantum yield (QY);
  good solution processability;
  good extrusion processability of the fluorescent colorant into a polymer matrix; and
  significant absorption at about 450 nm.

It was now surprisingly found that the aforementioned disadvantages of the prior art can be overcome by a transmitter for transmitting data and for emitting electromagnetic radiation in the visible spectral range, comprising a frequency converter that comprises at least one organic fluorescent colorant B selected from the groups (B1) to (B16) as defined herein.

SUMMARY OF THE INVENTION

The present invention relates to a transmitter for transmitting data and for emitting electromagnetic radiation in the visible spectral range, said transmitter comprising:
  a radiation source for generating and emitting first electromagnetic radiation,
  a modulator being adapted to modulate the first electromagnetic radiation depending on the data to be transmitted generating modulated first electromagnetic radiation, and
  a frequency converter for converting at least a part of the modulated first electromagnetic radiation into modulated second electromagnetic radiation, said modulated second electromagnetic radiation being different from the modulated first electromagnetic radiation,
wherein the frequency converter comprises a polymeric matrix material and at least one organic fluorescent colorant B selected from:
(B1) a naphthoylbenzimidazole compound of formula (I)

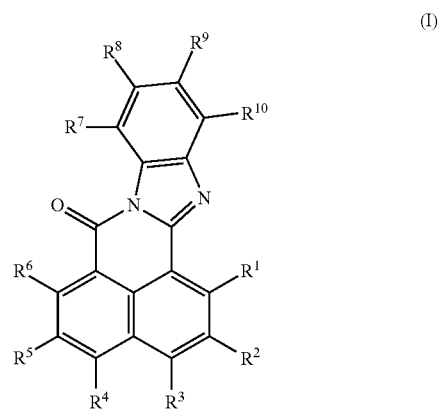

(I)

wherein
at least one of the radicals $R^1$, $R^2$, $R^3$, $R^4$, $R^5$, $R^6$, $R^7$, $R^8$, $R^9$ and $R^{10}$ independently of each other is aryl which carries one, two or three cyano groups and 0, 1, 2, 3 or 4 substituents $R^{Ar}$ and the remaining radicals $R^1$, $R^2$, $R^3$, $R^4$, $R^5$, $R^6$, $R^7$, $R^8$, $R^9$ and $R^{10}$ independently of each other are selected from hydrogen or aryl which is unsubstituted or carries 1, 2, 3, 4 or 5 substituents $R^{Ar}$
where
  $R^{Ar}$ independently of each other and independently of each occurrence is selected from halogen,
    $C_1$-$C_{30}$-alkyl, $C_2$-$C_{30}$-alkenyl, $C_2$-$C_{30}$-alkynyl, where the three latter radicals are unsubstituted or carry one or more $R^a$ groups,
    $C_3$-$C_8$-cycloalkyl, 3- to 8-membered heterocyclyl, where the two latter radicals are unsubstituted or carry one or more $R^b$ groups,
    aryl or heteroaryl, where the two latter radicals are unsubstituted or carry one or more $R^c$ groups,
  where $R^a$ independently of each other and independently of each occurrence is selected from cyano, halogen, $C_3$-$C_8$-cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^b$ independently of each other and independently of each occurrence is selected from cyano, halogen, $C_1$-$C_{18}$-alkyl, $C_3$-$C_8$-cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^c$ independently of each other and independently of each occurrence is selected from cyano, halogen, $C_1$-$C_{18}$-alkyl, $C_3$-$C_8$-cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^{b1}$ independently of each other and independently of each occurrence is selected from halogen, $C_1$-$C_{18}$-alkyl or $C_1$-$C_{18}$-haloalkyl, $R^{c1}$ independently of each other and independently of each occurrence is selected from halogen, $C_1$-$C_{18}$-alkyl or $C_1$-$C_{18}$-haloalkyl;

and mixtures thereof;

(B2) a cyanated naphthoylbenzimidazole compound of formula (II)

(II)

wherein
$R^{21}$, $R^{22}$, $R^{23}$, $R^{24}$, $R^{25}$, $R^{26}$, $R^{27}$, $R^{28}$, $R^{29}$ and $R^{210}$ are each independently hydrogen, cyano or aryl which is unsubstituted or has one or more identical or different substituents $R^{2Ar}$, where
each $R^{2Ar}$ is independently selected from cyano, hydroxyl, mercapto, halogen, $C_1$-$C_{20}$-alkoxy, $C_1$-$C_{20}$-alkylthio, nitro, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, $C_1$-$C_{30}$-alkyl, $C_2$-$C_{30}$-alkenyl, $C_2$-$C_{30}$-alkynyl, where the three latter radicals are unsubstituted or bear one or more $R^{2a}$ groups, $C_3$-$C_8$-cycloalkyl, 3- to 8-membered heterocyclyl, where the two latter radicals are unsubstituted or bear one or more $R^{2b}$ groups, aryl, U-aryl, heteroaryl or U-heteroaryl, where the four latter radicals are unsubstituted or bear one or more $R^{2b}$ groups, where
each $R^{2a}$ is independently selected from cyano, hydroxyl, mercapto, halogen, $C_1$-$C_{20}$-alkoxy, $C_1$-$C_{20}$-alkylthio, nitro, —$NR^{2Ar2}R^{Ar3}$, —$NR^{2Ar2}COR^{2Ar3}$, —$CONR^{2Ar2}R^{Ar3}$, —$SO_2NR^{2Ar2}R^{Ar3}$, —$COOR^{2Ar2}$, —$SO_3R^{2Ar2}$, $C_3$-$C_8$-cycloalkyl, 3- to 8-membered heterocyclyl, aryl or heteroaryl, where the cycloalkyl, heterocyclyl, aryl and heteroaryl radicals are unsubstituted or bear one or more $R^{2b}$ groups, and where 2 radicals $R^{2a}$ bound at the same carbon atom may form together a group =O;

each $R^{2b}$ is independently selected from cyano, hydroxyl, mercapto, halogen, $C_1$-$C_{20}$-alkoxy, $C_1$-$C_{20}$-alkylthio, nitro, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, $C_1$-$C_{18}$-alkyl, $C_2$-$C_{18}$-alkenyl, $C_2$-$C_{18}$-alkynyl, $C_3$-$C_8$-cycloalkyl, 3- to 8-membered heterocyclyl, aryl or heteroaryl, where the four latter radicals are unsubstituted or bear one or more $R^{2b1}$ groups, and where 2 radicals $R^{2b}$ bound at the same carbon atom may form together a group =O;

each $R^{2b1}$ is independently selected from cyano, hydroxyl, mercapto, nitro, halogen, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, —$SO_3R^{2Ar2}$, $C_1$-$C_{18}$-alkyl, $C_2$-$C_{18}$-alkenyl, $C_2$-$C_{18}$-alkynyl, $C_1$-$C_{12}$-alkoxy, or $C_1$-$C_{12}$-alkylthio, and where 2 radicals $R^{2b1}$ bound at the same carbon atom may form together a group =O;

U is an —O—, —S—, —$NR^{2Ar1}$—, —CO—, —SO— or —$SO_2$— moiety; $R^{2Ar1}$, $R^{2Ar2}$, $R^{2Ar3}$ are each independently hydrogen, $C_1$-$C_{18}$-alkyl, 3- to 8-membered cycloalkyl, 3- to 8-membered heterocyclyl, aryl or heteroaryl, where alkyl is unsubstituted or bears one or more $R^{2a}$ groups, where 3- to 8-membered cycloalkyl, 3- to 8-membered heterocyclyl, aryl and heteroaryl are unsubstituted or bear one or more $R^{2b}$ groups;

with the proviso that the compound of formula (II) comprises at least one cyano group, and mixtures thereof;

(B3) a cyanated perylene compound of formula (III)

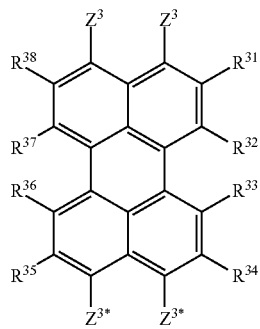

(III)

in which
one of the $Z^3$ substituents is cyano and the other $Z^3$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and
$C_6$-$C_{14}$-aryl is unsubstituted or bears one or more identical or different $Z^{3Ar}$ substituents;
one of the $Z^{3*}$ substituents is cyano and the other $Z^{3*}$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where
$C_1$-$C_{18}$-alkyl, $C_2$-$C_{18}$-alkenyl, $C_2$-$C_{18}$-alkynyl are unsubstituted or bear one or more identical or different $Z^{3a}$ substituents,
$C_3$-$C_{12}$-cycloalkyl is unsubstituted or bears one or more identical or different $Z^{3b}$ substituents, and
$C_6$-$C_{14}$-aryl is unsubstituted or bears one or more identical or different $Z^{3Ar}$ substituents;
$R^{31}$, $R^{32}$, $R^{33}$, $R^{34}$, $R^{35}$, $R^{36}$, $R^{37}$ and $R^{38}$ are each independently selected from hydrogen, cyano, bromine or chlorine,
with the proviso that 1, 2, 3, 4, 5, 6, 7 or 8 of the $R^{31}$, $R^{32}$, $R^{33}$, $R^{34}$, $R^{35}$, $R^{36}$, $R^{37}$ or $R^{38}$ substituents are cyano;
where
$R^{39}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where
$C_1$-$C_{10}$-alkyl, $C_2$-$C_{10}$-alkenyl, $C_2$-$C_{10}$-alkynyl are unsubstituted or bear one or more identical or different $R^{3a}$ substituents,
$C_3$-$C_{12}$-cycloalkyl is unsubstituted or bears one or more identical or different $R^{3b}$ substituents and
$C_6$-$C_{14}$-aryl is unsubstituted or bears one or more identical or different $R^{3Ar}$ substituents;
$R^{310}$ and $R^{311}$ are each independently hydrogen, $C_1$-$C_{10}$-alkyl, $C_2$-$C_{100}$-alkenyl, $C_2$-$C_{10}$-alkynyl, $C_3$-$C_{12}$-cycloalkyl or $C_6$-$C_{14}$-aryl, where
$C_1$-$C_{10}$-alkyl, $C_2$-$C_{10}$-alkenyl, $C_2$-$C_{10}$-alkynyl are unsubstituted or bear one or more identical or different $R^{3a}$ substituents,
$C_3$-$C_{12}$-cycloalkyl is unsubstituted or bears one or more identical or different $R^{3b}$ substituents and
$C_6$-$C_{14}$-aryl is unsubstituted or bears one or more identical or different $R^{3Ar}$ substituents;
each $Z^{3a}$ is independently halogen, hydroxyl, $NR^{310a}R^{311a}$, $C_1$-$C_{10}$-alkoxy, $C_1$-$C_{10}$-haloalkoxy, $C_1$-$C_{10}$-alkylthio, $C_3$-$C_{12}$-cycloalkyl, $C_6$-$C_{14}$-aryl, $C(=O)R^{39a}$; $C(=O)OR^{39}a$ or $C(O)NR^{310a}R^{311a}$, where
$C_3$-$C_{12}$-cycloalkyl is unsubstituted or bears one or more identical or different $R^{3b}$ substituents and
$C_6$-$C_{14}$-aryl is unsubstituted or bears one or more identical or different $R^{3Ar}$ substituents;
each $Z^{3b}$ and each $Z^{3Ar}$ is independently halogen, hydroxyl, $NR^{310a}R^{311a}$, $C_1$-$C_{10}$-alkyl, $C_1$-$C_{10}$-alkoxy, $C_1$-$C_{10}$-haloalkoxy, $C_1$-$C_{10}$-alkylthio, $C(=O)R^{39a}$; $C(=O)OR^{39}a$ or $C(O)NR^{310a}R^{311a}$;
each $R^{3a}$ is independently halogen, hydroxyl, $C_1$-$C_{10}$-alkoxy, $C_3$-$C_{12}$-cycloalkyl or $C_6$-$C_{14}$-aryl;
each $R^{3b}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

each $R^{3Ar}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

$R^{39a}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl; and $R^{310a}$, $R^{311a}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, and mixtures thereof;

(B4) a cyanated compound of formula (IV)

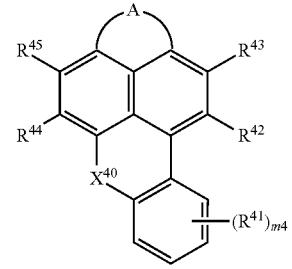

(IV)

wherein m4 is 0, 1, 2, 3 or 4;

each $R^{41}$ independently from each other is selected from bromine, chlorine, cyano, $-NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy or $C_6$-$C_{24}$-aryl-$C_1$-$C_{10}$-alkylene, where the rings of cycloalkyl, heterocycloalkyl, heteroaryl, aryl, aryloxy in the six last-mentioned radicals are unsubstituted or substituted with 1, 2, 3, 4 or 5 identical or different radicals $R^{41a}$ and where $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene may be interrupted by one or more groups selected from O, S or $NR^{4c}$;

at least one of the radicals $R^{42}$, $R^{43}$, $R^{44}$ and $R^{45}$ is CN, and the remaining radicals, independently from each other, are selected from hydrogen, chlorine or bromine;

$X^{40}$ is O, S, SO or $SO_2$;

A is a diradical selected from diradicals of the general formulae (A.1), (A.2), (A.3), or (A.4)

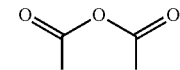

(A.1)

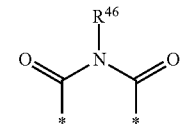

(A.2)

-continued

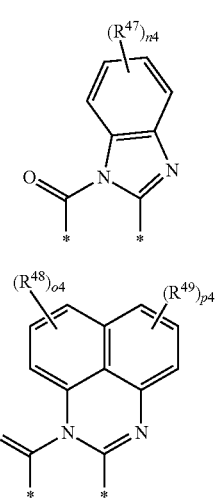

wherein
* in each case denotes the point of attachments to the remainder of the molecule;
n4 is 0, 1, 2, 3 or 4;
o4 is 0, 1, 2 or 3;
p4 is 0, 1, 2 or 3;
$R^{46}$ is hydrogen, $C_1$-$C_{24}$-alkyl, $C_1$-$C_{24}$-haloalkyl, $C_3$-$C_{24}$-cycloalkyl, $C_6$-$C_{24}$-aryl or $C_6$-$C_{24}$-aryl-$C_1$-$C_{10}$-alkylene, where the rings of cycloalkyl, aryl, and aryl-alkylene in the three last-mentioned radicals are unsubstituted or substituted with 1, 2, 3, 4 or 5 identical or different radicals $R^{46a}$, and where $C_1$-$C_{24}$-alkyl, $C_1$-$C_{24}$-haloalkyl and the alkylene moiety of $C_6$-$C_{24}$-aryl-$C_1$-$C_{10}$-alkylene may be interrupted by one or more heteroatoms or heteroatomic groups selected from O, S and $NR^{4c}$;
each $R^{47}$ independently from each other is selected from bromine, chlorine, cyano, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{47a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;
each $R^{48}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{48a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S or $NR^{4c}$;
each $R^{49}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{49a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S or $NR^{4c}$;
$R^{41a}$, $R^{46a}$, $R^{47a}$, $R^{48a}$, $R^{49a}$ are independently of one another selected from $C_1$-$C_{24}$-alkyl, $C_1$-$C_{24}$-fluoroalkyl, $C_1$-$C_{24}$-alkoxy, fluorine, chlorine or bromine;
$R^{4a}$, $R^{4b}$, $R^{4c}$ are independently of one another are selected from hydrogen, $C_1$-$C_{20}$-alkyl, $C_3$-$C_{24}$-cycloalkyl, heterocycloalkyl, heteroaryl or $C_6$-$C_{24}$-aryl;
and mixtures thereof;
(B5) a benz(othi)oxanthene compound of formula (V)

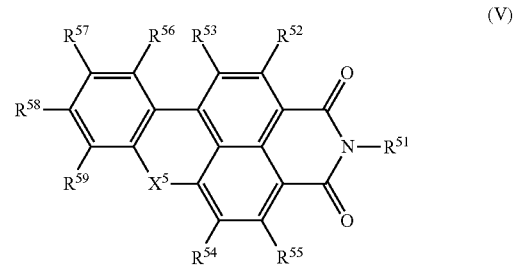

wherein
$X^5$ is oxygen or sulfur;
$R^{51}$ is $C_1$-$C_{24}$-alkyl which is unsubstituted or substituted by one or more $R^{51a}$ groups or $R^{51}$ is phenyl which is unsubstituted or carries 1, 2, 3, 4, or 5 substituents selected from halogen, $R^{511}$, $OR^{552}$, $NHR^{552}$ and $NR^{552}R^{557}$;
$R^{51a}$ is independently of each other and independently of each occurrence selected from cyano, halogen, $C_3$-$C_8$-cycloalkyl, 3- to 8-membered heterocyclyl, aryl or heteroaryl, where $C_3$-$C_8$-cycloalkyl, 3- to 8-membered heterocyclyl, aryl and heteroaryl are unsubstituted or bear one or more substituents selected from halogen, $C_1$-$C_{18}$-alkyl and $C_1$-$C_{18}$-haloalkyl,
$R^{52}$, $R^{53}$, $R^{54}$, $R^{55}$, $R^{56}$, $R^{57}$, $R^{58}$ and $R^{59}$ are independently of each other selected from hydrogen, halogen, $R^{553}$, $OR^{553}$, $NHR^{553}$ or $NR^{553}R^{554}$,
wherein
$R^{511}$ is selected from $C_1$-$C_{20}$-alkyl, $C_6$-$C_{24}$-aryl or heteroaryl;
$R^{552}$ and $R^{557}$ are independently of each other selected from $C_1$-$C_{18}$-alkyl, $C_6$-$C_{24}$-aryl or heteroaryl; and $R^{553}$ and $R^{554}$ are independently of each other selected from $C_1$-$C_{18}$-alkyl, $C_6$-$C_{24}$-aryl or heteroaryl;
and mixtures thereof;

(B6) a benzimidazoxanthenisoquinoline compound of formulae (VIA) or (VIB)

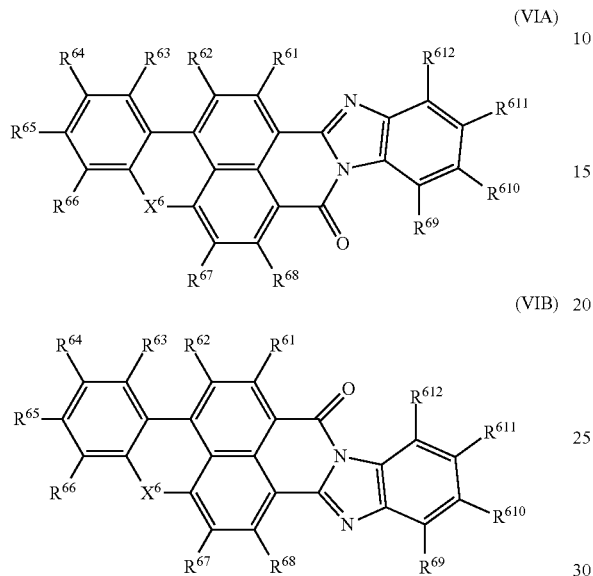

wherein
$X^6$ is oxygen or sulfur;
$R^{61}$, $R^{62}$, $R^{63}$, $R^{64}$, $R^{65}$, $R^{66}$, $R^{67}$, $R^{68}$, $R^{69}$, $R^{610}$, $R^{611}$ and $R^{612}$ are independently or each other selected from hydrogen, halogen, $R^{661}$, $OR^{661}$, $NHR^{661}$ or $NR^{661}R^{662}$
wherein
each $R^{661}$ is selected from $C_1$-$C_{18}$-alkyl, $C_6$-$C_{24}$-aryl or heteroaryl; and
each $R^{662}$ is selected from $C_1$-$C_{18}$-alkyl, $C_6$-$C_{24}$-aryl or heteroaryl;
and mixtures thereof;

(B7) fluorescent compound comprising at least one structural unit of formula (VII)

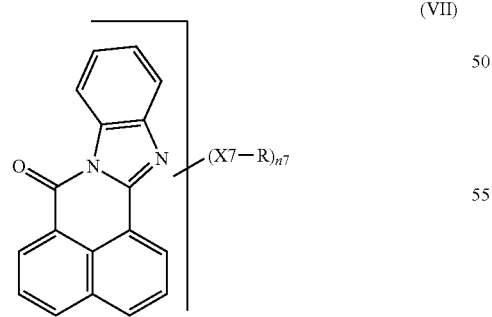

where one or more CH groups of the six-membered ring of the benzimidazole structure shown may be replaced by nitrogen and where the symbols are each defined as follows:
n7 is a number from 0 to (10-p7) for each structural unit of the formula (VII); where p7 is the number of CH units which have been replaced by nitrogen in the six-membered ring of the benzimidazole structure shown,
X7 is a chemical bond, O, S, SO, $SO_2$, $NR^{71}$; and
R is an aliphatic radical, cycloaliphatic radical, aryl, heteroaryl, each of which may bear substituents, an aromatic or heteroaromatic ring or ring system, each of which is fused to other aromatic rings of the structural unit of the formula (VII), is F, Cl, Br, CN, H when X7 is not a chemical bond;
where two R radicals may be joined to give one cyclic radical and
where X7 and R, when n7> one, may be the same or different;
$R^{71}$ is each independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted; aryl or heteroaryl which may be mono- or polysubstituted;
and mixtures thereof;

(B8) a perylene compound of formulae (VIII) or (IX)

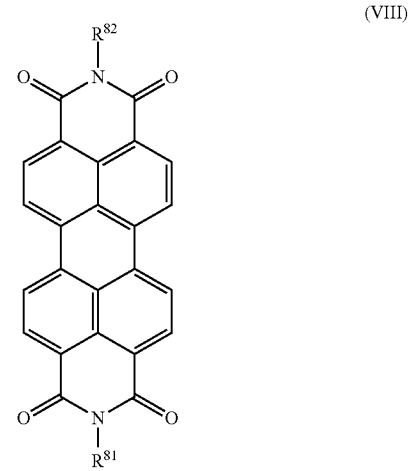

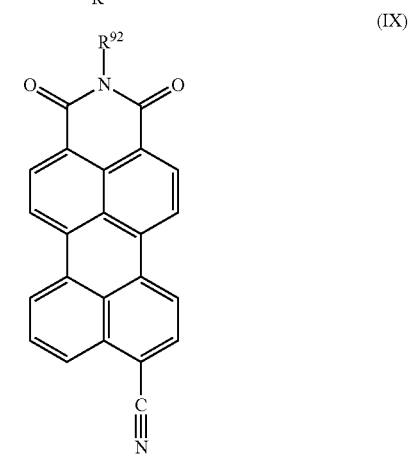

where
$R^{81}$, $R^{82}$ are each independently $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{10}$-alkyl;

$R^{92}$ is $C_1$-$C_{30}$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;

(B9) a naphthalene monoimide compound of formula (X)

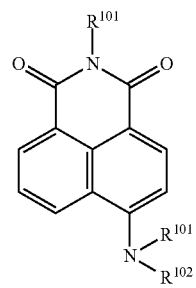

(X)

wherein each $R^{101}$ independently of each other is hydrogen, $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{10}$-alkyl;

$R^{102}$ is hydrogen, $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{100}$-alkyl;

(B10) 7-(diethylamino)-3-(5-methylbenzo[d]oxazol-2-yl)-2H-chromen-2-one;

(B11) a perylene compound of formulae (XIA) or (XIB)

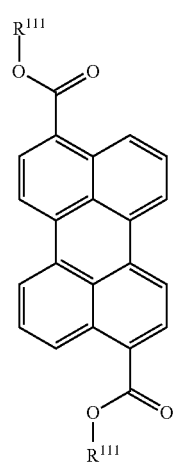

(XIA)

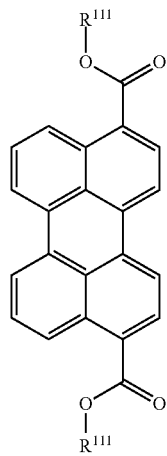

(XIB)

wherein each $R^{111}$ independently of each other is $C_1$-$C_{18}$ alkyl, $C_4$-$C_8$ cycloalkyl, which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl;

and mixtures thereof;

(B12) a cyanated perylene compound of formulae (XIIA) or (XII B)

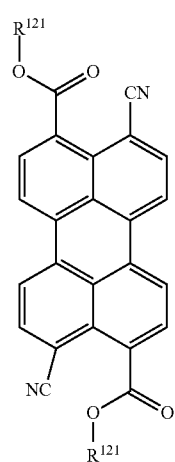

(XIIA)

-continued

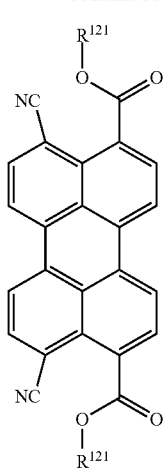

(XIIB)

wherein
each $R^{121}$ independently of each other is $C_1$-$C_{18}$ alkyl, $C_4$-$C_8$ cycloalkyl, which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl;
and mixtures thereof;
(B13) a perylene bisimide compound of formula (XIII)

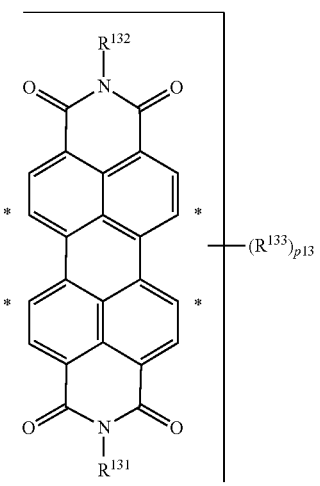

(XIII)

wherein
p13 is 1, 2, 3 or 4;
$R^{131}$ and $R^{132}$ independently of each other are $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl,
$C_2$-$C_{20}$-alkyl, which is interrupted by one or more oxygen,
$C_3$-$C_8$-cycloalkyl, which is unsubstituted or substituted by 1, 2 or 3 $C_1$-$C_{10}$-alkyl, or
$C_6$-$C_{10}$-aryl which is unsubstituted or substituted by 1, 2 or 3 $C_1$-$C_{10}$-alkyl;
each $R^{133}$ independently of each other is fluorine, chlorine, $C_1$-$C_{16}$-alkyl, $C_2$-$C_{16}$-alkyl interrupted by one or more oxygen, $C_1$-$C_{16}$-alkoxy, $C_6$-$C_{10}$-aryloxy which is unsubstituted or mono- or polysubstituted by fluorine, chlorine, $C_1$-$C_{16}$-alkyl, $C_2$-$C_{16}$-alkyl interrupted by one or more oxygen, $C_1$-$C_{16}$-alkoxy or $C_6$-$C_{10}$-aryl, which is unsubstituted or substituted by 1, 2 or 3 radicals selected from $C_1$-$C_6$-alkyl, $C_1$-$C_6$-alkoxy-$C_1$-$C_6$-alkyl and $C_1$-$C_6$-alkoxy, where the $R^{133}$ radicals are at the positions indicated by *;
and mixtures thereof;
(B14) a perylene compound of formula (XIV)

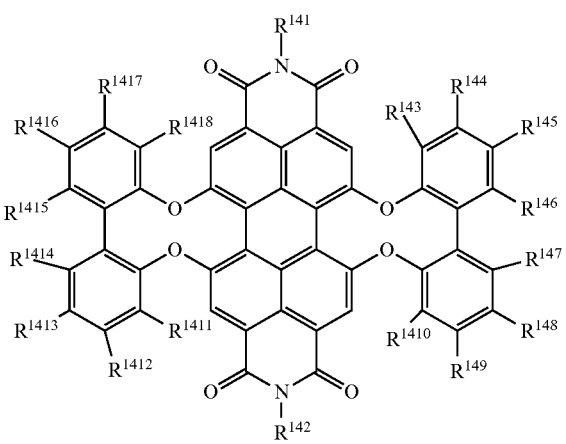

(XIV)

wherein
$R^{141}$ and $R^{142}$, independently of each other, are selected from hydrogen, in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl or $C_6$-$C_{24}$-aryloxy;
$R^{143}$, $R^{144}$, $R^{145}$, $R^{146}$, $R^{147}$, $R^{148}$, $R^{149}$, $R^{1410}$, $R^{1411}$, $R^{1412}$, $R^{1413}$, $R^{1414}$, $R^{1415}$, $R^{1416}$, $R^{1417}$ and $R^{1418}$ independently of each other, are selected from hydrogen, halogen, cyano, hydroxyl, mercapto, nitro, $-NE^{141}E^{142}$, $-NR^{Ar141}COR^{A142}$, $-CONR^{Ar141}R^{Ar142}$, $-SO_2NR^{A141}R^{A142}$, $-COOR^{Ar141}$, $-SO_3R^{Ar142}$ in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy or $C_6$-$C_{24}$-arylthio,
where $R^{143}$ and $R^{144}$, $R^{144}$ and $R^{145}$, $R^{145}$ and $R^{146}$, $R^{146}$ and $R^{147}$, $R^{147}$ and $R^{148}$, $R^{148}$ and $R^{149}$, $R^{149}$ and $R^{1410}$, $R^{1411}$ and $R^{1412}$, $R^{1412}$ and $R^{1413}$, $R^{1413}$ and $R^{1414}$, $R^{1414}$ and $R^{1415}$, $R^{1415}$ and $R^{1416}$, $R^{1416}$ and $R^{1417}$ and/or $R^{1417}$ and $R^{1418}$ together with the carbon atoms of the biphenylyl moiety to which they are bonded, may also form a further fused aromatic or non-aromatic ring system, wherein the fused ring system is unsubstituted or substituted;
where
$E^{141}$ and $E^{142}$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;
$R^{Ar141}$ and $R^{Ar142}$, each independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl;

and mixtures thereof;

(B15) a compound of the formula (XV)

which is unsubstituted or substituted by 1, 2 or 3 radicals selected from $C_1$-$C_6$-alkyl, $C_1$-$C_6$-alkoxy-$C_1$-$C_6$-alkyl and $C_1$-$C_6$-alkoxy, where the $R^{163}$ radicals are at the positions indicated by *;

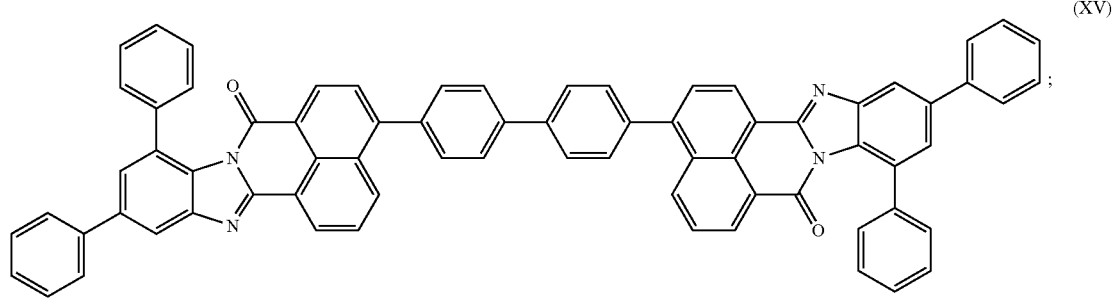 [SMILES: O=c1c2ccc(-c3ccc(-c4ccc(-c5ccc6c7c5cccc7c(=O)n5c6nc6cc(-c7ccccc7)cc(-c7ccccc7)c65)cc4)cc3)c3cccc(c32)c2nc3cc(-c4ccccc4)cc(-c4ccccc4)c3n12]

(B16) a terrylene bisimide compound of formula (XVI)

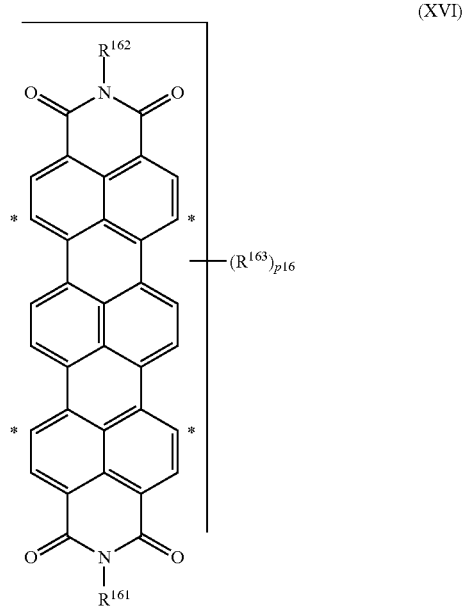

wherein p16 is 0, 1, 2, 3 or 4;

$R^{161}$ and $R^{162}$ independently of each other are $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl, $C_2$-$C_{20}$-alkyl, which is interrupted by one or more oxygen, $C_3$-$C_8$-cycloalkyl, which is unsubstituted or substituted by 1, 2 or 3 $C_1$-$C_{10}$-alkyl, or $C_6$-$C_{10}$-aryl which is unsubstituted or substituted by 1, 2 or 3 $C_1$-$C_{100}$-alkyl;

$R^{163}$ if present, independently of each other is fluorine, chlorine, $C_1$-$C_{16}$-alkyl, $C_2$-$C_{16}$-alkyl interrupted by one or more oxygen, $C_1$-$C_{16}$-alkoxy, $C_6$-$C_{10}$-aryloxy which is unsubstituted or mono- or polysubstituted by fluorine, chlorine, $C_1$-$C_{16}$-alkyl, $C_2$-$C_{16}$-alkyl interrupted by one or more oxygen, $C_1$-$C_{16}$-alkoxy or $C_6$-$C_{10}$-aryl, and mixtures thereof.

A further aspect of the invention relates to an illumination device comprising a transmitter as defined above and in the following transmitting modulated second electromagnetic radiation in the visible spectral range, wherein the illumination device is adapted to generate a value of a luminous flux of the modulated second electromagnetic radiation being at least in the range from 100 lm to 30 000 lm.

A further aspect of the invention relates to a data transmission system comprising a transmitter as defined above and in the following, further comprising:
- a receiver to detect at least a part of the modulated second electromagnetic radiation emitted by the transmitter, and
- a data analyzer for extracting data from the detected modulated second electromagnetic radiation.

DESCRIPTION OF THE INVENTION

Fluorescent colorants include all materials which are capable of absorbing light of a particular wavelength and converting it to light of another wavelength. Organic fluorescent colorants may be organic fluorescent pigments or organic fluorescent dyes.

In the context of the present invention, the term "luminescent material(s)" is also referred to as phosphor(s). The luminescent materials may be inorganic solids or organic fluorescent colorants.

Accordingly, in the context of the present invention, the terms "phosphor" and "colorant" are used interchangeably to describe a luminescent material which converts light of a first wavelength to light of a second wavelength.

The term "conversion material" refers to a material that is excited by a photon of a first wavelength and emits photons of a second, different wavelength.

In the context of the present invention, "a phosphor-converted LED" refers to an LED element having either a phosphor material layer coated thereon or a phosphor material layer at a certain distance (remote phosphor arrangement) for converting or changing the color of the light emitted by the LED element to a different color.

A quantum dot is a nanocrystal made of semiconductor materials that is small enough to exhibit quantum mechanical properties. Quantum dots are showing remarkably narrow emission spectra, i.e. with extraordinary small FWHM (full width of half maximum). The color output of the dots can be tuned by controlling the size of the crystals. With a smaller size in quantum dots, the quantum dots emit light of a shorter wavelength.

In the context of the present invention, "frequency converter" is understood to mean all physical devices capable of absorbing light of particular wavelengths and converting it to light of a second wavelength.

In the context of the present invention, the term "center wavelength" of a given spectral distribution $F(\lambda)$ is defined as the following average: $\lambda_c = \int \pi \cdot F(\lambda) \, d\lambda / \int F(\lambda) \, d\lambda$.

In the context of the present invention, a "blue LED" is understood to mean an LED which emits light in the blue range of the electromagnetic spectrum with a center wavelength of emission in the range of 420 to 480 nm, preferably 440 to 470 nm, most preferably at 440 to 460 nm. Suitable semiconductor materials are silicon carbide, zinc selenide and nitrides such as aluminum nitride (AlN), gallium nitride (GaN), indium nitride (InN) and indium gallium nitride (InGaN). LEDs typically have a narrow wavelength distribution that is tightly centered about their peak wavelength. Standard InGaN-based blue LEDs are fabricated on a sapphire substrate and peak emission wavelength is usually centered at 445 to 455 nm.

In the context of the present invention, the term "visible spectral range" refers to wavelengths from about 390 to about 800 nm. In a narrower sense, the term "visible spectral range" refers to the wavelength range between 400 and 680 nm.

Light sources that are not incandescent radiators have correlated color temperatures. The correlated color temperature (CCT) is the temperature of a black body radiator that is perceived by the human eye to emit the same white light as the LEDs. The correlated color temperature (CCT) describes the color appearance of white light emitted from electric light sources and is measured in Kelvin. It is determined according to the CIE international standard. CCT from a white light source usually is in the range from 1 500 K to 20 000 K, especially 2 000 K to 20 000 K. White light having higher CCT contains relatively higher intensity in the short wavelength region (blue) and relatively lower intensity in the longer wavelength region (red) compared to white light with lower CCT. Accordingly, higher CCTs generally indicate white light having a more significant blue component or a cool tone, while lower CCTs generally indicate light having a more significant red tint or a warm tone. A white light having a CCT in the range from 4 500 K to 20 000 K is often referred to as cool white light, a white light having a CCT in the range from 2 700 K to 3 200 K is often referred to as warm-white light and a white light having a CCT in the range between 3 200 K to 4 500 K is often referred to as neutral white. Warmer color temperatures are especially suitable for living spaces.

Color rendering (CRI) is a measure how a light source makes the color of an object appear to the human eye and how well subtle variations in color shade are revealed. According to CIE 17.4, International Lighting Vocabulary, color rendering (CRI) is defined as "the effect of an illuminant on the color appearance of objects by conscious or unconscious comparison with the color appearance under a reference illuminant". The average or general color rendering index Ra is calculated from the differences in the chromaticities of the eight pastel CIE standard (reference) color samples R1 to R8 (CIE 13.3-1995). Negative values are also possible. A reference source, such as black body radiation, is defined as having a CRI index (Ra) of 100 (which is the maximum), i.e. a value of 100 indicates that the source renders colors in a manner identical to the reference. The lower the CRI rating, the less accurately colors will be reproduced. For many general interior illumination applications, a CRI value (Ra) of greater than 80 is acceptable. For general lighting, the color rendering index should be above 85. In applications where accurate color rendering is required, a high CRI Ra of at least 90 is usually highly desirable, so that objects illuminated by the lighting source may appear to have more natural coloring to the human eye.

CRI Ra does not include coefficients corresponding to six highly saturated colors (R9-R14). Of these, R9 corresponds to a strong red color, which may affect a red-green contrast that may be beneficial in rendering colors. Often, the ability to reproduce red colors well is essential for accurately rendering colors, as the color red is often found mixed into processed colors. Thus, if a light source cannot render red correctly, things that are reddish will turn dull. Accordingly, light sources with high CRI Ra and with positive R9 value tend to produce the most vivid colors.

According to the CIE 1931 standard colorimetric system, colors are perceived by human eye following specific color curves. The standard luminosity curve VA accounts for the wavelength dependence of the sensitivity of human eye. The luminosity curve has a maximum possible value of 683 lm/W, for the case of monochromatic light at a wavelength of 555 nm (green). Luminous flux is the measure of the perceived power of light.

In the context of the present invention, the terms "fluorescence decay time" and "excited-state lifetime $\tau_v$" are interchangeably used.

The emissisve lifetime to is calculated by $\tau_0 = \tau_v / QY$, where $\tau_v$ is the measured excited-state lifetime and QY is the fluorescence quantum yield.

The term "T80" is understood to mean the time in days that the product of quantum yield and absorption decreases to 80% of its initial value, while illuminating with blue LED light at 120 mW/cm$^2$ and white LED light at 100 mW/cm$^2$, respectively.

The term "essentially" in the context of the term polymeric matrix of the frequency converter encompasses the words "completely", "wholly" and "all". The word encompasses a proportion of 90% or more, such as 95% or more, especially 99% or 100%.

The expression "halogen" denotes in each case fluorine, bromine, chlorine or iodine, particularly chlorine, bromide or iodine.

In the context of the invention, the expression "in each case unsubstituted or substituted alkyl, cycloalkyl and aryl" represents unsubstituted or substituted alkyl, unsubstituted or substituted cycloalkyl and unsubstituted or substituted aryl.

Likewise, in the context of the invention, the expression "in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl and $C_6$-$C_{24}$-aryloxy" represents unsubstituted or substituted $C_1$-$C_{30}$-alkyl, unsubstituted or substituted polyalkyleneoxy, unsubstituted or substituted $C_1$-$C_{30}$-alkoxy, unsubstituted or substituted $C_1$-$C_{30}$-alkylthio, unsubstituted or substituted $C_3$-$C_{20}$-cycloalkyl, unsubstituted or substituted $C_3$-$C_{20}$-cycloalkyloxy, unsubstituted or substituted $C_6$-$C_{24}$-aryl and unsubstituted or substituted $C_6$-$C_{24}$-aryloxy.

For the purpose of the present invention, the term "aliphatic radical" refers to an acyclic saturated or unsaturated, straight-chain or branched hydrocarbon radical. Usually, the aliphatic radical has 1 to 100 carbon atoms. Examples for an aliphatic radical are alkyl, alkenyl and alkynyl.

For the purpose of the present invention, the term "cycloaliphatic radical" refers to a cyclic, non-aromatic saturated or unsaturated hydrocarbon radical having usually 3 to 20 ring carbon atoms. Examples are cycloalkanes, cycloalkenes, and cycloalkynes. The cycloaliphatic radical may also comprise heteroatoms or heteroatom groups selected from N, O, S and $SO_2$.

The term "alkyl" as used herein and in the alkyl moieties of alkoxy, alkylthio, alkylsulfinyl, alkylsulfonyl, alkylamino, dialkylamino, alkylcarbonyl, alkoxycarbonyl and the like refers to saturated straight-chain or branched hydrocarbon radicals having usually 1 to 100 ("$C_1$-$C_{100}$-alkyl"), 1 to 30 ("$C_1$-$C_{30}$-alkyl"), 1 to 18 ("$C_1$-$C_{18}$-alkyl"), 1 to 12 ("$C_1$-$C_{12}$-alkyl"), 1 to 8 ("$C_1$-$C_8$-alkyl") or 1 to 6 ("$C_1$-$C_6$-alkyl") carbon atoms. Alkyl is preferably $C_1$-$C_{30}$-alkyl, more preferably $C_1$-$C_{20}$-alkyl. Examples of alkyl groups are especially methyl, ethyl, n-propyl, isopropyl, n-butyl, isobutyl, sec-butyl, tert-butyl, n-pentyl, 1-methylbutyl, 1-ethylpropyl, neo-pentyl, n-hexyl, 1-methylpentyl, 2-methylpentyl, 1-ethylbutyl, 2-ethylbutyl, n-heptyl, 1-methylhexyl, 2-methylhexyl, 1-ethylpentyl, 1-propylbutyl, 2-ethylpentyl, n-octyl, 1-methylheptyl, 2-methylheptyl, 1-ethylhexyl, 2-ethylhexyl, 1-propylpentyl, 2-propylpentyl, n-nonyl, etc.

Substituted alkyl groups, depending on the length of the alkyl chain, have one or more (e.g. 1, 2, 3, 4, 5 or more than 5) substituents. These are preferably each independently of each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, $NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

Special embodiments of substituted alkyl groups are alkyl groups, wherein one hydrogen atom has been replaced by an aryl radical ("aralkyl", also referred to hereinafter as arylalkyl or arylalkylene), in particular a phenyl radical. The aryl radical in turn may be unsubstituted or substituted, suitable substituents are the substituents mentioned below for aryl. Particular examples of aryl-$C_1$-$C_4$-alkyl include benzyl, 1-phenethyl, 2-phenetyl, 1-phenylpropyl, 2-phenylpropyl, 3-phenyl-1-propyl, 2-phenyl-2-propyl, naphthylmethyl, naphthylethyl, etc.

Further special embodiments of substituted alkyl groups are alkyl groups, where some or all of the hydrogen atoms in these groups may be replaced by halogen atoms as mentioned above, for example $C_1$-$C_4$-haloalkyl.

The term "alkenyl" as used herein refers to straight-chain or branched hydrocarbon groups having usually 2 to 100 ("$C_2$-$C_{100}$-alkenyl"), 2 to 18 ("$C_2$-$C_{18}$-alkenyl"), 2 to 10 ("$C_2$-$C_{100}$-alkenyl"), 2 to 8 ("$C_2$-$C_8$-alkenyl"), or 2 to 6 ("$C_2$-$C_6$-alkenyl") carbon atoms and one or more, e.g. 2 or 3, double bonds in any position. Substituted alkenyl groups, depending on the length of the alkenyl chain, have one or more (e.g. 1, 2, 3, 4, 5 or more than 5) substituents. These are preferably each independently or each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, $NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkenyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

The term "alkynyl" as used herein (also referred to as alkyl whose carbon chain may comprise one or more triple bonds) refers to straight-chain or branched hydrocarbon groups having usually 2 to 100 ("$C_2$-$C_{100}$-alkynyl"), 2 to 18 ("$C_2$-$C_{18}$-alkynyl"), 2 to 10 ("$C_2$-$C_{10}$-alkynyl"), 2 to 8 ("$C_2$-

$C_8$-alkynyl"), or 2 to 6 ("$C_2$-$C_6$-alkynyl") carbon atoms and one or more, e.g. 2 or 3, triple bonds in any position. Substituted alkynyl groups, depending on the length of the alkynyl chain, have one or more (e.g. 1, 2, 3, 4, 5 or more than 5) substituents. These are preferably each independently or each other selected from unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, alkylcarbonyloxy, formyl, acyl, COOH, carboxylate, —COOR$^{Ar1}$, NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted alkynyl groups have one or more, for example 1, 2 or 3 substituent(s) selected from unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

The term "alkoxy" as used herein refers to an alkyl group bound through an oxygen atom, that is, an "alkoxy" group may be represented as —O-alkyl, where alkyl is as defined above. $C_1$-$C_2$-Alkoxy is methoxy or ethoxy. $C_1$-$C_4$-Alkoxy is, for example, methoxy, ethoxy, n-propoxy, 1-methylethoxy (isopropoxy), butoxy, 1-methylpropoxy (sec-butoxy), 2-methylpropoxy (isobutoxy) or 1,1-dimethylethoxy (tert-butoxy).

Accordingly, the term "unsubstituted or substituted alkoxy" as used herein refers to —O-alkyl, where alkyl is unsubstituted or substituted as defined above.

The term "polyoxyalkylene" as used herein refers to an alkyl group bound through an oxygen atom to the remainder of the molecule, where alkyl is interrupted by one or more non-adjacent oxygen atoms and alkyl is as defined above.

Accordingly, the term "unsubstituted or substituted polyalkyleneoxy" as used herein refers to —O-alkyl where alkyl is interrupted by one or more non-adjacent oxygen atoms and alkyl is unsubstituted or substituted as defined above.

The term "alkylthio" as used herein refers to an alkyl group bound through a sulfur atom, that is, an "alkylthio" group may be represented as —S-alkyl, where alkyl is as defined above. $C_1$-$C_2$-Alkylthio is methylthio or ethylthio. $C_1$-$C_4$-Alkylthio is, for example, methylthio, ethylthio, n-propylthio, 1-methylethylthio (isopropylthio), butylthio, 1-methylpropylthio (sec-butylthio), 2-methylpropylthio (isobutylthio) or 1,1-dimethylethylthio (tert-butylthio).

Accordingly, the term "unsubstituted or substituted alkylthio" as used herein refers to —S-alkyl, where alkyl is unsubstituted or substituted as defined above.

The term "cycloalkyl" as used herein refers to mono- or bi- or polycyclic saturated hydrocarbon radicals having usually 3 to 24 ($C_3$-$C_{24}$-cycloalkyl), 3 to 20 ("$C_3$-$C_{20}$-cycloalkyl") atoms, preferably 3 to 8 ("$C_3$-$C_8$-cycloalkyl") or 3 to 6 carbon atoms ("$C_3$-$C_6$-cycloalkyl"). Examples of monocyclic radicals having 3 to 6 carbon atoms comprise cyclopropyl, cyclobutyl, cyclopentyl and cyclohexyl. Examples of monocyclic radicals having 3 to 8 carbon atoms comprise cyclopropyl, cyclobutyl, cyclopentyl, cyclohexyl, cycloheptyl and cyclooctyl. Examples of bicyclic radicals having 7 to 12 carbon atoms comprise bicyclo[2.2.1]heptyl, bicyclo[3.1.1]heptyl, bicyclo[2.2.2]octyl, bicyclo[3.3.0]octyl, bicyclo[3.2.1]octyl, bicyclo[3.3.1]nonyl, bicyclo[4.2.1]nonyl, bicyclo[4.3.1]decyl, bicyclo[3.3.2]decyl, bicyclo[4.4.0]decyl, bicyclo[4.2.2]decyl, bicyclo[4.3.2] undecyl, bicyclo[3.3.3]undecyl, bicyclo[4.3.3]dodecyl, and perhydronaphthyl. Examples of polycyclic rings are perhydroanthracyl, perhydrofluorenyl, perhydrochrysenyl, perhydropicenyl, and adamantyl.

Substituted cycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —COOR$^{Ar1}$, —NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted cycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

The term "cycloalkyloxy" as used herein refers to a cycloalkyl group bound through an oxygen atom, that is, a "cycloalkyloxy" group may be represented as —O—cycloalkyl, where cycloalkyl is as defined above.

Accordingly, the term "unsubstituted or substituted cycloalkyloxy" as used herein refers to —O-cycloalkyl, where cycloalkyl is unsubstituted or substituted as defined above.

The term "cycloalkylthio" as used herein refers to a cycloalkyl group bound through a sulfur atom, that is, a "cycloalkylthio" group may be represented as —S—cycloalkyl, where cycloalkyl is as defined above.

Accordingly, the term "unsubstituted or substituted cycloalkylthio" as used herein refers to —S-cycloalkyl, where cycloalkyl is unsubstituted or substituted as defined above.

The term "heterocycloalkyl" refers to nonaromatic, partially unsaturated or fully saturated, heterocyclic rings having generally 5 to 8 ring members, preferably 5 or 6 ring members, comprising besides carbon atoms as ring members, one, two, three or four heteroatoms or heteroatom-containing groups selected from O, N, $NR^{cc}$, S, SO and $S(O)_2$ as ring members, wherein $R^{cc}$ is hydrogen, $C_1$-$C_{20}$-alkyl, $C_3$-$C_{24}$-cycloalkyl, heterocycloalkyl, $C_6$-$C_{24}$-aryl or heteroaryl. Examples of heterocycloalkyl groups are especially pyrrolidinyl, piperidinyl, imidazolidinyl, pyrazolidinyl, oxazolidinyl, morpholinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 2-oxazolinyl, 3-oxazolinyl, 4-oxazolinyl and dioxanyl.

Substituted heterocycloalkyl groups may, depending on the ring size, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, —$NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted heterocycloalkyl groups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl.

For the purpose of the present invention, the term "aryl" refers to phenyl and bi- or polycyclic carbocycles having at least one fused phenylene ring, which is bound to the remainder of the molecule. Examples of bi- or polycyclic carbocycles having at least one phenylene ring include naphthyl, tetrahydronaphthyl, indanyl, indenyl, anthracenyl, fluorenyl etc. Preferably, the term "aryl" denotes phenyl and naphthyl.

Substituted aryls may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —$COOR^{Ar1}$, —$NE^1E^2$, —$NR^{Ar1}COR^{Ar2}$, —$CONR^{Ar1}R^{Ar2}$, —$SO_2NR^{Ar1}R^{Ar2}$ and —$SO_3R^{Ar2}$, where $E^1$ and $E^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted arylgroups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, $NE^1E^2$, —$NR^{Ar1}COR^{Ar2}$, —$CONR^{Ar1}R^{Ar2}$, —$SO_2NR^{Ar1}R^{Ar2}$, and —$SO_3R^{Ar2}$, where $E^1$, $E^2$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and $R^{Ar1}$ and $R^{Ar2}$, each independently of each, are hydrogen, unsubstituted or substituted $C_1$-$C_{18}$-alkyl, unsubstituted or substituted $C_3$-$C_{20}$- cycloalkyl, unsubstituted or substituted heterocyclyl, unsubstituted or substituted $C_6$-$C_{20}$-aryl or unsubstituted or substituted heteroaryl.

Substituted aryl is preferably aryl substituted by at least one alkyl group ("alkaryl", also referred to hereinafter as alkylaryl). Alkaryl groups may, depending on the size of the aromatic ring system, have one or more (e.g. 1, 2, 3, 4, 5, 6, 7, 8, 9 or more than 9) alkyl substituents. The alkyl substituents may be unsubstituted or substituted. In this regard, reference is made to the above statements regarding unsubstituted and substituted alkyl. A special embodiment relates to alkaryl groups, wherein alkyl is unsubstituted. Alkaryl is preferably phenyl which bears 1, 2, 3, 4 or 5, preferably 1, 2 or 3, more preferably 1 or 2 alkyl substituents. Aryl which bears one or more alkyl radicals, is, for example, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-n-propylphenyl, 2-, 3- and 4-isopropylphenyl, 2,4-, 2,5-, 3,5- and 2,6-di-n-propylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl.

$C_6$-$C_{24}$-aryloxy: $C_6$-$C_{24}$-aryl as defined above, which is bonded to the skeleton via an oxygen atom (—O—). Preference is given to phenoxy and naphthyloxy.

Accordingly, the term "unsubstituted or substituted aryloxy" as used herein refers to —O-aryl where aryl is unsubstituted or substituted as defined above.

$C_6$-$C_{24}$-arylthio: $C_6$-$C_{24}$-aryl as defined above, which is bonded to the skeleton via a sulfur atom (—S—). Preference is given to phenylthio and naphthylthio.

Accordingly, the term "unsubstituted or substituted arylthio" as used herein refers to —S-aryl, where aryl is unsubstituted or substituted as defined above.

In the context of the present invention, the expression "hetaryl" (also referred to as heteroaryl) comprises heteroaromatic, mono- or polycyclic groups. In addition to the ring carbon atoms, these have 1, 2, 3, 4 or more than 4 heteroatoms as ring members. The heteroatoms are preferably selected from oxygen, nitrogen, selenium and sulfur. The hetaryl groups have preferably 5 to 18, e.g. 5, 6, 8, 9, 10, 11, 12, 13 or 14, ring atoms.

Monocyclic hetaryl groups are preferably 5- or 6-membered hetaryl groups, such as 2-furyl (furan-2-yl), 3-furyl (furan-3-yl), 2-thienyl (thiophen-2-yl), 3-thienyl (thiophen-3-yl), 1H-pyrrol-2-yl, 1H-pyrrol-3-yl, pyrrol-1-yl, imidazol-2-yl, imidazol-1-yl, imidazol-4-yl, pyrazol-1-yl, pyrazol-3-yl, pyrazol-4-yl, pyrazol-5-yl, 3-isoxazolyl, 4-isoxazolyl, 5-isoxazolyl, 3-isothiazolyl, 4-isothiazolyl, 5-isothiazolyl, 2-oxazolyl, 4-oxazolyl, 5-oxazolyl, 2-thiazolyl, 4-thiazolyl, 5-thiazolyl, 1,2,4-oxadiazol-3-yl, 1,2,4-oxadiazol-5-yl, 1,3,4-oxadiazol-2-yl, 1,2,4-thiadiazol-3-yl, 1,2,4-thiadiazol-5-yl, 1,3,4-thiadiazol-2-yl, 4H-[1,2,4]-triazol-3-yl, 1,3,4-triazol-2-yl, 1,2,3-triazol-1-yl, 1,2,4-triazol-1-yl, pyridin-2-yl, pyridin-3-yl, pyridin-4-yl, 3-pyridazinyl, 4-pyridazinyl, 2-pyrimidinyl, 4-pyrimidinyl, 5-pyrimidinyl, 2-pyrazinyl, 1,3,5-triazin-2-yl and 1,2,4-triazin-3-yl.

Polycyclic hetaryl groups have 2, 3, 4 or more than 4 fused rings. The fused-on rings may be aromatic, saturated or partly unsaturated. Examples of polycyclic hetaryl groups are quinolinyl, isoquinolinyl, indolyl, isoindolyl, indolizinyl, benzofuranyl, isobenzofuranyl, benzothiophenyl, benzoxazolyl, benzisoxazolyl, benzthiazolyl, benzoxadiazolyl, benzothiadiazolyl, benzoxazinyl, benzopyrazolyl, benzimidazolyl, benzotriazolyl, benzotriazinyl, benzoselenophenyl, thienothiophenyl, thienopyrimidyl, thiazolothiazolyl, dibenzopyrrolyl (carbazolyl), dibenzofuranyl, dibenzothiophenyl, naphtho[2,3-b]thiophenyl, naphtha[2,3-b]furyl, dihydroindolyl, dihydroindolizinyl, dihydroisoindolyl, dihydroquinolinyl and dihydroisoquinolinyl.

Substituted hetaryl groups may, depending on the number and size of their ring systems, have one or more (e.g. 1, 2, 3, 4, 5 or more than 5) substituents. These are preferably each independently of each other selected from unsubstituted or substituted alkyl, unsubstituted or substituted alkenyl, unsubstituted or substituted alkynyl, unsubstituted or substituted cycloalkyl, unsubstituted or substituted cycloalkyloxy, unsubstituted or substituted cycloalkylthio, unsubstituted or substituted heterocycloalkyl, unsubstituted or substituted aryl, unsubstituted or substituted aryloxy, unsubstituted or substituted arylthio, unsubstituted or substituted hetaryl, fluorine, chlorine, bromine, iodine, hydroxyl, mercapto, unsubstituted or substituted alkoxy, unsubstituted or substituted polyalkyleneoxy, unsubstituted or substituted alkylthio, unsubstituted or substituted cyclolalkyloxy, unsubstituted or substituted aryloxy, unsubstituted or substituted arylthio, cyano, nitro, unsubstituted or substituted alkylcarbonyloxy, formyl, acyl, COOH, carboxylate, —CO$R^{Ar1}$, —NE$^1$E$^2$, —NR$^{Ar1}$COR$^{Ar2}$, —CONR$^{Ar1}$R$^{Ar2}$, —SO$_2$NR$^{Ar1}$R$^{Ar2}$ and —SO$_3$R$^{Ar2}$, where E$^1$ and E$^2$ are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl, and R$^{Ar1}$ and R$^{Ar2}$, independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl. In particular, substituted hetarylgroups have one or more, for example 1, 2 or 3 substituent(s) selected from unsubstituted or substituted alkyl, unsubstituted or substituted cycloalkyl, unsubstituted or substituted aryl, fluorine, chlorine, bromine, hydroxyl, alkoxy, polyalkyleneoxy, mercapto, alkylthio, cyano, nitro, NE$^1$E$^2$, —NR$^{Ar1}$COR$^{Ar2}$, —CONR$^{Ar1}$R$^{Ar2}$, —SO$_2$NR$^{Ar1}$R$^{Ar2}$, and —SO$_3$R$^{Ar2}$, where E$^1$, E$^2$, R$^{Ar1}$ and R$^{Ar2}$ are as defined above.

Fused ring systems can comprise alicyclic, aliphatic heterocyclic, aromatic and heteroaromatic rings and combinations thereof, hydroaromatic joined by fusion. Fused ring systems comprise two, three or more (e.g. 4, 5, 6, 7 or 8) rings. Depending on the way in which the rings in fused ring systems are joined, a distinction is made between ortho-fusion, i.e. each ring shares at least one edge or two atoms with each adjacent ring, and peri-fusion in which a carbon atom belongs to more than two rings. Preferred fused ring systems are ortho-fused ring systems.

When # or * appear in a formula showing a substructure of a compound of the present invention, it denotes the attachment bond in the remainder molecule.

Frequency Converter

The particular frequency converter used in the transmitter of the present invention provides the advantage that modulated first electromagnetic radiation is converted into modulated second electromagnetic radiation, said second electromagnetic radiation may be in a desired spectral range. Therefore, the full bandwidth of a desired spectral range may be used for data transmission. Therefore, the distance for such data transmission may be increased.

According to an embodiment of the transmitter of the present invention, the wavelength of the modulated second electromagnetic radiation is ranging from 450 to 750 nm, especially 450 nm to 700 nm. Therefore, visible light, in particular white light, that is emitted by the transmitter is directly generated by the frequency converter, so that no further elements for converting the frequency of the light are necessary if visible light shall finally be emitted. The transmitter of the present invention may transmit data using the bandwidth of the second electromagnetic radiation, so that the distance of the data transmission is increased compared to a data transmission in which only the blue spectral range of the emitted light is used.

According to an embodiment of the present invention, the first electromagnetic radiation comprises at least a wavelength in a spectral range between 350 nm and 500 nm. Within this spectral range, cost efficient radiation sources are available. Furthermore, this spectral range is advantageous for conversion into a broader visible spectral range, in particular into white light. It is noted that the radiation source may emit only electromagnetic radiation that is in the above-mentioned spectral range or a part thereof. Furthermore, the radiation source may also emit electromagnetic radiation outside this spectral range as far as at least an emitted wavelength is within this spectral range.

Many different radiation sources may be used by the transmitter of the present invention. However, according to an embodiment of the present invention, the radiation source is a light emitting diode (LED). Furthermore, a laser diode may be used as radiation source.

In particular, the radiation source is a blue LED with a center wavelength of emission between 400 nm and 480 nm. A blue LED is a light emitting diode emitting blue light. According to another embodiment, another radiation source may also be used that emits electromagnetic radiation with a center wavelength of emission between 400 nm and 480 nm.

According to an embodiment, the radiation source of the transmitter of the present invention is selected from the group consisting of an UV-LED, a RGB LED system, an organic LED and a cool white LED, said cool white LED having a correlated color temperature between 4000 K and 20000 K. An UV-LED is a light emitting diode emitting ultraviolet electromagnetic radiation, i. e. electromagnetic radiation having wavelengths below 400 nm. A RGB LED system consists of a red, a green and a blue LED. These three LEDs are independently adjusted in order to emit a particular spectrum, in particular white light. Furthermore, a cool white LED may also use a red, a green and a blue LED whose light emissions are mixed to form white light. Furthermore, a phosphor material may be used to convert monochromatic light emitted from a blue or an ultraviolet LED to broad spectrum white light.

If, for example, a phosphor material is used to generate the first electromagnetic radiation, an initial frequency converter is already used to generate the first electromagnetic radiation. It is noted that such conventional conversion by means of the phosphor material may also be used in the transmitter according to the present invention as far as such conventional conversion is carried out before the modulation that is used for data transmission. After the first electromagnetic radiation has been modulated, the particular frequency converter as described above is used by the transmitter of the present invention. In this case, a broad range data transmission may be used taking advantage of the whole spectral range of the second electromagnetic radiation being generated by the particular frequency converter.

According to an embodiment of the present invention, the frequency converter converts at least a part of the modulated first electromagnetic radiation emitted by the radiation source into the modulated second electromagnetic radiation comprising the visible spectral range. As mentioned above, the first electromagnetic radiation may also be within the visible spectral range. Therefore, the frequency converter may convert a part of the visible spectral range into another part of the visible spectral range. However, the frequency converter changes wavelengths of the modulated first electromagnetic radiation to other wavelengths of the modulated second electromagnetic radiation.

An electromagnetic radiation comprising the visible spectral range is also designated as light. Therefore, if the first electromagnetic radiation is within the visible spectral range, the frequency converter may also be called a light converter or a frequency converter. Furthermore, the frequency converter may be designated as wavelength converter.

According to an embodiment of the present invention, the frequency converter of the transmitter is adapted to convert a first wavelength of the modulated first electromagnetic radiation into a second wavelength of the modulated second electromagnetic radiation, said second wavelength being longer than said first wavelength. Therefore, the conversion is carried out to longer wavelengths. Such conversion is advantageous for generating white light by, for example, conversion of the emitted radiation of a blue LED. However, a conversion to shorter wavelengths may also be used. In this case, the wavelengths of the first electromagnetic radiation are longer than the center wavelength of the visible spectral range to be emitted, in particular, if white light shall be emitted.

In particular, the bandwidth of the first electromagnetic radiation is narrower than the bandwidth of the second electromagnetic radiation. Therefore, the frequency converter used by the transmitter of the present invention broadens the bandwidth of the initial electromagnetic radiation.

According to a further embodiment of the transmitter of the present invention, the frequency converter has a fluorescence decay time (excited state lifetime $\tau_v$) in the range from 0.1 to 9 ns. According to a preferred embodiment of the transmitter of the invention, the frequency converter has an excited state lifetime $\tau_v$ in the range from 3 to 9 ns. More preferably, the frequency converter has an excited-state lifetime $\tau_v$ in the range from 4 to 8 ns and especially from 4 to 7 ns. Even more especially, the frequency converter has an excited-state lifetime $\tau_v$ in the range from 5 to 7 ns.

It is a particular advantage of the above defined frequency converter to have a very short decay time (excited state lifetime). Such short decay times provide the advantage that the modulation of the converted electromagnetic radiation remains essentially unchanged, so that signal transmission is possible by means of the converted modulated electromagnetic radiation. All the longer the decay time is, the modulation of the first electromagnetic radiation is blurred, so that the signal transmission is negatively affected.

According to a further embodiment of the transmitter of the present invention, the frequency converter is arranged in a remote arrangement from the radiation source. In particular, the distance of the radiation source is in the range from 0.01 to 10 cm. Preferably, the distance of the radiation source is in the range from 0.1 to 8 cm, more preferably in the range from 0.5 to 7 cm. Such arrangement is also known as remote phosphor if the frequency converter is phosphor-based. Therefore, the frequency converter is not directly applied to the radiation source. The life time of the frequency converter is advantageously extended by such remote arrangement.

Inventive color converters can be produced by different processes.

In one method, the at least one colorant B and, if desired the scattering particles (scattering bodies), is mixed in the polymer by extrusion. Subsequently it can be melt processed (extruded) to produce films/plates/injection moulds of fluorescent material in a polymer matrix.

In an alternative method, the polymer, the colorant B and, if desired, the scattering particles, can be dissolved in a suitable solvent. The solution/dispersion obtained are then coated on a substrate such as glass. After the solvent has dried off, the film is detached from the substrate.

In another alternative method, printing techniques such as ink-jet printing or screen-printing can be used to produce the frequency converter.

According to a further embodiment of the transmitter of the present invention, the modulator is coupled to the radiation source. In this case, the modulator is adapted to control the radiation source. In particular, the radiation source may be controlled, so that the intensity of at least a part of the first electromagnetic radiation emitted by the radiation source varies depending on the data to be transmitted. In this case, intensity modulation is used in which the bits are included in small intensity variations of the emitted electromagnetic radiation. However, other modulation techniques may also be used.

As mentioned above, according to the present invention, the first electromagnetic radiation is modulated. Such modulation may be implemented by control of the radiation source. According to another embodiment, the first electromagnetic radiation may also be modulated after this radiation has been emitted by the radiation source but before conversion into the second electromagnetic radiation. In this case, the modulator is a separate element arranged between the radiation source and the frequency converter.

According to even another embodiment, the modulator may be coupled to the frequency converter if the frequency converter is an active element that may be controlled. However, also in this case, the modulation is carried out before the conversion of the first electromagnetic radiation.

According to the invention, the frequency converter is in particular adapted, so that the second electromagnetic radiation is modulated in correspondence to the modulation of the first electromagnetic radiation. In particular, the modulation remains essentially unchanged due to the short decay time of the frequency converter used by the transmitter according to the present invention.

The present invention relates also to an illumination device comprising a transmitter transmitting modulated second electromagnetic radiation in the visible spectral range as described above. In particular, the modulated second electromagnetic radiation has a band spectrum comprising wavelengths in the range from 450 to 750 nm, preferably 450 nm to 700 nm to generate a desired emission spectrum, in particular white light.

Moreover, the illumination device is adapted to generate a value of a luminous flux of the modulated second electromagnetic radiation being at least in the range from 100 lm to 30 000 lm. Such illumination device may be used, for example, for lighting, in particular within buildings, for infrastructure devices and in the field of automotive lighting. It is mentioned that the illumination device may provide at least any luminous flux that is in the range from 100 lm to 30 000 lm. However, the illumination device may also be dimmed, so that the value of the luminous flux may also be below this range, so that data transmission may also be carried out when the illumination device is not used for lighting.

The present invention further relates to a data transmission system comprising a transmitter as described above. The data transmission system comprises in addition a receiver to detect at least a part of the modulated second electromagnetic radiation emitted by the transmitter. Furthermore, it comprises a data analyzer for extracting data from the detected modulated second electromagnetic radiation.

The receiver may comprise a photodetector, a camera or a solar cell. Furthermore, the receiver may comprise an infrared filter for filtering modulated second electromagnetic radiation emitted by the transmitter. Therefore, a broad range of electromagnetic radiation may be received and analyzed by the data transmission system increasing the distance between the transmitter and the receiver in which data transmission is possible.

Polymeric Matrix Material

The polymeric matrix of the frequency converter according to the invention preferably consists essentially or completely of polystyrene, polycarbonate, polymethylmethacrylate, polyvinylpyrrolidone, polymethacrylate, polyvinyl acetate, polyvinyl chloride, polybutene, silicone, polyacrylate, epoxy resin, polyvinyl alcohol, poly(ethylene vinylalcohol)-copolymer (EVA, EVOH), polyacrylonitrile, polyvinylidene chloride (PVDC), polystyrene acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyetherimides, 2,5-furandicarboxylate polyester.

Especially, the at least one polymer consists essentially or completely of polystyrene, polycarbonate, polyethylene terephthalate. Likewise especially, the at least one polymer consists of polymethylmethacrylate. Likewise especially, the at least one polymer consists of polyethylene furanoate.

Polystyrene is understood here to mean, inter alia, all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene. In general, suitable polystyrenes have a mean molar mass Mn of 10 000 to 1 000 000 g/mol-(determined by GPC), preferably 20 000 to 750 000 g/mol, more preferably 30 000 to 500 000 g/mol.

In a preferred embodiment, the matrix of the frequency converter consists essentially or completely of a homopolymer of styrene or styrene derivatives. More particularly, the polymer consists of polystyrene.

In a further preferred embodiment of the invention, the matrix consists essentially or completely of a styrene copolymer, which are likewise regarded as polystyrene in the context of this application. Styrene copolymers may comprise, as further constituents, for example, butadiene, acrylonitrile, maleic anhydride, vinylcarbazole or esters of acrylic, methacrylic or itaconic acid as monomers. Suitable styrene copolymers generally comprise at least 20% by weight of styrene, preferably at least 40% and more preferably at least 60% by weight of styrene. In another embodiment, they comprise at least 90% by weight of styrene.

Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS). A further preferred polymer is alpha-methylstyrene-acrylonitrile copolymer (AMSAN). The styrene homo- or copolymers can be prepared, for example, by free-radical polymerization, cationic polymerization, anionic polymerization or under the influence of organometallic catalysts (for example Ziegler-Natta catalysis). This can lead to isotactic, syndiotactic or atactic polystyrene or copolymers. They are preferably prepared by free-radical polymerization. The polymerization can be performed as a suspension polymerization, emulsion polymerization, solution polymerization or bulk polymerization. The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and references cited therein; and in Elias, Macromolecules, Weinheim 2007, p. 269-275.

In another preferred embodiment, the polymer consists of polyethylene terephthalate. Polyethylene terephthalate is obtainable by condensation of ethylene glycol with terephthalic acid.

Likewise more particularly, the polymer consists of polycarbonate. Polycarbonates are polyesters of carbonic acid with aromatic or aliphatic dihydroxyl compounds. Preferred dihydroxyl compounds are, for example, methylenediphenylenedihydroxyl compounds, for example bisphenol A. One means of preparing polycarbonates is the reaction of suitable dihydroxyl compounds with phosgene in an interfacial polymerization. Another means is the reaction with diesters of carbonic acid such as diphenyl carbonate in a condensation polymerization. The preparation of suitable polycarbonates is described, for example, in Elias, Macromolecules, Weinheim 2007, p. 343-347.

In a further preferred embodiment, the polymeric matrix material comprising at least one 2,5-furandicarboxylate polyester (A) obtainable by reacting (i) at least one diol selected from an aliphatic $C_2$-$C_{20}$-diol and a cycloaliphatic $C_3$-$C_{20}$-diol, with (ii) 2,5-furandicarboxylic acid and/or an ester forming derivative thereof and (iii) optionally at least one further dicarboxylic acid selected from 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof.

Suitable aliphatic $C_2$-$C_{20}$-diols are preferably linear or branched $C_2$-$C_{15}$-alkanediols, especially linear or branched $C_2$-$C_{10}$-alkanediols, such as ethane-1,2-diol (ethylene glycol), propane-1,2-diol, propane-1,3-diol (propylene glycol), butane-1,3-diol, butane-1,4-diol (butylene glycol), 2-methyl-1,3-propanediol, pentane-1,5-diol, 2,2-dimethyl-1,3-propanediol (neopentyl glycol), hexane-1,6-diol, heptane-1,7-diol, octane-1,8-diol, nonane-1,9-diol, decane-1,10-diol, etc. Suitable cycloaliphatic $C_3$-$C_{20}$-diols are preferably $C_3$-$C_{10}$-cycloalkylenediols, such as 1,2-cyclopentanediol, 1,3-cyclopentanediol, 1,2-cyclohexanediol, 1,4-cyclohexanediol, 1,2-cycloheptanediol or 1,4-cycloheptanediol. Other suitable cycloaliphatic $C_3$-$C_{20}$-diols include 1,3-cyclohexane dimethanol and 1,4-cyclohexane dimethanol, or 2,2,4,4-tetramethyl-1,3-cyclobutanediol, or combinations thereof. Particularly preferred diols are $C_2$-$C_6$-alkanediols, in particular ethane-1,2-diol, propane-1,2-diol, propane-1,3-diol, butane-1,3-diol, butane-1,4-diol, pentane-1,5-diol, 2,2-dimethyl-1,3-propanediol and mixtures thereof. More particularly preferred are ethane-1,2-diol and propane-1,3-diol. Especially preferred is ethane-1,2-diol.

More particularly preferred are also biologically derived ("bio-derived") $C_2$-$C_{10}$-alkanediols, especially $C_2$-$C_6$-alkanediols, such as ethane-1,2-diol and propane-1,3-diol. Bio-based ethane-1,2-diol may be obtained from a lignocellulosic biomass source by the conversion of the carbohydrates therein contained. Methods for preparing $C_2$-$C_{10}$-alkanediols from biomass are known in the art, for example from US 2011/0306804.

Preferably, the diol component (i) is made up exclusively of one diol mentioned as preferred, especially ethane-1,2-diol. The diol component (i) may also comprise two, three or more than three different diols. If two, three or more than three different diols are used, preference is given to those mentioned above as being preferred. In this case, based on the total weight of component (i), ethane-1,2-diol is preferably the major component.

Ester forming derivatives of 2,5-furandicarboxylic acids are especially $C_1$-$C_{10}$-dialkyl esters of 2,5-furandicarboxylic acid. Particularly preferred diesters are $C_1$-$C_6$-dialkyl esters of 2,5-furandicarboxylic acid, especially the dimethyl ester and diethyl ester. Component (ii) may also comprise two, three or more than three different diesters of 2,5-furandicarboxylic acid. 2,5-Furandicarboxylic acid can be produced from bio-based sugars. Routes for the preparation of 2,5-furandicarboxylic acid using air oxidation of 2,5-disubstituted furans, such as 5-hydroxymethylfurfural with catalysts comprising Co, Mn and/or Ce were reported recently in WO 2010/132740, WO 2011/043660, WO 2011/043661, US 2011/0282020, US 2014/0336349 and WO 2015/137804. Routes for the preparation of dialkyl ester of 2,5-furandicarboxylic acid are also described for example in WO 2011/043661.

Preferably, component (ii) is made up exclusively of 2,5-furandicarboxylic acid or of diester(s) of 2,5-furandicarboxylic acid.

Preferably, the 2,5-furandicarboxylate polyester (A) is selected from poly(ethylene-2,5-furandicarboxylate), poly(propylene-2,5-furandicarboxylate), poly(ethylene-co-propylene-2,5-furandicarboxylate), poly(butylene-2,5-furandicarboxylate), poly(pentylene-2,5-furandicarboxylate), poly(neopentylene-2,5-furandicarboxylate) and mixtures thereof. In particular, the polymeric matrix material for use in the frequency converter according to the invention can consist of, can consist essentially of or can be selected from poly(ethylene-2,5-furandicarboxylate), poly(trimethylene-2,5-furandicarboxylate) and poly(butylene-2,5-furandicarboxylate). Especially, the polymeric matrix material for use in the frequency converter according to the invention consists of poly(ethylene-2,5-furandicarboxylate). In a further specific embodiment, the polymeric matrix material of the frequency converter comprises a mixture (blend) of different 2,5-furandicarboxylate polyesters (A) as defined above, for example, a blend of poly(ethylene-2,5-furandicarboxylate) and poly(propylene-2,5-furandicarboxylate). Poly(propylene-2,5-furandicarboxylate) is also referred to as poly(trimethylene-2,5-furandicarboxylate); poly(butylene-2,5-furandicarboxylate) is also referred to as poly(tetramethylene-2,5-furan-dicarboxylate), poly(pentylene-2,5-furandicarboxylate) is also referred to as poly(pentamethylene-2,5-furan-dicarboxylate).

Likewise suitable are 2,5-furandicarboxylate polyesters (A) obtainable by reacting at least one diol component (i) as defined above, component (ii) as defined above and at least one further diacid or diester component (iii) selected from 1,2-cyclohexanedicarboxylic acid, 1,4-cyclohexanedicarboxylic acid, 3,4-furandicarboxylic acid, terephthalic acid and 2,6-naphthalic acid and/or an ester forming derivative thereof. Ester forming derivatives of 1,2-cyclohexanedicarboxylic acid, 1,4-cyclohexanedicarboxylic acid, 3,4-furandicarboxylic acid, terephthalic acid and 2,6-naphthalic acid are especially the $C_1$-$C_{10}$-dialkyl ester. Particularly preferred esters are $C_1$-$C_6$-dialkyl ester, especially the dimethyl ester and diethyl ester. When using a combination of component (ii) and component (iii), component (ii) is the major component based on the total weight of component (ii) and (iii). Examples are poly(ethylene-2,5-furandicarboxylate-co-1,2-cyclohexanedicarboxylate), poly(ethylene-2,5-furandicarboxylate-co-1,4-cyclohexanedicarboxylate), poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate), preferably poly(ethylene-2,5-furandicarboxylate-co-terephthalate), poly(ethylene-2,5-furandicarboxylate-co-2,6-naphthalate) or poly(ethylene-2,5-furandicarboxylate-co-3,4-furandicarboxylate.

The 2,5-furandicarboxylate polyester (A) can be prepared as described in U.S. Pat. No. 2,551,731.

In a preferred embodiment, polymers which have been polymerized with exclusion of oxygen are used. Preferably, the monomers during the polymerization comprised a total of not more than 1000 ppm of oxygen, more preferably not more than 100 ppm and especially preferably not more than 10 ppm.

In one embodiment of the invention, suitable polymers are transparent polymers. In another embodiment, suitable polymers are opaque polymers.

The polymers mentioned above serve as a matrix material for the compounds of groups (B1) to (B16) and mixtures thereof and, if present, other frequency converting materials. The fluorescent colorant(s) of groups (B1) to (B16), but optionally also other converting materials, may either be dissolved in the polymer or may be in the form of a homogeneously distributed mixture. In a preferred embodiment, the fluorescent colorant(s) are dissolved in the polymer.

Suitable polymers may comprise, as further constituents, additives, such as flame retardants, antioxidants, light stabilizers, UV absorbers, free-radical scavengers, antistats. Stabilizers of this kind are known to those skilled in the art.

Suitable antioxidants or free-radical scavengers are, for example, phenols, especially sterically hindered phenols, such as butylhydroxyanisole (BHA) or butylhydroxytoluene (BHT), or sterically hindered amines (HALS). Stabilizers of this kind are sold, for example, by BASF under the Irganox® trade name. In some cases, antioxidants and free-radical scavengers can be supplemented by secondary stabilizers, such as phosphites or phosphonites, as sold, for example, by BASF under the Irgafos® trade name. In a preferred embodiment of the invention, suitable polymers do not comprise any antioxidants or free-radical scavengers.

Suitable UV absorbers are, for example, benzotriazoles, such as 2-(2-hydroxyphenyl)-2H-benzotriazole (BTZ), triazines, such as (2-hydroxyphenyl)-s-triazine (HPT), hydroxybenzophenones (BP) or oxanilides. UV absorbers of this kind are sold, for example, by BASF under the Uvinul® trade name.

Organic Fluorescent Colorant B

The compounds of groups (B1) to (B15) absorb at least a part of the blue light component of the radiation source and emit in the visible spectrum. Preferably, each compound of groups (B1) to (B15) has a fluorescence quantum yield of at least 80%, measured in a polymer film.

The compounds of group B16 efficiently absorb light in the spectral range from 600 to 650 nm. The compounds of group B16 usually receive at least some of the excited electrons of a fluorescent compound. This fluorescent compound can be a sensitizer which is capable of performing a role of transferring energy to the compound of group B16 by absorbing blue light. In this case, the compound of group B16 may emit light using the received electrons in an excited state in the sense of a Förster resonance energy transfer (FRET). Alternatively, this fluorescent compound can be any of the other colorants from groups B1 to B15 and their emitted electrons can be re-absorbed by the compound of group (B16). Preferably, each compound of group B16 has a fluorescence quantum yield of at least 40%, measured in a polymer film.

Preferably, the frequency converter comprises at least one colorant B selected from the groups B1, B2, B3, B4, B5, B7, B8, B11, B12, B13, B14, B15, B16 or mixtures thereof.

Likewise preferably, the frequency converter comprises at least one colorant B selected from the group selected from the groups B1, B2, B3, B4, B5, B7, B8, B11, B12, B13, B14, B15 and mixtures thereof.

In a special embodiment, the frequency converter comprises a combination of organic fluorescent colorants comprising a compound of group B7 and a compound of group B13.

Organic Fluorescent Colorant (B1)

Naphthoylbenzimidazole compounds of formula (I) are known from EP 17151931.7. Compounds of formula (I) are usually yellow fluorescent compounds.

With regard to the use in frequency converters, compounds of formula (I) are preferred which correspond to a compound of formula (I-A)

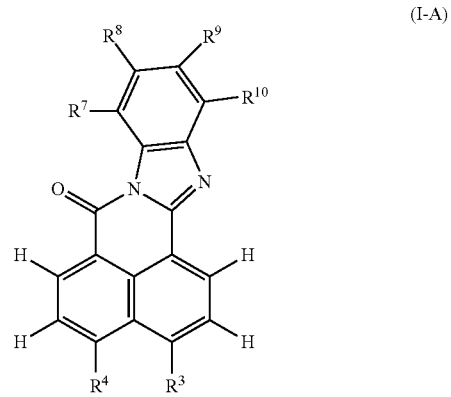

(I-A)

wherein
$R^3$ and $R^4$ are each independently hydrogen, phenyl, phenyl which carries 1 or 2 cyano groups or phenyl which carries 1, 2 or 3 substituents selected from $C_1$-$C_{10}$-alkyl; and
$R^7$, $R^8$, $R^9$ and $R^{10}$ are each independently hydrogen, phenyl, phenyl which carries 1 or 2 cyano groups or phenyl which carries 1, 2 or 3 substituents selected from $C_1$-$C_{10}$-alkyl.

Among the compounds of formula (I-A), preference is given to compounds, in which $R^8$ and $R^{10}$ have the same meaning. Likewise, preference is given to compounds, in which $R^7$ and $R^9$ have the same meaning. In particular, $R^8$ and $R^{10}$ have the same meaning and $R^7$ and $R^9$ have the same meaning. In particular, $R^7$ and $R^9$ have the same meaning and are hydrogen.

A particular preferred embodiment of the invention relates to compounds of formula (I-A), wherein $R^3$ and $R^4$ are each independently selected from hydrogen, phenyl, phenyl which carries 1 or 2 cyano groups and phenyl which carries 1, 2 or 3 $C_1$-$C_{10}$-alkyl substituents; in particular hydrogen, phenyl or phenyl which carries 1 cyano group;

$R^7$ is hydrogen;

$R^8$ is phenyl, phenyl which carries 1 or 2 cyano groups or phenyl which carries 1, 2 or 3 $C_1$-$C_{10}$-alkyl substituents;

$R^9$ is hydrogen; and $R^{10}$ is phenyl, phenyl which carries 1 or 2 cyano groups or phenyl which carries 1, 2 or 3 $C_1$-$C_{10}$-alkyl substituents.

In particular, $R^8$ is 4-cyanophenyl. In particular, $R^{10}$ is 4-cyanophenyl.

A more particular preferred embodiment of the invention relates to compounds of formula (I-A), wherein $R^3$ is phenyl, phenyl which carries 1 cyano group; or phenyl which carries 1 substituent selected from $C_1$-$C_{10}$-alkyl;

$R^4$ is hydrogen;

$R^8$ and $R^{10}$ are each phenyl which carries 1 cyano group;

$R^7$ and $R^9$ are each hydrogen.

In particular, $R^3$ is phenyl which carries 1 cyano group;

A further especially preferred embodiment of the invention relates to compounds of formula (I-A), wherein $R^3$ hydrogen;

$R^4$ is phenyl, phenyl which carries 1 cyano group or phenyl which carries 1 substituent selected from $C_1$-$C_{10}$-alkyl; in particular phenyl which carries 1 cyano group;

$R^8$ and $R^{10}$ are each phenyl which carries 1 cyano group;

$R^7$ and $R^9$ are each hydrogen.

Examples of preferred compounds of formula (I-A) are the compounds of formulae (I-A.1), (I-A.2) (I-A.3) and (I-A.4)

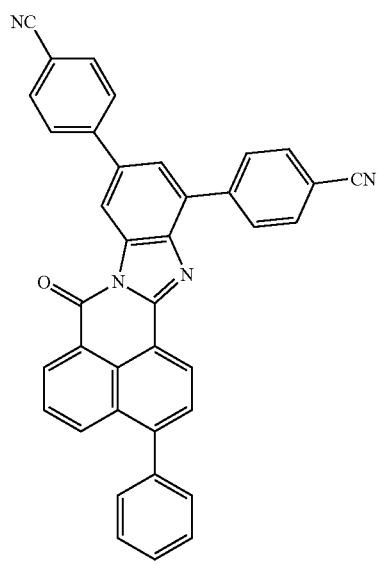

(I-A. 1)

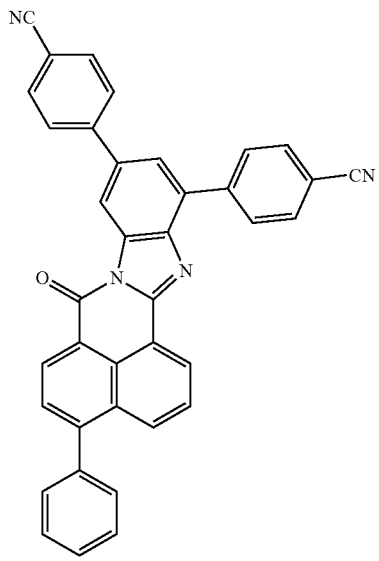

(I-A. 2)

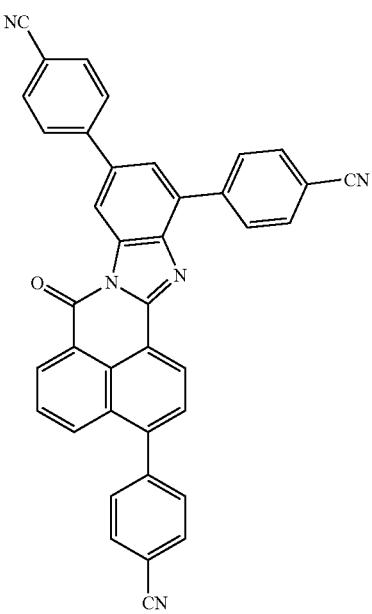

(I-A. 3)

-continued

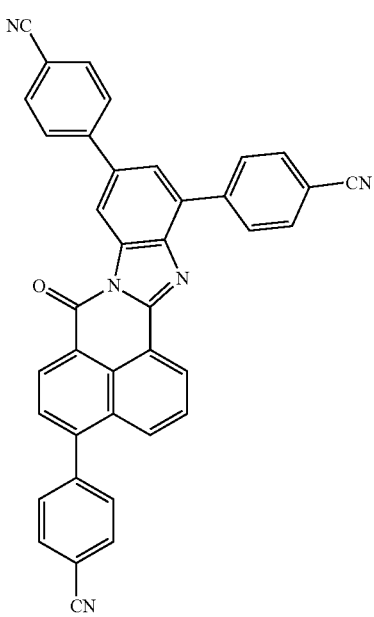

(1-A. 4)

Compounds of formula (I) and mixtures thereof can be prepared in analogy to standard methods, for example as described in WO 2012/168395, especially on pages 64-81 or WO 2015/019270, on pages 21-30.

Organic Fluorescent Colorant (B2)

Cyanated naphthoylbenzimidazole compound of formula (II) are known from WO 2015/019270. Compounds of formula (II) are usually green, yellow-green or yellow fluorescent dyes. With regard to the use in the frequency converter of the present invention, the compound (II) is preferably selected from a compound of formula (II-A)

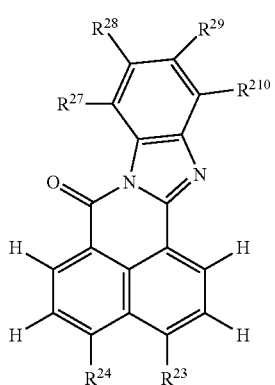

(II-A)

and mixtures thereof,
in which
$R^{23}$ and $R^{24}$ are each independently cyano, phenyl, 4-cyanophenyl or phenyl which carries 1, 2 or 3 substituents selected from $C_1$-$C_{10}$-alkyl, especially cyano, phenyl or 4-cyanophenyl; and
$R^{27}$, $R^{28}$, $R^{29}$ and $R^{210}$ are each independently hydrogen, cyano, phenyl, 4-cyanophenyl or phenyl which carries 1, 2 or 3 substituents selected from $C_1$-$C_{10}$-alkyl, especially hydrogen, cyano, phenyl or 4-cyanophenyl.

More preferred are the compounds specified in WO 2015/019270 on page 16, 2$^{nd}$ paragraph to page 20, 3$^{rd}$ paragraph. With regard to the use in the frequency converter of the present invention, especially preferred are compounds of formula (II) selected from compounds of formulae (II-1), (II-2), (II-3), (II-4), (II-5), (II-6), (II-7), (II-8), (II-9), (II-10), (II-11), (II-12), (II-13), (II-14), (II-15), (II-16), (II-17), (II-18), (II-19), (II-20), (II-21), (II-22), (II-23), (II-24), (II-25), (II-26), (II-27), (II-28), (II-29), (II-30), (II-31), (II-32), (II-33), (II-34), (II-35), (II-36), (II-37), (II-38), (II-39), (II-40), (II-41), (II-42), (II-43), (II-44), (II-45), (II-46), (II-47), (II-48), (II-49), (II-50) or mixtures thereof

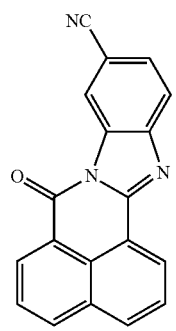

(II-1)

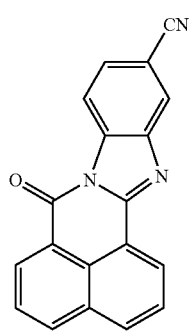

(II-2)

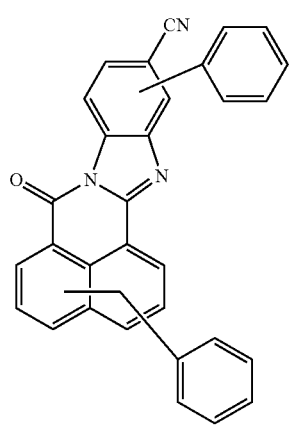

(II-3)

-continued
(II-4)
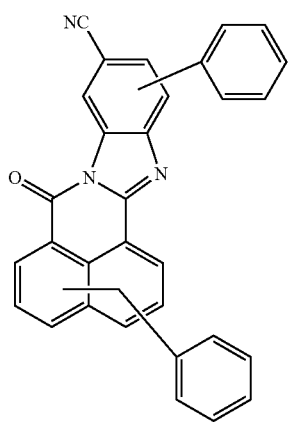
(II-5)
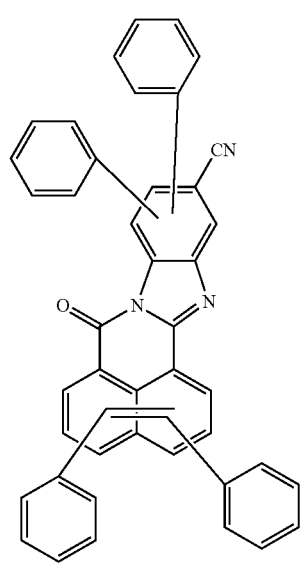
(II-6)
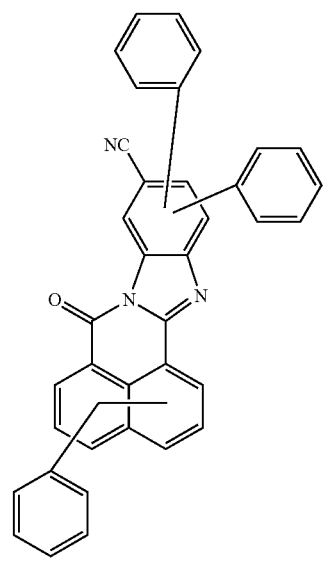
-continued
(II-7)
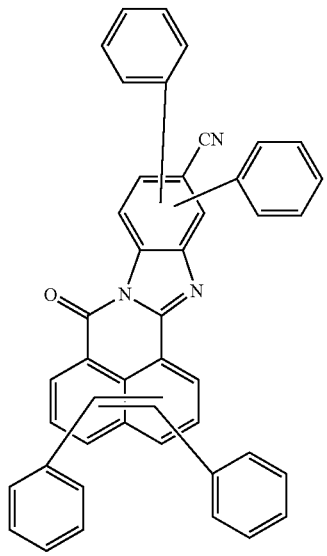
(II-8)
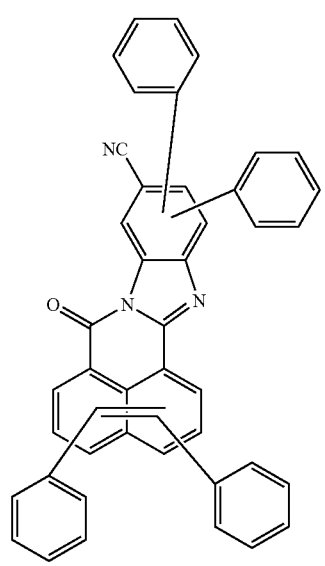
(II-9)
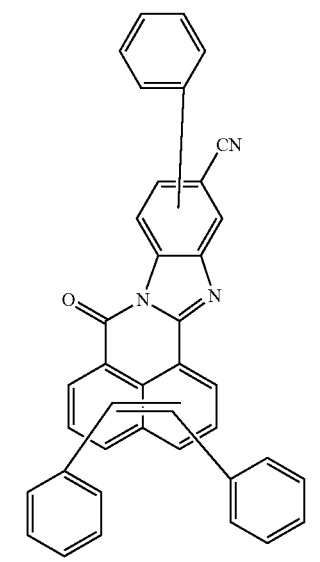

(II-10)
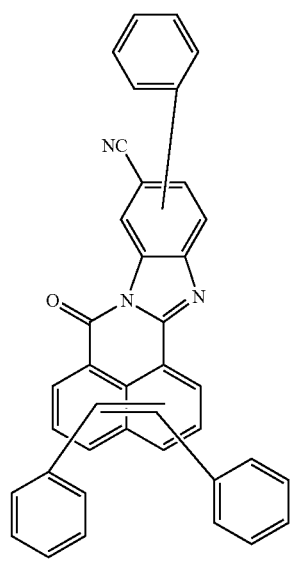
(II-11)
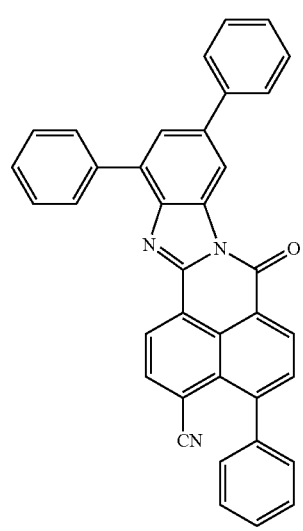
(II-12)
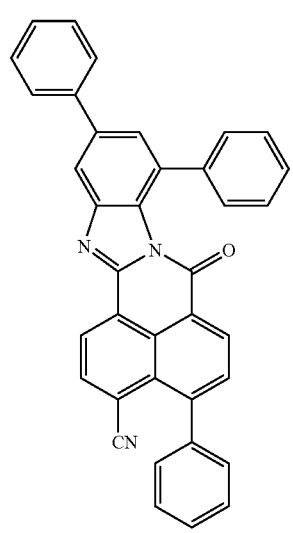
(II-13)
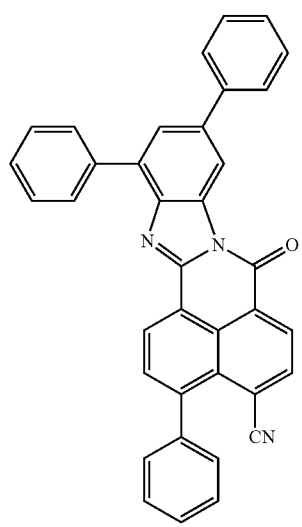
(II-14)
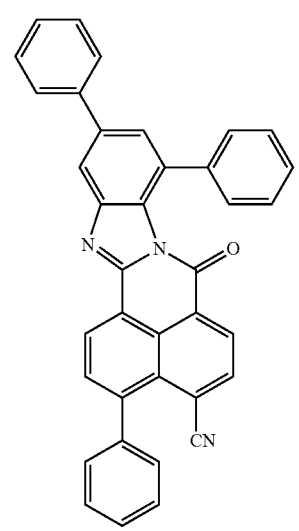
(II-15)
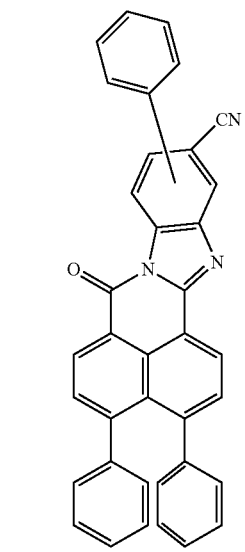

(II-16)
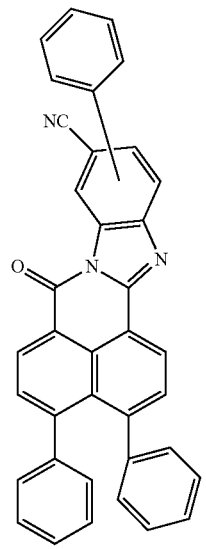
(II-17)
(II-18)
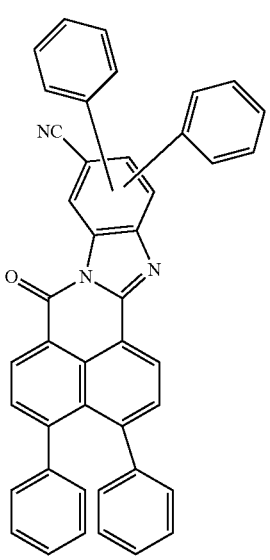
(II-19)
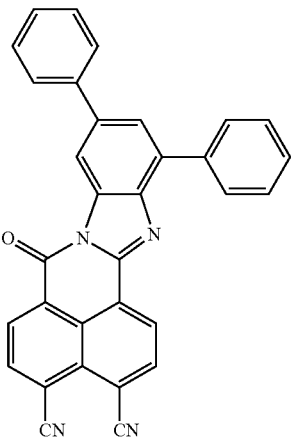
(II-20)
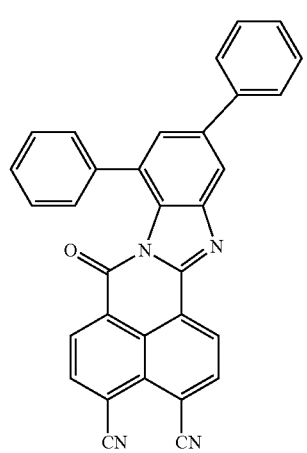
(II-21)
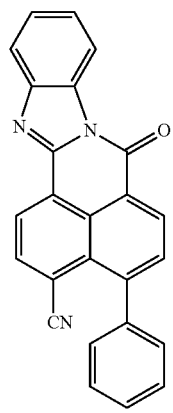

(II-22)
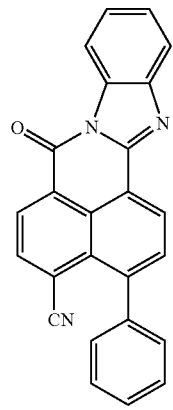
(II-23)
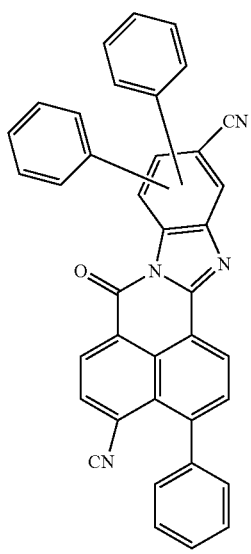
(II-24)
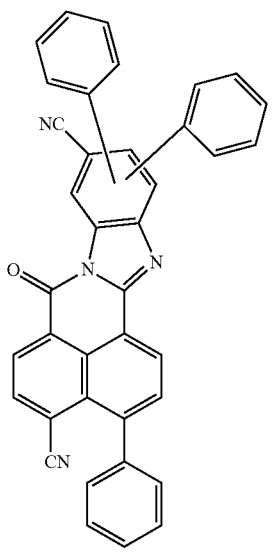
(II-25)
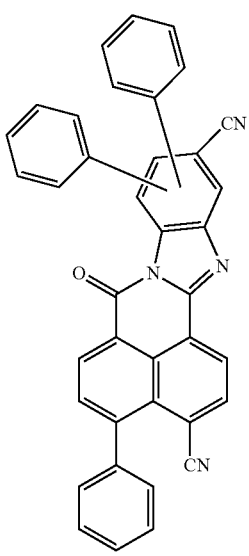
(II-26)
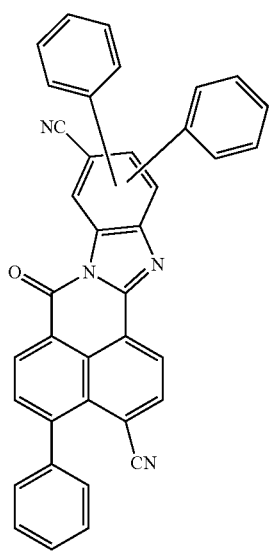
(II-27)
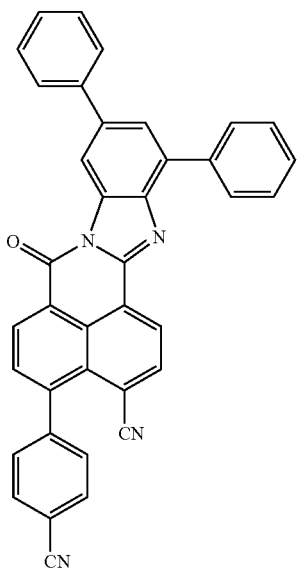

(II-28)
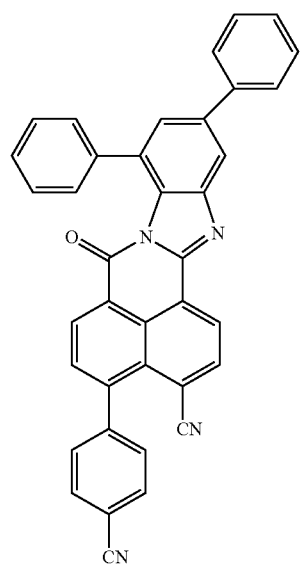
(II-29)
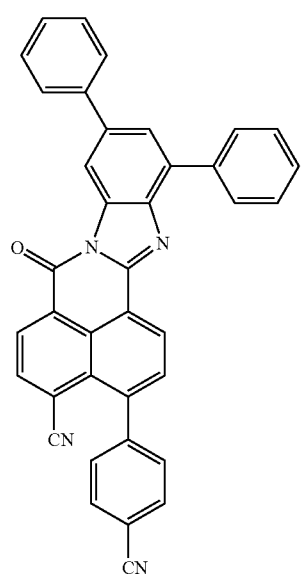
(II-30)
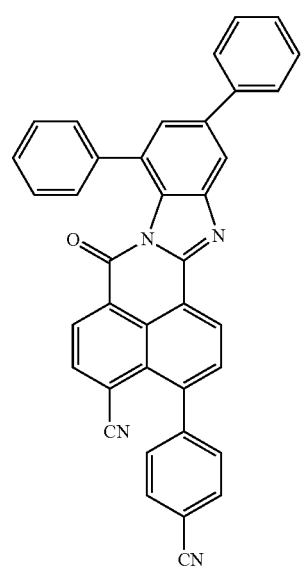
(II-31)
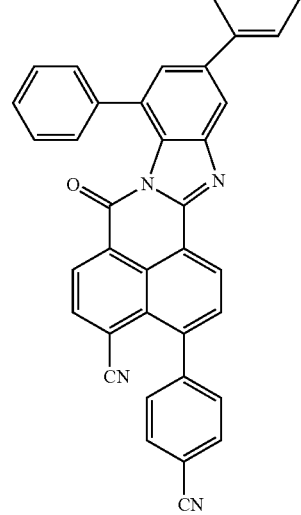
(II-32)
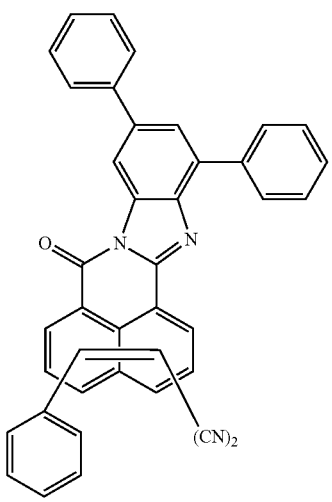

(II-33)
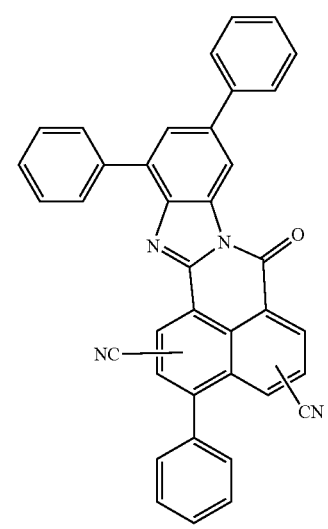
(II-34)
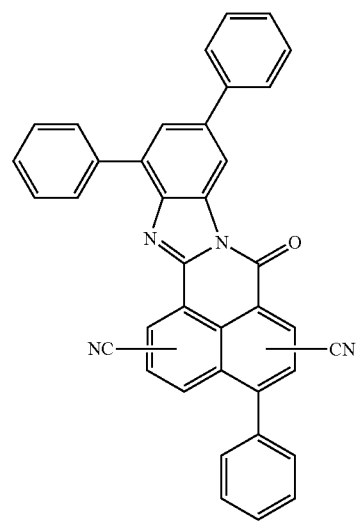
(II-35)
(II-36)
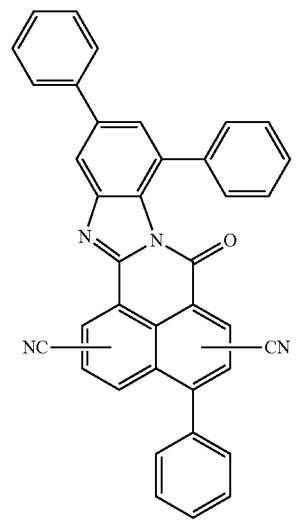
(II-37)
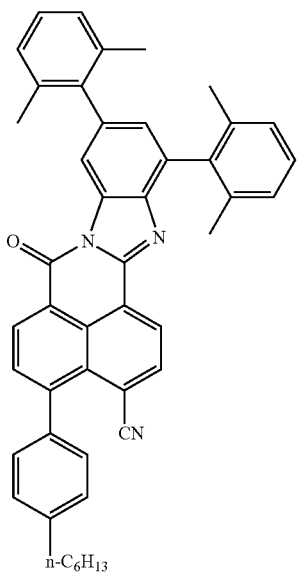
(II-38)
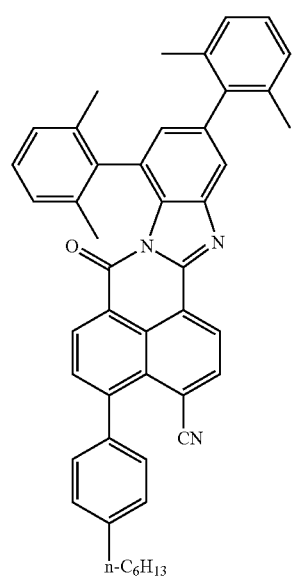

-continued
(II-39)
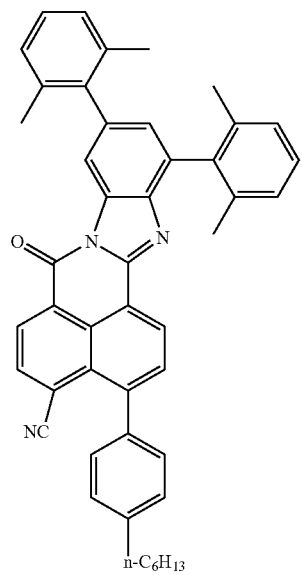
(II-40)
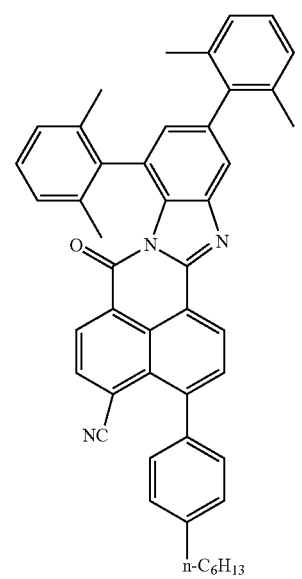
(II-41)
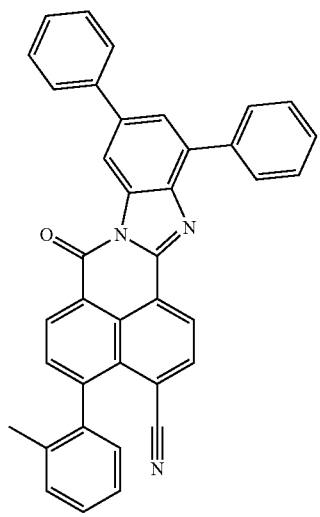
(II-42)
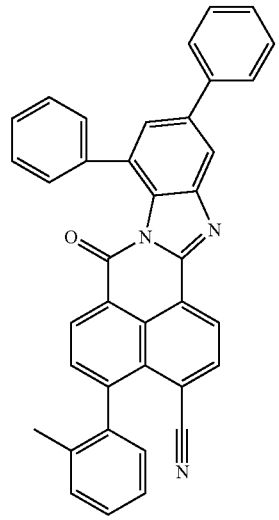
(II-43)
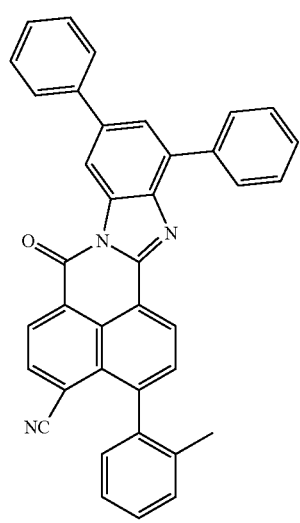
(II-44)
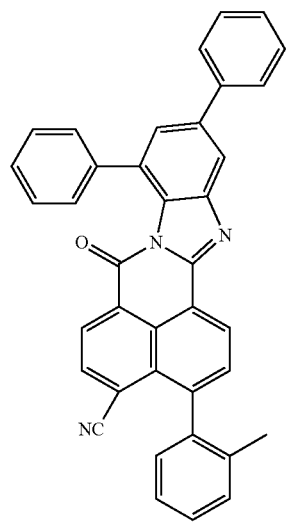

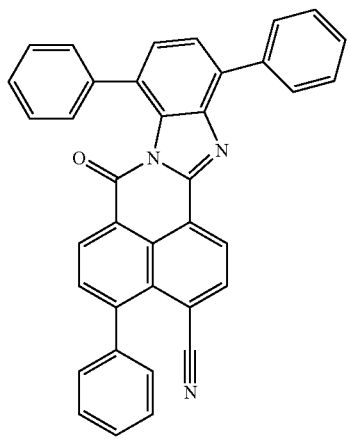
(II-45)
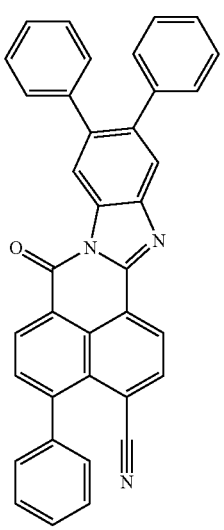
(II-46)
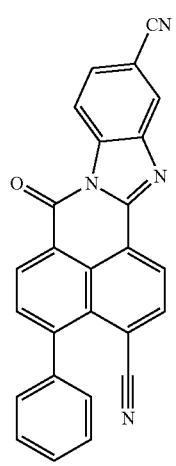
(II-47)
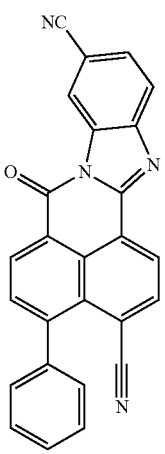
(II-48)
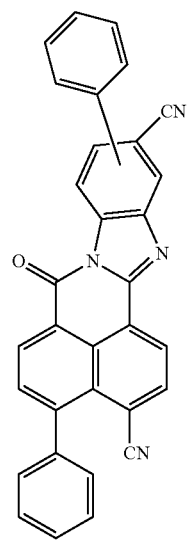
(II-49)
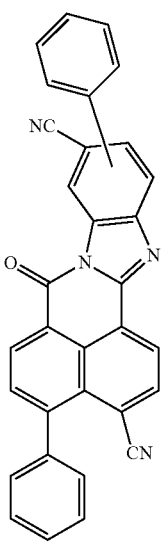
(II-50)
More especially preferred are compounds (II-11), (II-12), (II-13) and (II-14) and mixtures thereof.
Organic Fluorescent Colorant (B3)
Compounds of formula (III) are known from WO 2015/169935. Compounds of formula (III) are usually yellow or yellow-green fluorescent dyes. With regard to the use in the frequency converter of the present invention, the compound of formula (III) encompasses the following compounds of formulae (III-a) and (III-b) as well as compounds of formulae (III-c) and (III-d):

selected from compounds of formulae (III-1), (III-2), (III-3), (III-4), (III-5), (III-6), (III-7), (III-8), (III-9), (III-10), (III-11), (III-12), (III-13), (III-14), (III-15), (III-16), (III-17), (III-18), (III-19), (III-20)

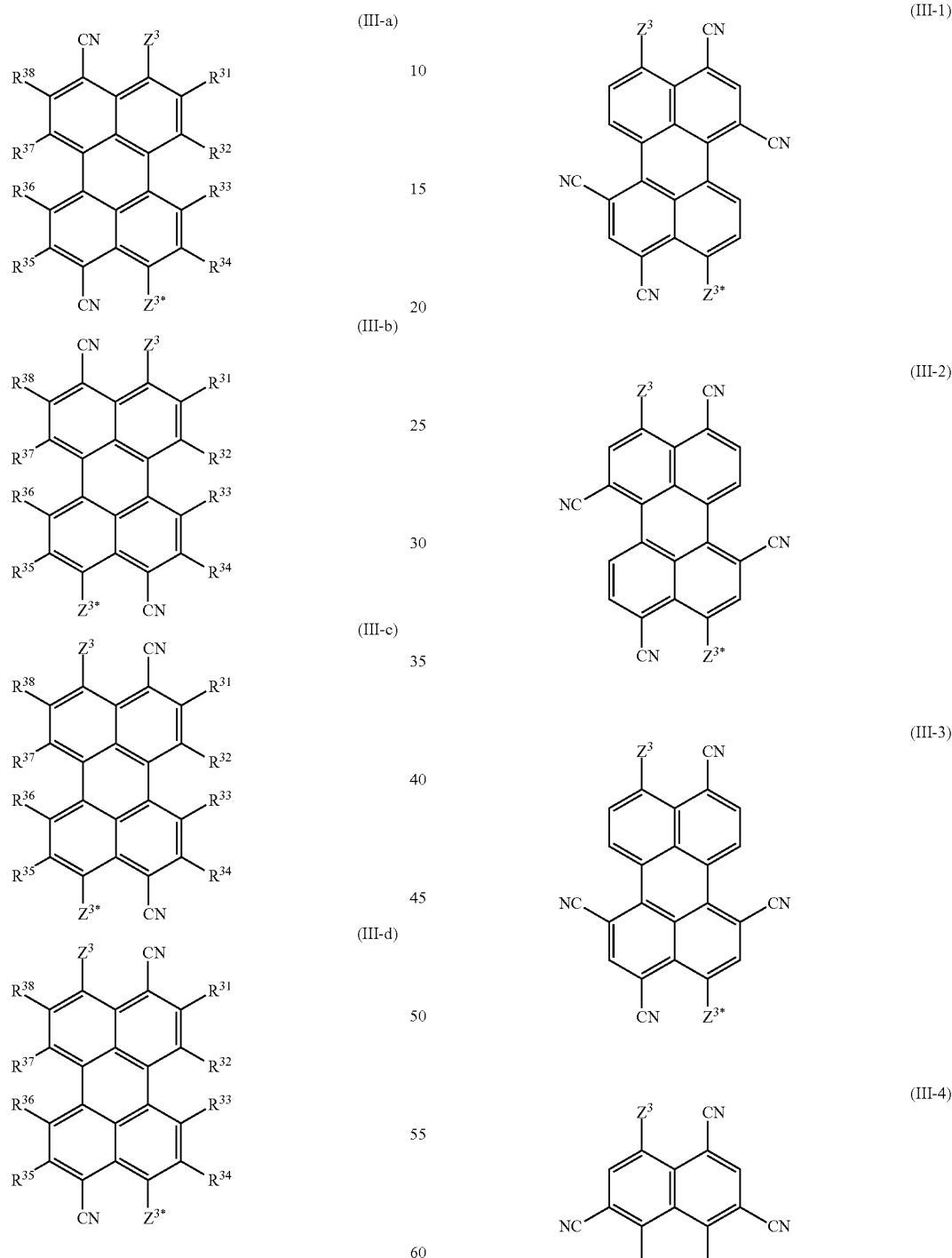

individually and mixtures thereof,
in which $R^{31}$, $R^{32}$, $R^{33}$, $R^{34}$, $R^{35}$, $R^{36}$, $R^{37}$, $R^{38}$, $Z^3$ and $Z^{3*}$ are each as defined above.

In particular, preference is given to the compounds specified in WO 2015/169935 on page 12, line 9 to page 13, line 31. With regard to the use in the frequency converter of the present invention, preferred are compounds of formula (III)

(III-5)
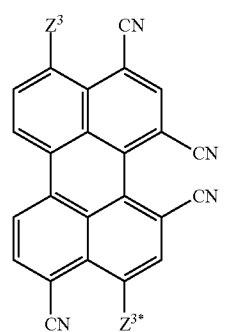
(III-6)
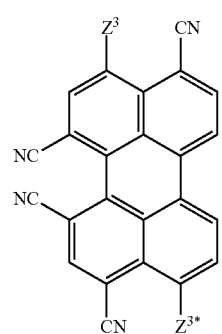
(III-7)
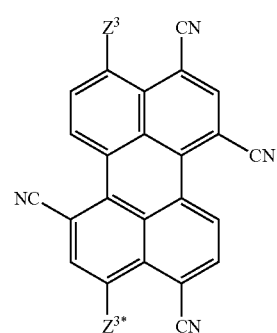
(III-8)
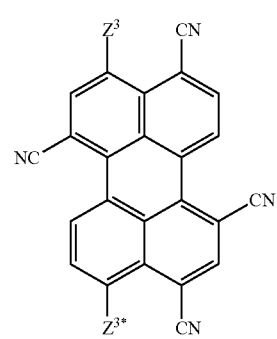
(III-9)
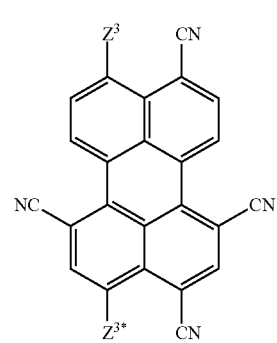
(III-10)
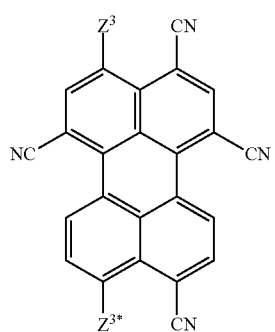
(III-11)
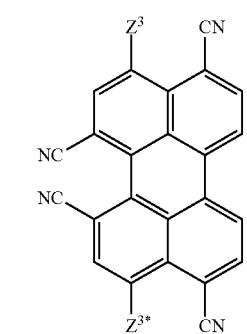
(III-12)
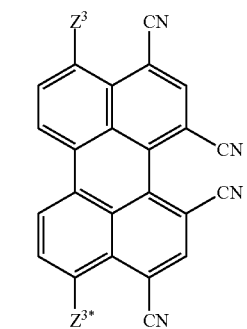
(III-13)
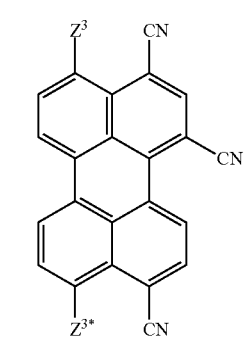
(III-14)
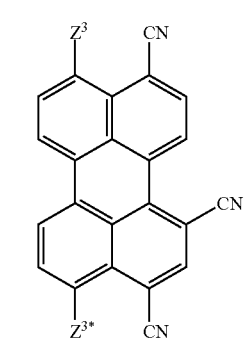

(III-15)
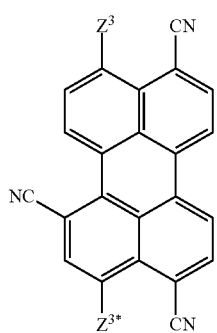

(III-16)
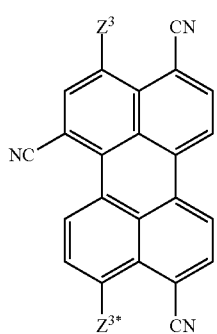

(III-17)
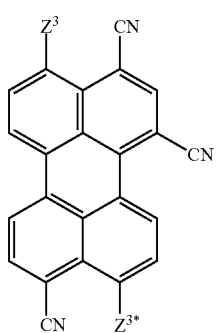

(III-18)
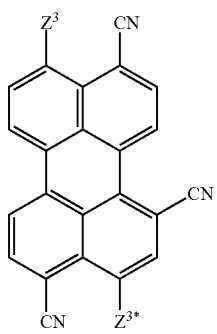

(III-19)
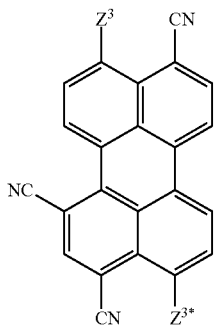

(III-20)
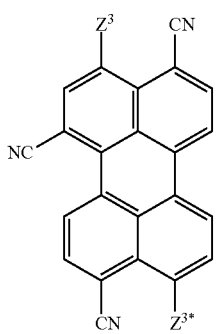

and mixtures thereof, in which $Z^3$ is selected from $C_1$-$C_6$-alkyl, $C_1$-$C_6$-alkoxycarbonyl, phenyl, or phenyl bearing 1, 2 or 3 $C_1$-$C_4$-alkyl groups; and $Z^{3*}$ is selected from $C_1$-$C_6$-alkyl, $C_1$-$C_6$-alkoxycarbonyl, phenyl, or phenyl bearing 1, 2 or 3 $C_1$-$C_4$-alkyl groups.

In a special embodiment, $Z^{3*}$ has the same meaning as $Z^3$.

Among these, specific preference is given to perylene compounds of formulae (10.a), (10.b)

(10.a)
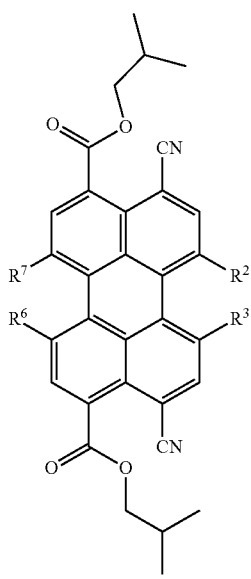

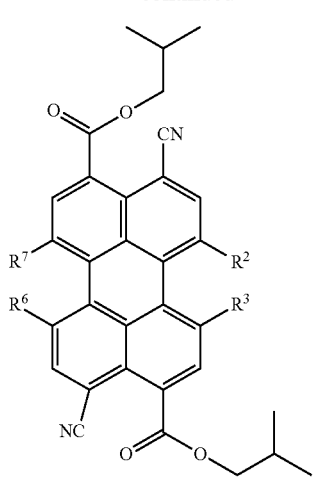

(10.b)

and mixtures of compounds of formulae (10.a) and (10.b), in which
three of the $R^2$, $R^3$, $R^6$ and $R^7$ substituents are hydrogen; and one of the $R^2$, $R^3$, $R^6$ and $R^7$ substituents is cyano.

Organic Fluorescent Colorant (B4)

Cyanated compounds of formula (IV) are subject-matter of WO 2016/151068. Compounds of formula (IV) are usually yellow or yellow-green fluorescent dyes. With regard to the use in the frequency converter of the present invention, the compound of formula (IV) is preferably a compound, wherein $X^{40}$ is O. Also preferred are compounds of formula (IV), wherein $X^{40}$ is S. Preference is given to the compounds specified in WO 2016/151068 on page 24, line 10 to page 34, line 4.

Among these, compounds of formula (IV) are especially preferred, wherein A is a radical of formula (A.2). Compounds of formula (IV), where A is a radical of formula (A.2) are also referred to as compounds of formula (IV-A.2),

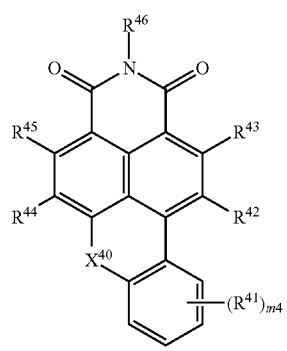

(IV-A.2)

wherein
m4, $X^{40}$, $R^{41}$, $R^{42}$, $R^{43}$, $R^{44}$, $R^{45}$ and $R^{46}$ are as defined above.

In the compounds of formula (I-A.2), $R^{46}$ is preferably selected from hydrogen, linear $C_1$-$C_{24}$-alkyl, branched $C_3$-$C_{24}$-alkyl, $C_6$-$C_{10}$-aryl and $C_6$-$C_{10}$-aryl-$C_1$-$C_{10}$-alkylene, where the aryl ring in the two last mentioned moieties is unsubstituted or substituted with 1, 2, 3, 4 or 5 identical or different radicals $R^{46a}$. Especially, $R^{46}$ is selected from linear $C_1$-$C_{24}$-alkyl, a radical of formula (B.1) and a radical of formula (B.2)

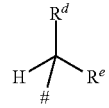

(B.1)

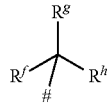

(B.2)

in which
# is the bonding site to the nitrogen atom;
$R^{c1}$ and $R^e$, in the formula (B.1), independently from each other are selected from $C_1$-$C_{23}$-alkyl, where the sum of the carbon atoms of the $R^{c1}$ and $R^e$ radicals is an integer from 2 to 23;
$R^f$, $R^g$ and $R^h$, in the formula (B.2) are independently selected from $C_1$— to $C_{200}$-alkyl, where the sum of the carbon atoms of the $R^f$, $R^g$ and $R^h$ radicals is an integer from 3 to 23.

Preferred radicals of formula (B.1) are: 1-methylethyl, 1-methylpropyl, 1-methylbutyl, 1-methylpentyl, 1-methylhexyl, 1-methylheptyl, 1-methyloctyl, 1-ethylpropyl, 1-ethylbutyl, 1-ethylpentyl, 1-ethylhexyl, 1-ethylheptyl, 1-ethyloctyl, 1-propylbutyl, 1-propylpentyl, 1-propylhexyl, 1-propylheptyl, 1-propyloctyl, 1-butylpentyl, 1-butylhexyl, 1-butylheptyl, 1-butyloctyl, 1-pentylhexyl, 1-pentylheptyl, 1-pentyloctyl, 1-hexylheptyl, 1-hexyloctyl, 1-heptyloctyl.

A particularly preferred radical of formula (B.2) is tert.-butyl.

Likewise especially, $R^{46}$ is a radical of formula (C.1), a radical of formula (C.2) or a radical of formula (C.3)

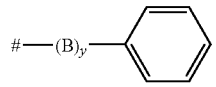

(C.1)

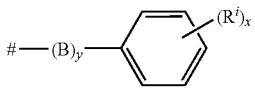

(C.2)

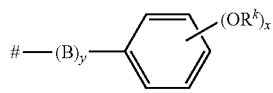

(C.3)

where
# represents the bonding side to the nitrogen atom;
B where present, is a $C_1$-$C_{10}$-alkylene group which may be interrupted by one or more nonadjacent groups selected from —O— and —S—;
y is 0 or 1,
$R^i$ is independently of one another selected from $C_1$-$C_{24}$-alkyl, $C_1$-$C_{24}$-fluoroalkyl, fluorine, chlorine or bromine;
$R^k$ is independently of one another selected from $C_1$-$C_{24}$-alkyl;
x in formulae C.2 and C.3 is 1, 2, 3, 4 or 5.

Preferably, y is 0, i.e. the variable B is absent.

Irrespectively of its occurrence, $R^1$ is preferably selected from $C_1$-$C_{24}$-alkyl, more preferably linear $C_1$-$C_{10}$-alkyl or branched $C_3$-$C_{10}$-alkyl, especially isopropyl. Irrespectively of its occurrence, $R^k$ is preferably selected from $C_1$-$C_{24}$- alkyl, more preferably linear $C_1$-$C_{10}$-alkyl or branched $C_3$-$C_{10}$-alkyl. The variable x in formulae C.2 and C.3 is preferably 1, 2 or 3.

A special group of embodiments relates to compounds of formula (IV-A.2), wherein the variables m4, $X^{40}$, $R^{41}$, $R^{42}$, $R^{43}$, $R^{44}$, and $R^{45}$ independently of each other or in particular in combination, have the following meanings:

$X^{40}$ is O or S;

$R^{42}$ and $R^{44}$ are each cyano;

$R^{43}$ and $R^{45}$ are each hydrogen or one of $R^{43}$ and $R^{45}$ is bromine and the other of $R^{43}$ and $R^{45}$ is hydrogen;

$R^{41}$ is selected from cyano, bromine, and phenyl which is unsubstituted or carries 1 or 2 radicals selected from $C_1$-$C_4$-alkyl;

$R^{46}$ is selected from hydrogen, $C_1$-$C_{24}$-linear alkyl, branched $C_3$-$C_{24}$-alkyl, a radical of formula (C.1), a radical of formula (C.2) and a radical of formula (C.3);

m4 is 0 or 1.

Even more preferably, $X^{40}$ is O or S;

$R^{42}$ and $R^{44}$ are each cyano;

$R^{43}$ and $R^{45}$ are each hydrogen;

$R^{41}$ is selected from cyano, bromine or phenyl which is unsubstituted or carries 1 or 2 radicals selected from $C_1$-$C_4$-alkyl; especially cyano;

$R^{46}$ is selected from linear $C_1$-$C_{24}$-alkyl, branched $C_3$-$C_{24}$-alkyl, a radical of formula (C.1), a radical of formula (C.2) or a radical of formula (C.3); especially linear $C_1$-$C_{24}$-alkyl, branched $C_3$-$C_{24}$-alkyl, or phenyl which carries 1 or 2 radicals selected from $C_1$-$C_4$-alkyl such as 2,6-diisopropylphenyl;

m4 is 0 or 1.

Examples for preferred compounds of formula (IV-A.2) are shown below:

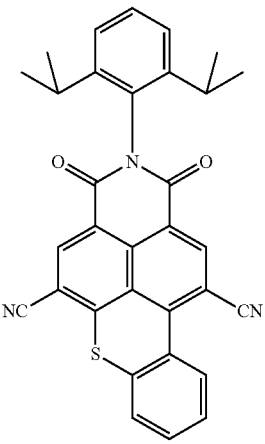

(IV-A.2-2)

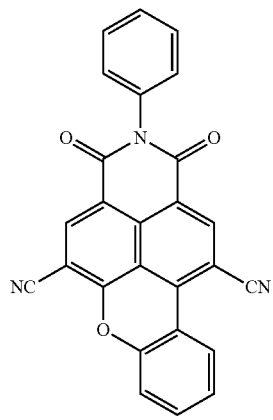

(IV-A.2-3)

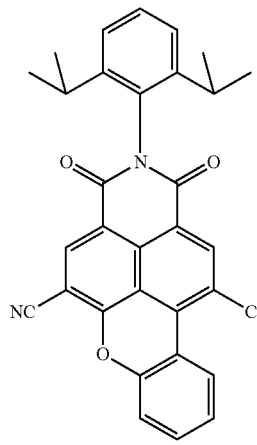

(IV-A.2-1)

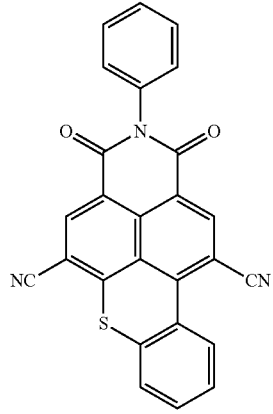

(IV-A.2-4)

-continued
(IV-A.2-5)
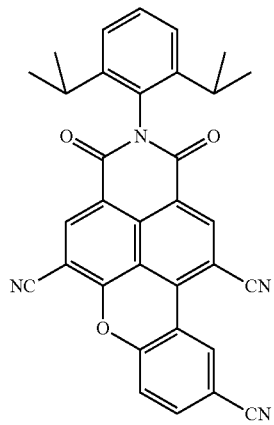
(IV-A.2-6)
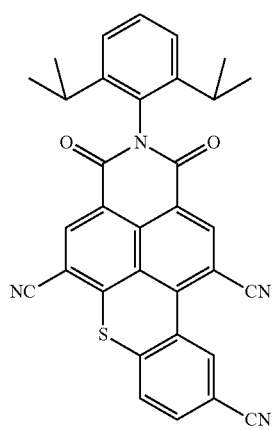
(IV-A.2-7)
-continued
(IV-A.2-8)
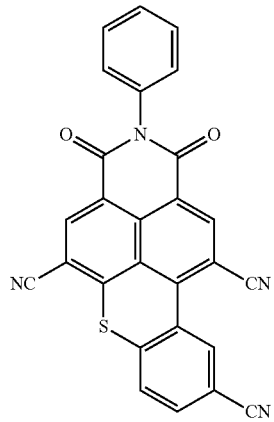
(IV-A.2-9)
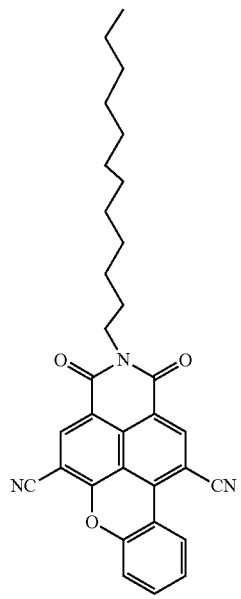
(IV-A.2-10)
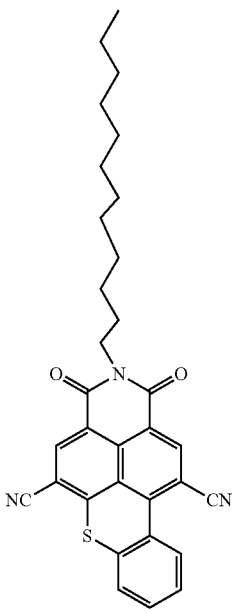

(IV-A.2-11)
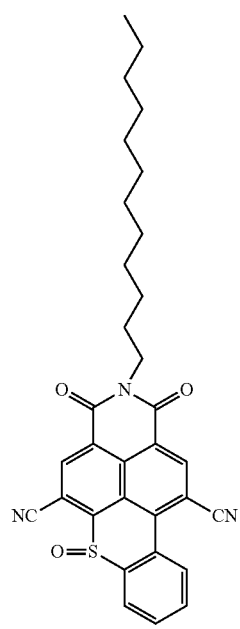
(IV-A.2-12)
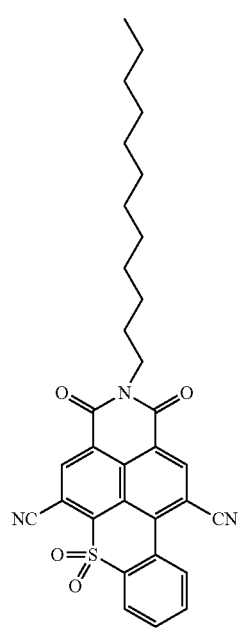
(IV-A.2-13)
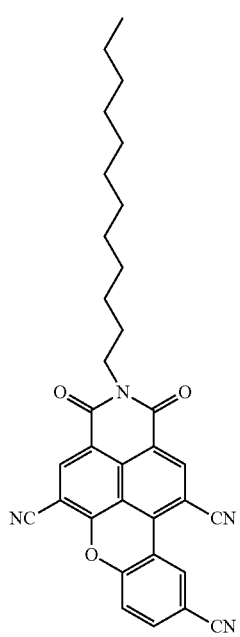
(IV-A.2-14)
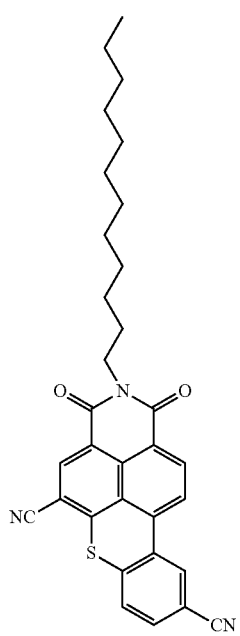

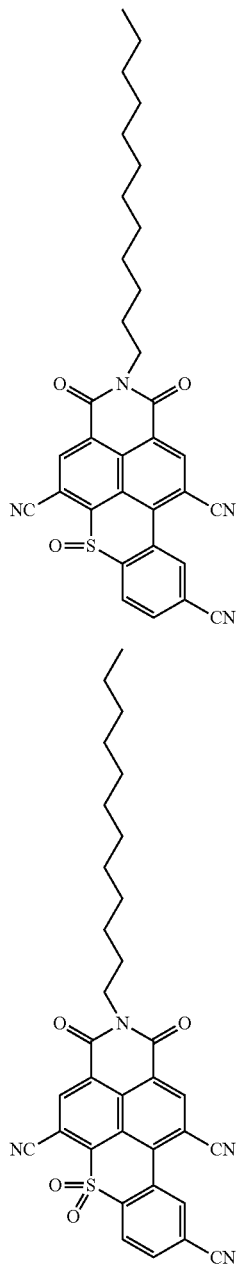

(IV-A.2-15)

(IV-A.2-16)

In particular, organic fluorescent colorant (B4) is selected from compounds IV-A.2-1, IV-A.2-6 or IV-A.2-9.

Organic Fluorescent Colorant (B5)

Benzoxanthene compounds of formula (V) are known from WO 2014/131628. They are usually yellow fluorescent. They are usually yellow or yellow-green fluorescent dyes. Benzothioxanthene compounds of formula (V) are known for example from U.S. Pat. No. 3,357,985.

Preferred are benzoxanthene compounds of formula (V), wherein $R^{51}$ is phenyl which is unsubstituted or carries 1 or 2 substituents selected from $C_1$-$C_{10}$-alkyl, $R^{53}$ and $R^{54}$ are each phenyl and $R^{52}$, $R^{55}$, $R^{56}$, $R^{57}$, $R^{58}$ and $R^{59}$ are each hydrogen. Suitable compounds are depicted in FIG. 2A, FIG. 2B and FIG. 2C of WO 2014/131628.

Preferred are also benz(othi)oxanthene compounds of formula (V), wherein $X^5$ is O or S, $R^{51}$ is $C_1$-$C_{24}$-alkyl and $R^{52}$ to $R^{59}$ are hydrogen. Preferably, $R^{51}$ is $C_6$-$C_{20}$-alkyl.

Suitable compounds are depicted below

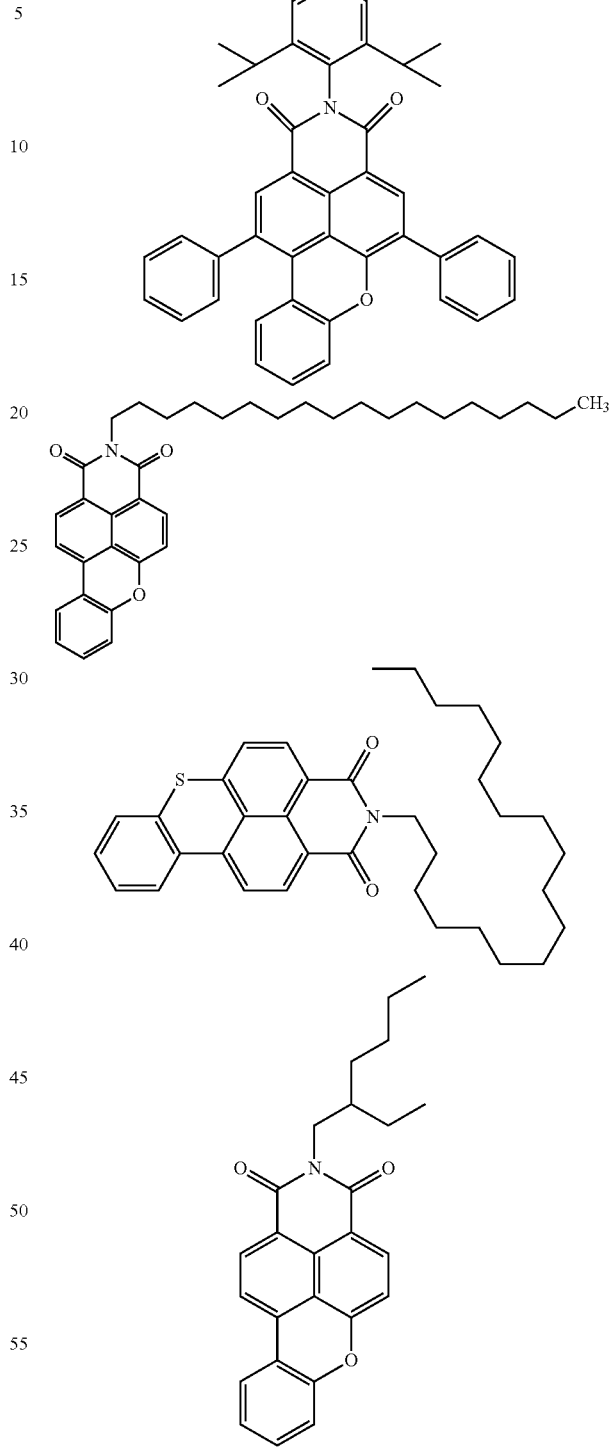

Organic Fluorescent Colorant (B6)

Benzimidazoxanthenisoquinoline compounds of formula (VIA) and (VIB) are known from WO 2015/062916. Suitable compounds are depicted at page 3, line 24 to page 8, line 24, especially FIG. 3A, FIG. 3B, FIG. 3C of WO 2015/062916.

Organic Fluorescent Colorant (B7)

Compounds having a structural unit of formula (VII) are known from WO 2012/168395. In general, they are yellow fluorescent dyes. With regard to the use in the frequency converter of the present invention, the compound having a structural unit of formula (VII) is preferably a compound as specified in WO 2012/168395, at page 28, line 14 to page 32, line 5.

With regard to the use in the frequency converter of the present invention, the compound having a structural unit of formula (VII) is more preferably selected from compounds of formulae (VII-1), (VII-2), (VII-3), (VII-4), (VII-5), (VII-6), (VII-7), (VII-8), (VII-9), (VII-10), (VII-11), (VII-12), (VII-13), (VII-14), (VII-15), (VII-16), (VII-17), (VII-18), (VII-19), (VII-20), (VII-21), (VII-22), (VII-23), (VII-24), (VII-25), (VII-26), (VII-27), (VII-28), (VII-29), (VII-30), (VII-31), (VII-32), (VII-33), (VII-34), (VII-35), (VII-36), (VII-37), (VII-38), (VII-39), (VII-40), (VII-41), (VII-42), (VII-43), (VII-44), (VII-45), (VII-46), (VII-47), (VII-48), (VII-49), (VII-50), (VII-51), (VII-52), (VII-53), (VII-54), (VII-55), or mixtures thereof (VII-1)

(VII-2)

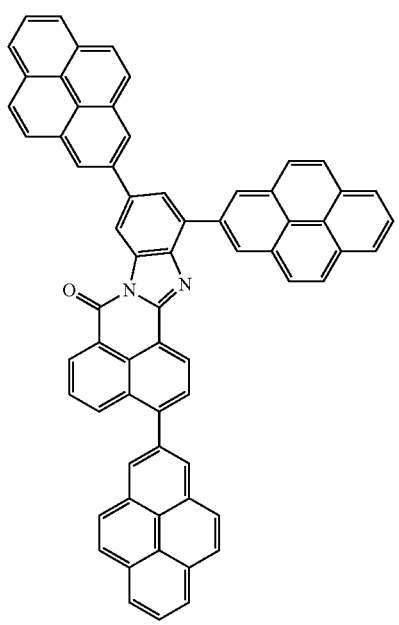

(VII-3)

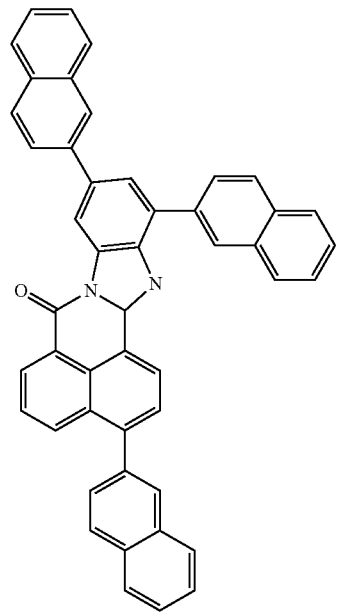

(VII-4)

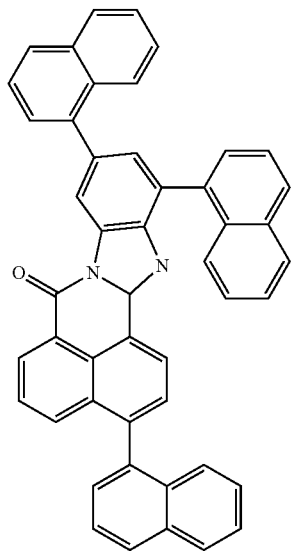

(VII-5)
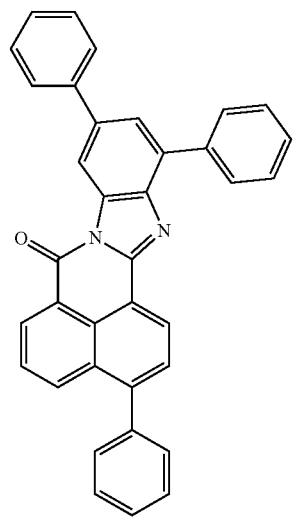
(VII-6)
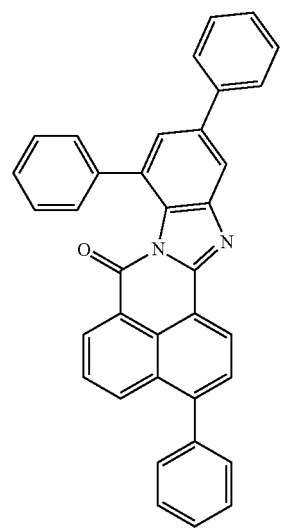
(VII-7)
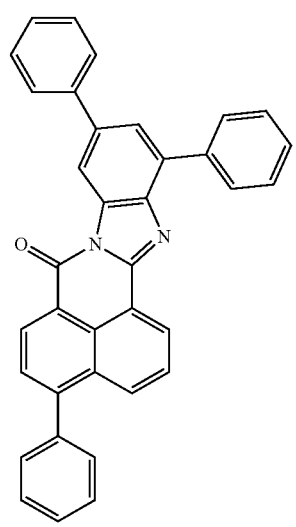
(VII-8)
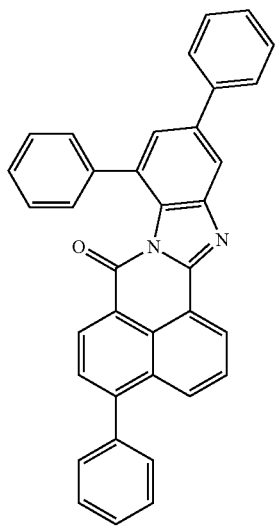
(VII-9)
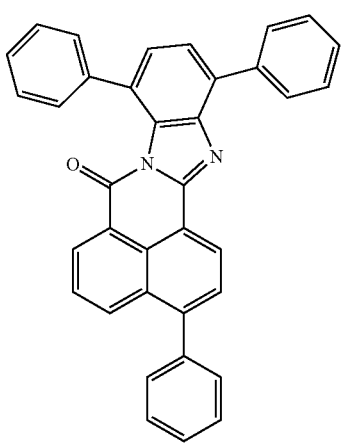
(VII-10)
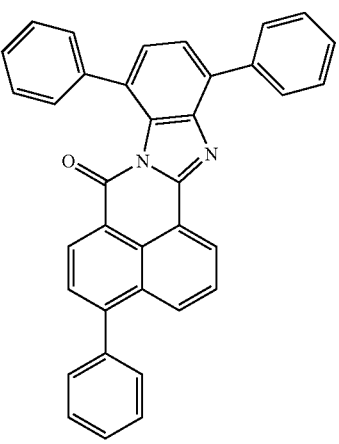

(VII-11)
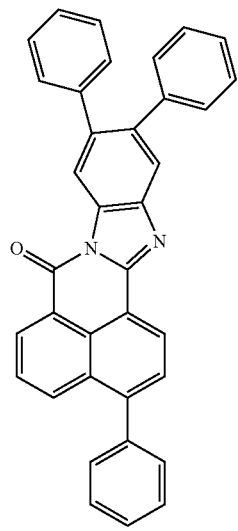
(VII-12)
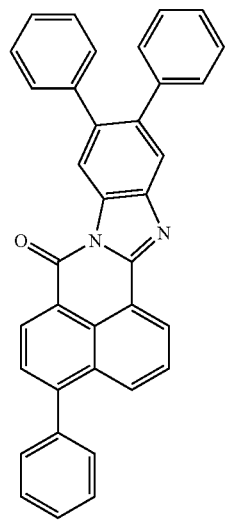
(VII-13)
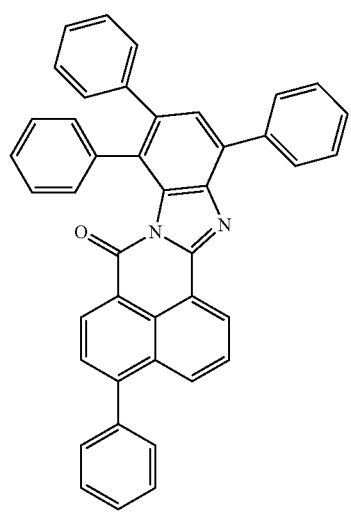
(VII-14)
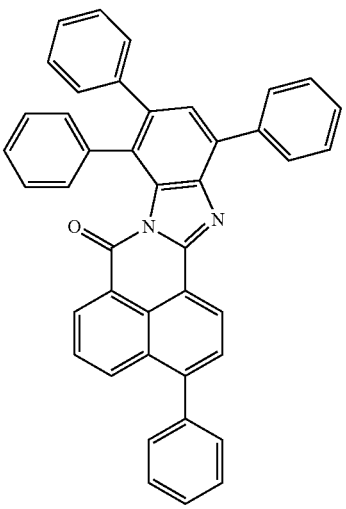
(VII-15)
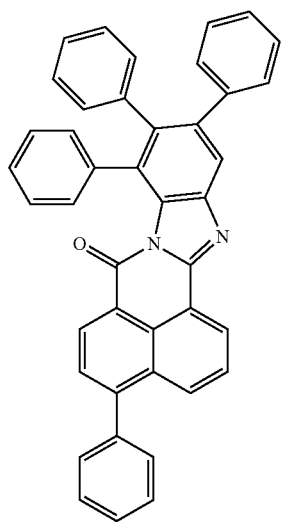
(VII-16)
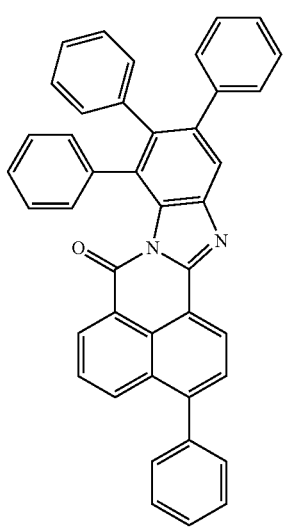

-continued
(VII-17)
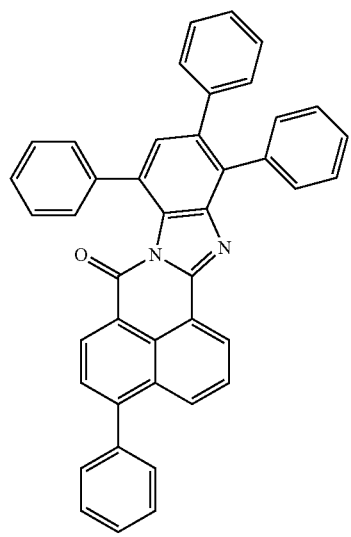
(VII-18)
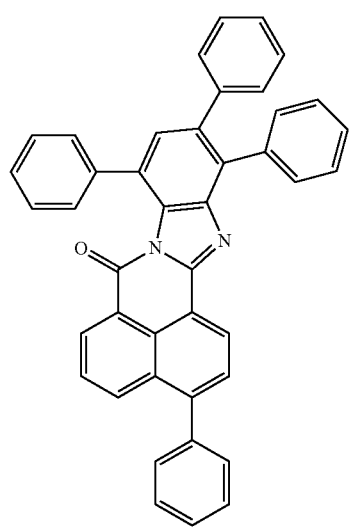
(VII-19)
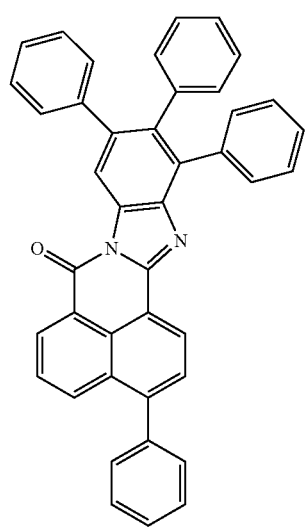
(VII-20)
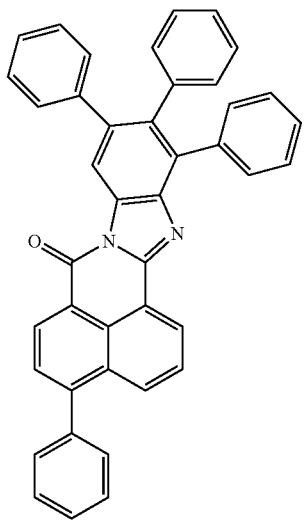
(VII-21)
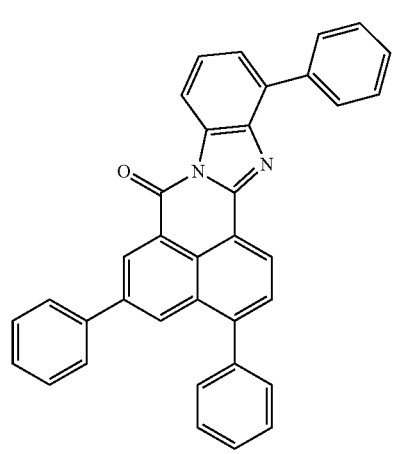
(VII-22)
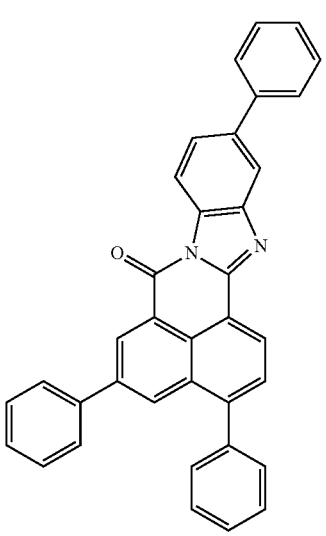

-continued
(VII-23)
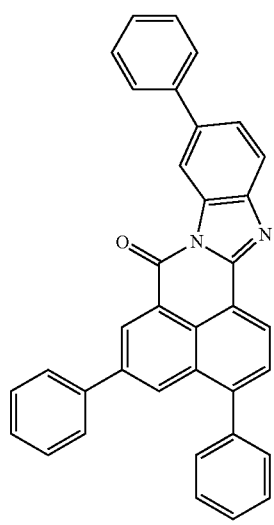
(VII-24)
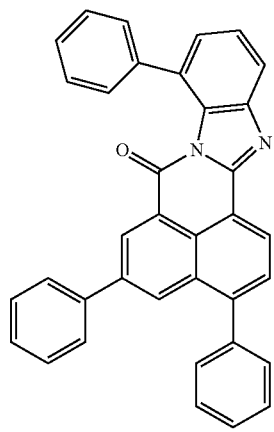
(VII-25)
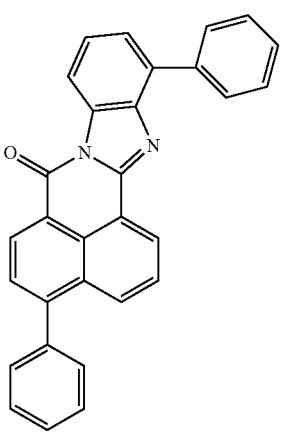
(VII-26)
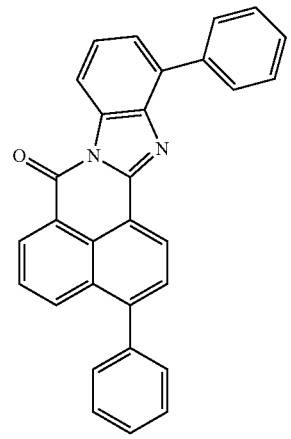
(VII-27)
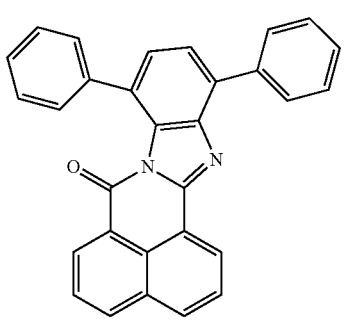
(VII-28)
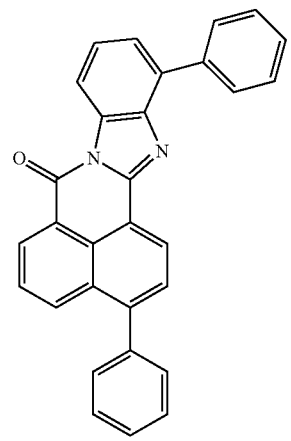
(VII-29)
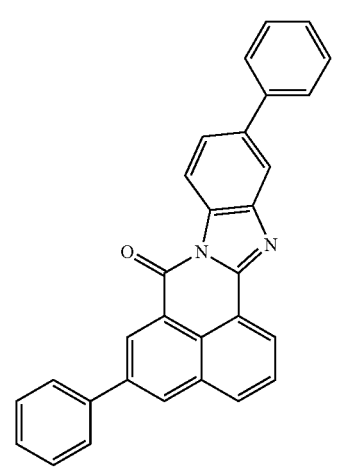

(VII-30)
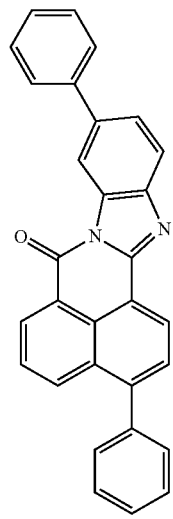
(VII-31)
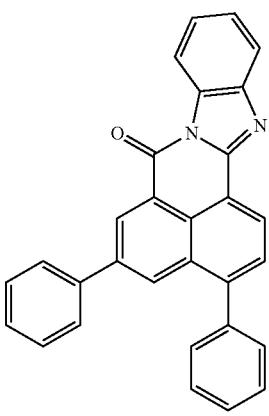
(VII-32)
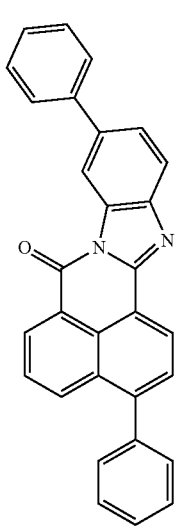
(VII-33)
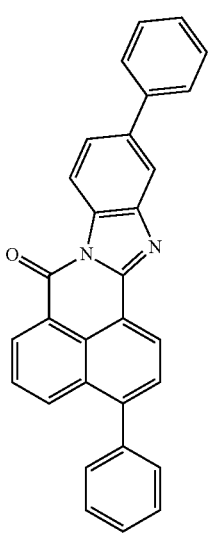
(VII-34)
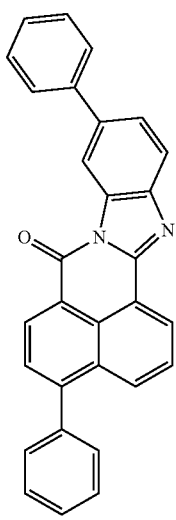
(VII-35)
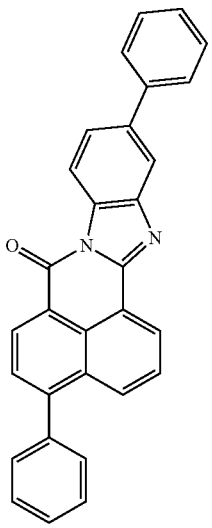

(VII-36) 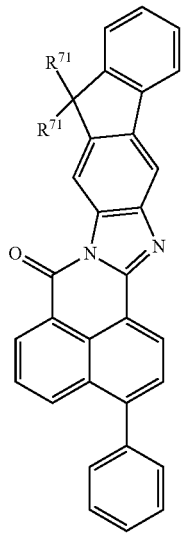
(VII-37) 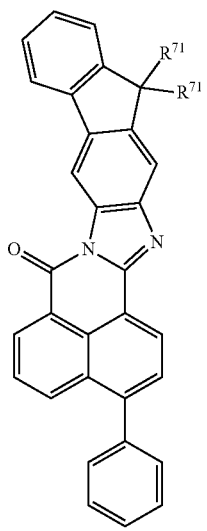
(VII-38) 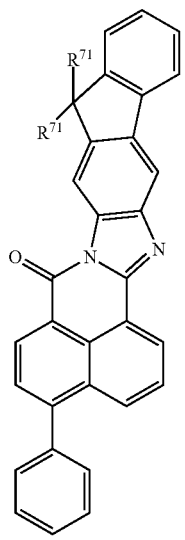
(VII-39) 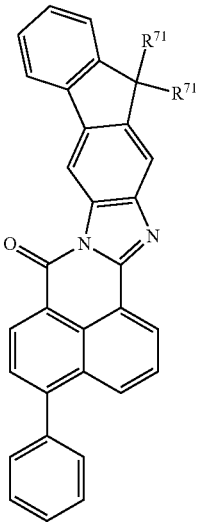
(VII-40) 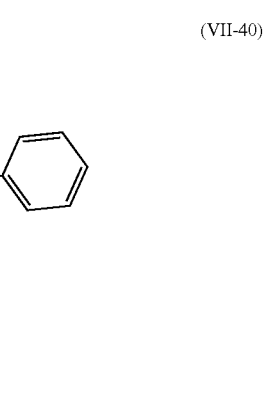
(VII-41) 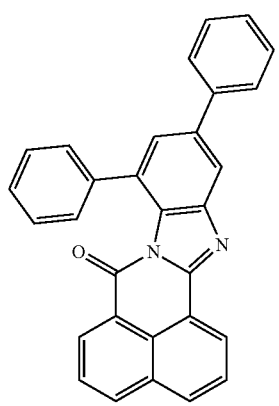

(VII-42)
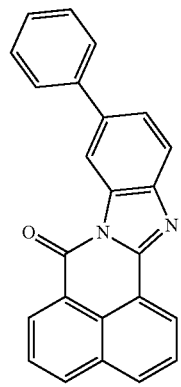
(VII-43)
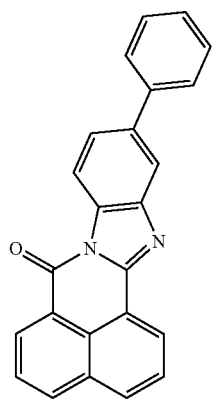
(VII-44)
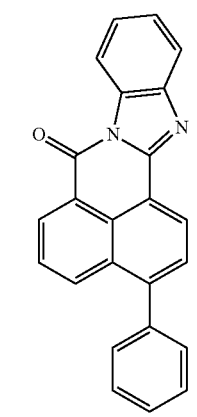
(VII-45)
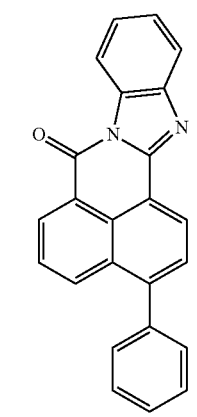
(VII-46)
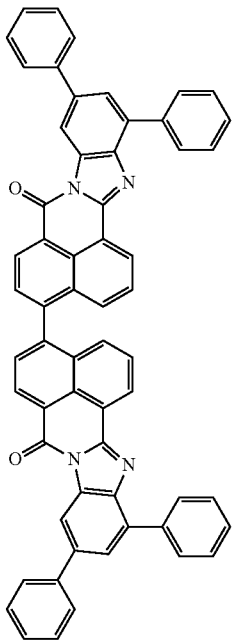
(VII-47)
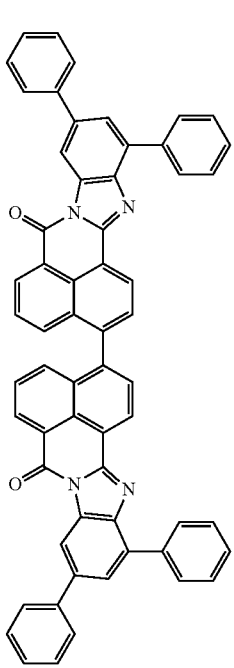

-continued
(VII-48)
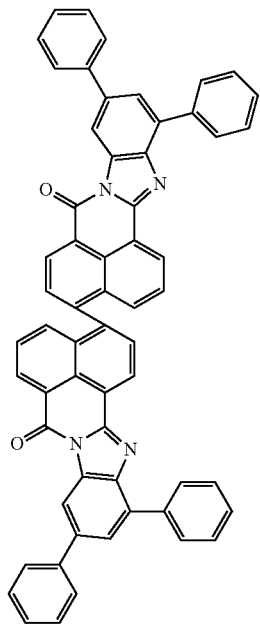
(VII-49)
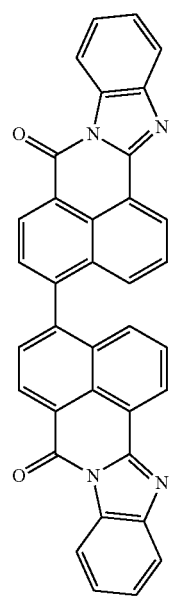
-continued
(VII-50)
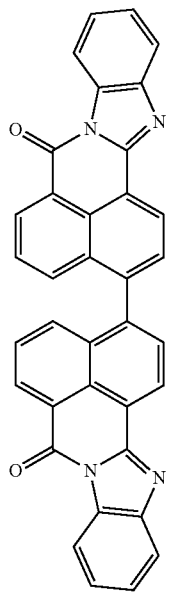
(VII-51)
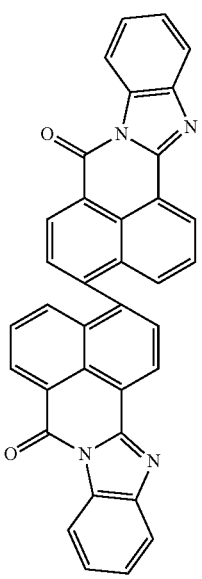
(VII-52)

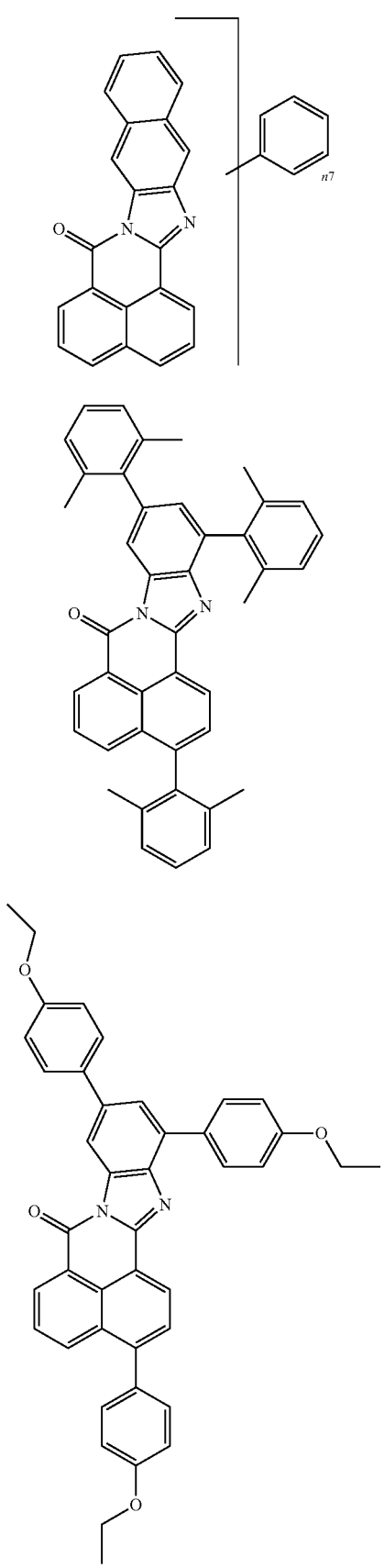
(VII-53)
(VII-54)
(VII-55)
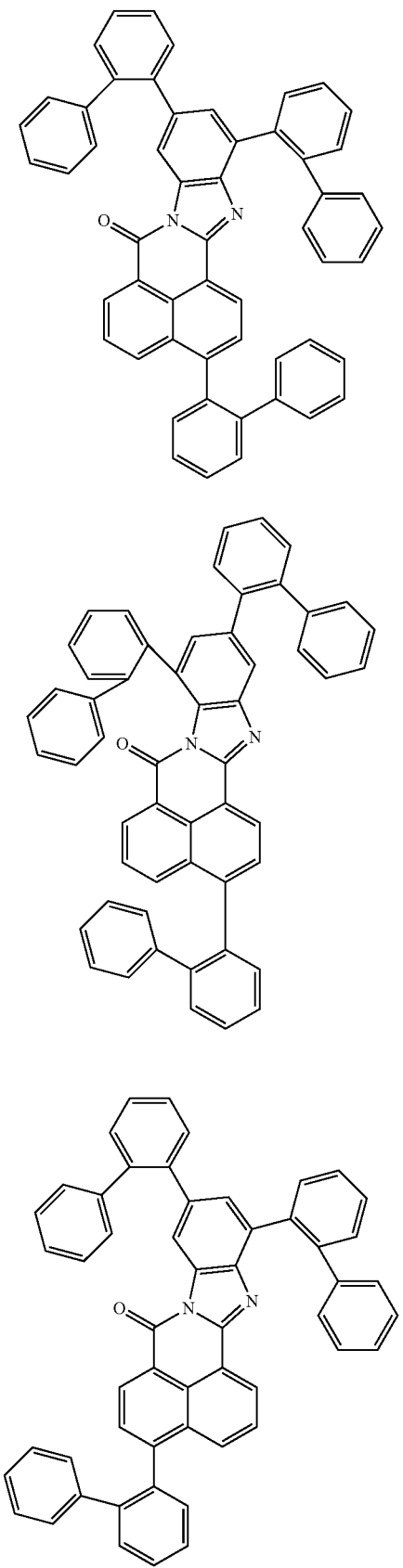
(VII-56)
(VII-57)
(VII-58)

(VII-59)

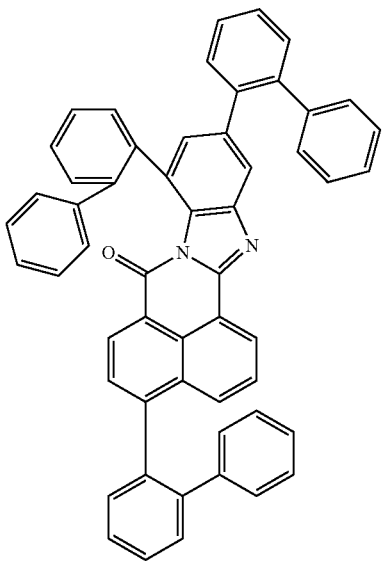

where
n7 is a number from 0, 1, 2, 3, 4, 5, 6, 7, 8, 9 or 10;
$R^{71}$ is independently hydrogen, $C_1$-$C_{18}$-alkyl or cycloalkyl, the carbon chain of which may comprise one or more —O—, —S—, —CO—, —SO— and/or —SO$_2$— moieties and which may be mono- or polysubstituted;
aryl or heteroaryl which may be mono- or polysubstituted.

Especially preferred are the compounds of formulae (VII-5), (VII-6), (VII-7) and (VII-8) and mixtures thereof. Especially preferred are also the compounds of formulae (VII-56), (VII-57), (VII-58) and (VII-59) and mixtures thereof.

Organic Fluorescent Colorant (B8)

Perylene imide compounds of formula (VIII) and (IX) are well known in the art, e.g. from WO 2007/006717 or U.S. Pat. No. 6,472,050. 9-Cyano substituted perylene-3,4-dicarboxylic acid monoimides of formula (IX) are also known from WO 2004/029028. They are usually orange fluorescent dyes.

Preferably, in compounds of the formula (VIII), $R^{81}$ and $R^{82}$ are a linear or branched $C_1$-$C_{18}$ alkyl radical, a $C_4$-$C_8$ cycloalkyl radical which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl.

Preferably, $R^{81}$ and $R^{82}$ have the same meaning.

In one embodiment, $R^{81}$ and $R^{82}$ in formula VIII represent compounds with what is called swallowtail substitution, as specified in WO 2009/037283 A1 at page 16, line 19 to page 25, line 8. In a preferred embodiment, $R^{81}$ and $R^{82}$, independently of each other, are a 1-alkylalkyl, for example 1-ethylpropyl, 1-propylbutyl, 1-butylpentyl, 1-pentylhexyl or 1-hexylheptyl.

In a preferred embodiment, the organic fluorescent colorant (B8) is selected from compounds of formula (VIII-1)

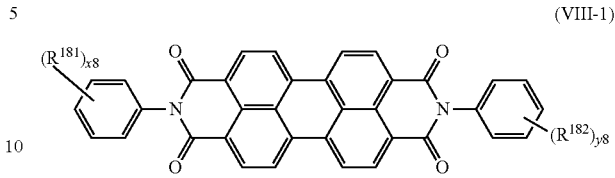

(VIII-1)

wherein
x8 is 1, 2 or 3;
y8 is 1, 2 or 3;
$R^{181}$ is $C_1$-$C_4$-alkyl; and
$R^{182}$ is $C_1$-$C_4$-alkyl.

Preferably, x8 is 2. Preferably, y8 is 2. Preferably, $R^{181}$ and $R^{182}$ are selected from isopropyl and tert-butyl.

A preferred compound of formula (VIII) is N,N'-bis(2,6-diisopropylphenyl)-3,4,9,10-perylenetetracarboxylic diimide (CAS-number: 82953-57-9).

Suitable 9-cyano substituted perylene-3,4-dicarboxylic acid monoimides of formula (IX) are preferably those, wherein $R^{92}$ is a linear or branched $C_1$-$C_{18}$ alkyl radical, a $C_4$-$C_8$ cycloalkyl radical which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl.

In one embodiment, $R^{92}$ in formula IX represents compounds with what is called swallowtail substitution, as specified in WO 2009/037283 A1 at page 16, line 19 to page 25, line 8. In a preferred embodiment, $R^{92}$, is a 1-alkylalkyl, for example 1-ethylpropyl, 1-propylbutyl, 1-butylpentyl, 1-pentylhexyl or 1-hexylheptyl.

In another preferred embodiment, $R^{92}$ is 2,4-di(tert-butyl)phenyl 2,6-diisopropylphenyl or 2,6-di(tert-butyl)phenyl. In particular, $R^{92}$ is 2,6-diisopropylphenyl.

Organic Fluorescent Colorant (B9)

4-Amino-substituted naphthalimide compounds of formula (X) are known in the art. Suitable 4-amino substituted naphthalimide compounds of formula (X) are preferably those, wherein $R^{101}$ is linear or branched $C_1$-$C_{10}$-alkyl, $C_2$-$C_{10}$-alkyl which is interrupted by one or more oxygen, or $C_3$-$C_8$-cycloalkyl. $R^{102}$ is preferably hydrogen. A suitable compound of formula (X) is 4-(butylamino)-N-butyl-1,8-naphthalimide (CAS Number: 19125-99-6). Likewise preferably, $R^{102}$ is linear or branched $C_1$-$C_{10}$-alkyl. The compounds of formula (X) can be synthesized in two steps. The first step may be the condensation of 4-chloro-1,8-naphthalic anhydride with amines in a solvent, such as 1,4-dioxane or 2-methoxyethanol under reflux yielding the corresponding 4-chloro-1,8-naphthalimides. The second step involves the substitution of the chlorine atom with aliphatic primary or secondary amines.

Organic Fluorescent Colorant (B10)

7-(Diethylamino)-3-(5-methylbenzo[d]oxazol-2-yl)-2H-chromen-2-one is also known as Disperse Yellow (CAS Registry no. 34564-13-1).

Organic Fluorescent Colorant (B11)

Compounds of formulae (XIA) and (XIB) are known from U.S. Pat. No. 5,470,502. They are usually yellow fluorescent dyes. Preferred are compounds of formulae (XIA) and (XIB), wherein $R^{111}$ is linear $C_1$-$C_{10}$-alkyl or branched $C_3$-$C_{10}$-alkyl. Preferred examples are diisobutyl-3,9-perylenedicarboxylate, diisobutyl-3,10-perylenedicarboxylate and mixtures thereof. Especially preferred is a mixture of diisobutyl-3,9-perylenedicarboxylate and diisobutyl-3,10-perylenedicarboxylate.

Organic Fluorescent Colorant (B12)

Compounds of formulae (XIIA) and (XIIB) are known from U.S. Pat. No. 5,470,502. They are usually yellow fluorescent dyes. Preferred are compounds of formulae (XIIA) and (XIIB), wherein $R^{121}$ is linear $C_1$-$C_{10}$-alkyl or branched $C_3$-$C_{10}$-alkyl. Preferred examples are diisobutyl-4,10-dicyanoperylene-3,9-dicarboxylate and diisobutyl-4,9-dicyanoperylene-3,10-dicarboxylate and mixtures thereof. Especially preferred is a mixture of diisobutyl-4,10-dicyanoperylene-3,9-dicarboxylate and diisobutyl-4,9-dicyanoperylene-3,10-dicarboxylate.

Organic Fluorescent Colorant (B13)

Suitable examples of compounds of formula (XIII) are for example the perylene derivatives specified in WO 2007/006717, especially at page 1, line 5 to page 22, line 6; in U.S. Pat. No. 4,845,223, especially col. 2, line 54 to col. 6, line 54; in WO 2014/122549, especially at page 3, line 20 to page 9, line 11; in EP 3072887 and in at the priority date unpublished EP 16192617.5, especially at page 35, line 34 to page 37, line 29. The compounds of formula (XIII) are usually orange or red fluorescent colorants. Preferred are compounds of formula (XIII), wherein $R^{131}$ and $R^{132}$ are each independently selected from $C_1$-$C_{10}$-alkyl, 2,6-di($C_1$-$C_{10}$-alkyl)aryl and 2,4-di($C_1$-$C_{10}$-alkyl)aryl. More preferably, $R^{131}$ and $R^{132}$ are identical. Very particularly, $R^{131}$ and $R^{132}$ are each 2,6-diisopropylphenyl or 2,4-di-tert-butylphenyl. $R^{133}$ is preferably phenoxy, which is unsubstituted or substituted by 1 or 2 identical or different substituents selected from fluorine, chlorine, $C_1$-$C_{10}$-alkyl and phenyl. Preferably, $p_{13}$ is 2, 3 or 4, in particular 2 or 4.

The compounds of formula (XIII) can be prepared in analogy to the methods described for example in WO 2007/006717, U.S. Pat. No. 4,845,223, EP 3072887 and WO 2014/122549.

Suitable organic fluorescent colorants B13 are, for example, N,N'-bis(2,6-diisopropylphenyl)-1,6,7,12-tetraphenoxyperylene-3,4:9,10-tetracarboximide, N, N'-bis(2,6-diisopropylphenyl)-1,7-di(2,6-diisopropylphenoxy) perylene-3,4:9,10-tetracarboximide, N,N'-bis(2,6-diisopropylphenyl)-1,6-di(2,6-diisopropylphenoxy) perylene-3,4:9,10-tetracarboximide, N,N'-bis(2,6-diisopropylphenyl)-1,7-di(p-tert-octylphenoxy)perylene-3,4; 9,10-tetracarboximide, N,N'-bis(2,6-diisopropylphenyl)-1,7-diphenoxyperylene-3,4; 9,10-tetracarboximide, N, N'-bis(2,6-diisopropylphenyl)-1,7-di(2,6-diphenylphenoxy) perylene-3,4; 9,10-tetracarboximide, N,N'-bis(2,6-diisopropylphenyl)-1,6-di(2,6-diphenylphenoxy)perylene-3,4; 9,10-tetracarboximide, N,N'-bis(2,6-diisopropylphenyl)-1,6,7,12-tetra(2-phenylphenoxy)perylene-3,4:9,10-tetracarboximide, N,N'-bis(2,6-diisopropylphenyl)-1,7-di(2,3-difluorophenoxy)perylene-3,4:9,10-tetracarboximide, N,N'-bis(2,6-diisopropylphenyl)-1,6,7,12-tetra(2,3-difluorophenoxy)perylene-3,4:9,10-tetracarboximide, N,N'-bis(2,6-diisopropylphenyl)-1,6,7,12-tetra(3-fluorophenoxy) perylene-3,4:9,10-tetracarboximide, N,N'-bis(2,6-diisopropylphenyl)-1,6,7,12-tetra(2,6-difluorophenoxy) perylene-3,4:9,10-tetracarboximide, N,N'-bis(2,6-diisopropylphenyl)-1,6,7,12-tetra(2,5-difluorophenoxy) perylene-3,4:9,10-tetracarboximide, N,N'-bis(2,6-diisopropylphenyl)-1,6,7,12-tetra(2,3-dichlorophenoxy) perylene-3,4:9,10-tetracarboximide, N,N'-bis(2,6-diisopropylphenyl)-1,6,7,12-tetra(3-chlorophenoxy) perylene-3,4:9,10-tetracarboximide, N,N'-bis(2,6-diisopropylphenyl)-1,6,7,12-tetra(2,6-dichlorophenoxy) perylene-3,4:9,10-tetracarboximide, N,N'-bis(2,6-diisopropylphenyl)-1,6,7,12-tetra(2,5-dichlorophenoxy) perylene-3,4:9,10-tetracarboximide.

In particular, the organic fluorescent colorant (B13) is selected from compounds (XIII-1), (XIII-2), (XIII-3) and (XIII-4)

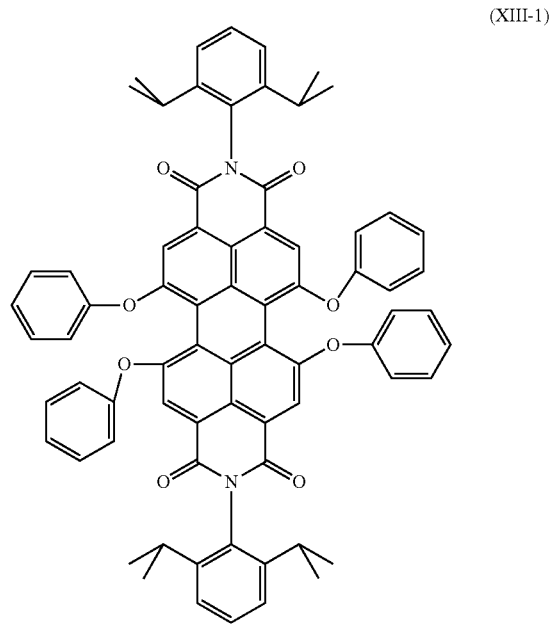

(XIII-1)

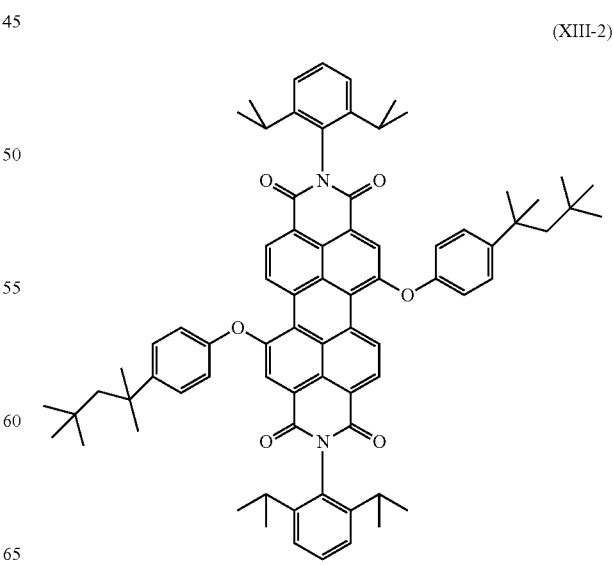

(XIII-2)

(XIII-3)

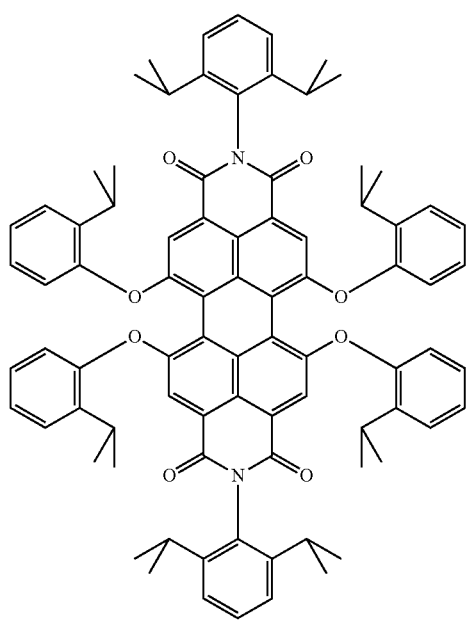

(XIII-4)

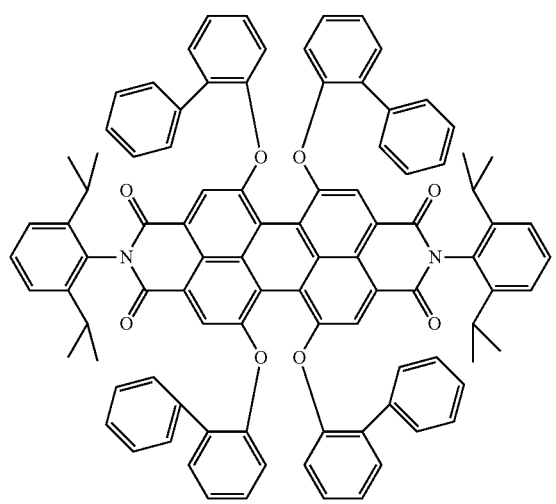

Organic Fluorescent Colorant (B14)

Compounds of formula (XIV) are subject matter of WO 2017/121833. Compounds of formula (XIV) are usually orange or red fluorescent colorants. Preference is given to compounds of formula (XIV), where $R^{141}$ and $R^{142}$ are, independently of each other, selected from phenyl which is unsubstituted or substituted by 1, 2 or 3 $C_1$-$C_6$-alkyl; and $R^{143}$, $R^{144}$, $R^{145}$, $R^{146}$, $R^{147}$, $R^{148}$, $R^{149}$, $R^{1410}$, $R^{1411}$, $R^{1412}$, $R^{1413}$, $R^{1414}$, $R^{1415}$, $R^{1416}$, $R^{1417}$ and $R^{1418}$ are each hydrogen. The compound of formula (XIV) as defined above is preferably

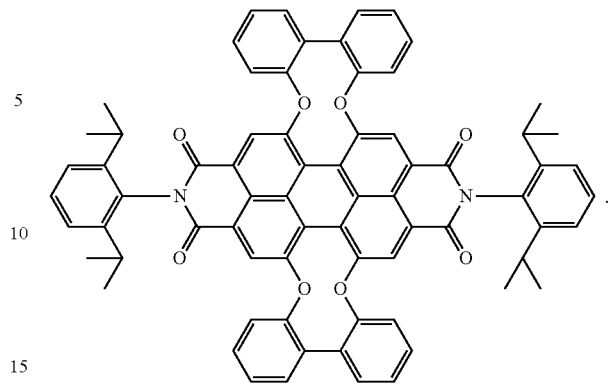

The compound of formula (XIV) can be prepared by reacting the appropriate chlorinated or brominated perylene bisimide of formula (XIVa)

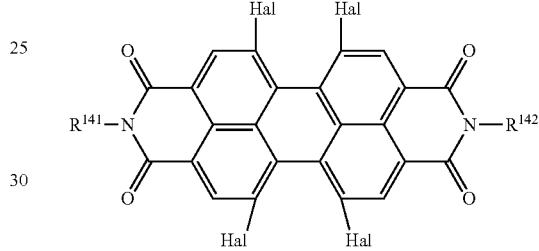

where

Hal is in each case bromine or in each case chlorine; and $R^{141}$ and $R^{142}$ are as defined above;

with a 2,2'-biphenol compound of formula (XIVb) and, if appropriate, a 2,2'-biphenol compound of formula (XIVc)

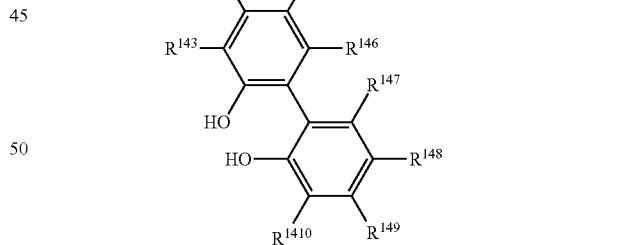

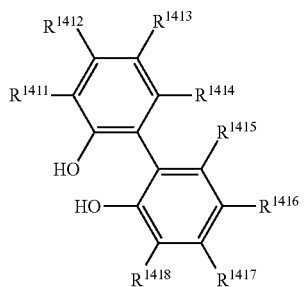

where
$R^{143}, R^{144}, R^{145}, R^{146}, R^{147}, R^{148}, R^{149}, R^{1410}, R^{1411}, R^{1412}, R^{1413}, R^{1414}, R^{1415}, R^{1416}, R^{1417}$ and $R^{1418}$ are as defined above.

The 2,2'-biphenol of formula (XIVc) may also be as defined for the 2,2'-biphenol of formula (XIVb) (if only one 2,2'-biphenol of formula (XIVb) is used for halogen replacement reaction).

Organic Fluorescent Colorant (B15)

Suitable examples of compounds of formula (XV) are, for example, the compounds as specified in WO 2016/026863, especially at page 6, line 32 to page 18, line 26. Especially preferred are the compounds 2455, 2452, 2517 and 2440 of WO 2016/026863. Suitable examples of compounds of formula (XV) are also the compounds as specified in EP 3101087, especially [0059] to [0078].

In particular, the organic fluorescent colorant (B15) is a compound of the formula (XV-1)

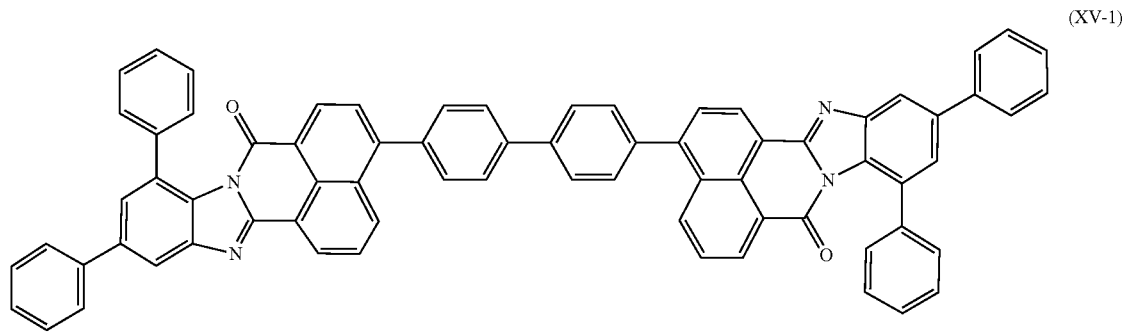 [SMILES: O=c1c2ccc(-c3ccc(-c4ccc(-c5ccc6c7c5cccc7c(=O)n5c6nc6cc(-c7ccccc7)cc(-c7ccccc7)c65)cc4)cc3)c3cccc(c32)c2nc3cc(-c4ccccc4)cc(-c4ccccc4)c3n12]

(XV-1)

Organic Fluorescent Colorant (B16)

In a first preferred embodiment, the organic fluorescent colorant (B16) is selected from compounds (XVI-1)

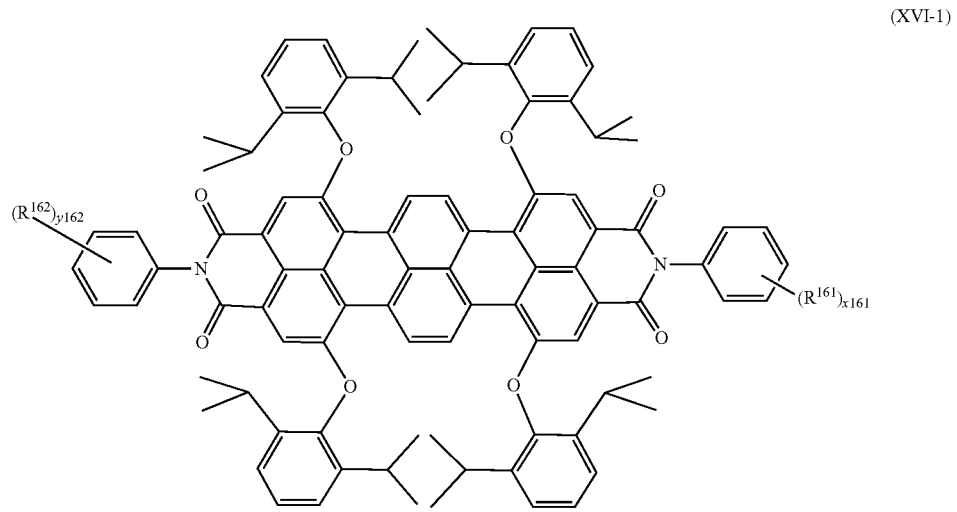

(XVI-1)

wherein
x161 is 1, 2 or 3;
y162 is 1, 2 or 3;
$R^{161}$ is $C_1$-$C_4$-alkyl; and
$R^{162}$ is $C_1$-$C_4$-alkyl.
Preferably, x161 is 2. Preferably, y162 is 2. Preferably, $R^{161}$ and $R^{162}$ are selected from isopropyl or tert-butyl.

In a further preferred embodiment, the organic fluorescent colorant (B16) is selected from compounds (XVI-2)

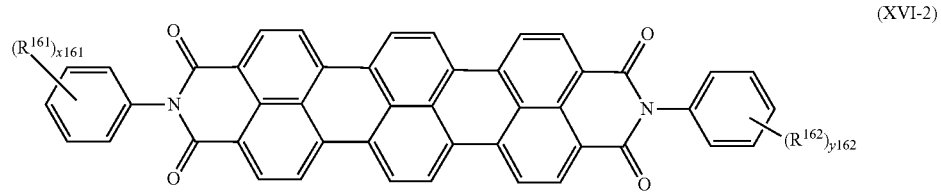

(XVI-2)

wherein
x161 is 1, 2 or 3;
y162 is 1, 2 or 3;
$R^{161}$ is $C_1$-$C_4$-alkyl; and
$R^{162}$ is $C_1$-$C_4$-alkyl.

Preferably, x161 is 2. Preferably, y162 is 2. Preferably, $R^{161}$ and $R^{162}$ are selected from isopropyl or tert-butyl.

The frequency converter may comprise a plurality of organic fluorescent colorants (B) as defined above, for example from 1, 2, 3, 4, 5, 6, 7, 8, 9, 10 or more than 10. Preferably, the frequency converter comprises organic fluorescent colorants (B) selected from at least two, for example two, three or four, different groups of organic fluorescent colorants (B1), (B2), (B3), (B4), (B5), (B6), (B7), (B8), (B9), (B10), (B11), (B12), (B13), (B14), (B15) or (B16), each colorant generating a different color, such that the mixed light, for example, generates white light having specific color temperature and/or color rendering index. More preferably, the frequency converter comprises at least two colorants B, for example two, three or four, selected from the groups B1, B2, B3, B4, B5, B7, B8, B11, B12, B13, B14, B15, B16 or mixtures thereof. Especially, the color converter comprises a combination of organic fluorescent colorants selected from a compound of group B7 and a compound of group B13

In particular, the organic fluorescent colorant B is selected from the following compounds or mixtures thereof:

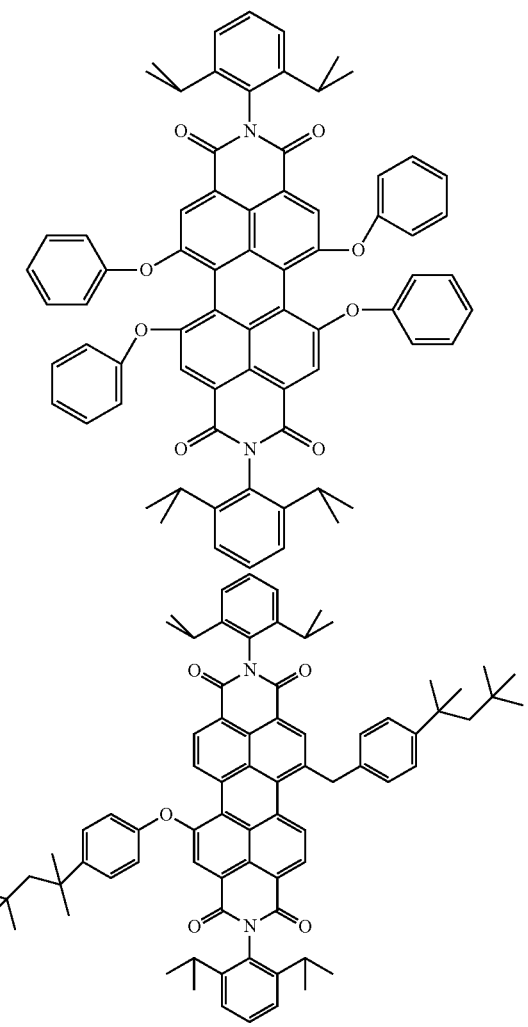

103
-continued
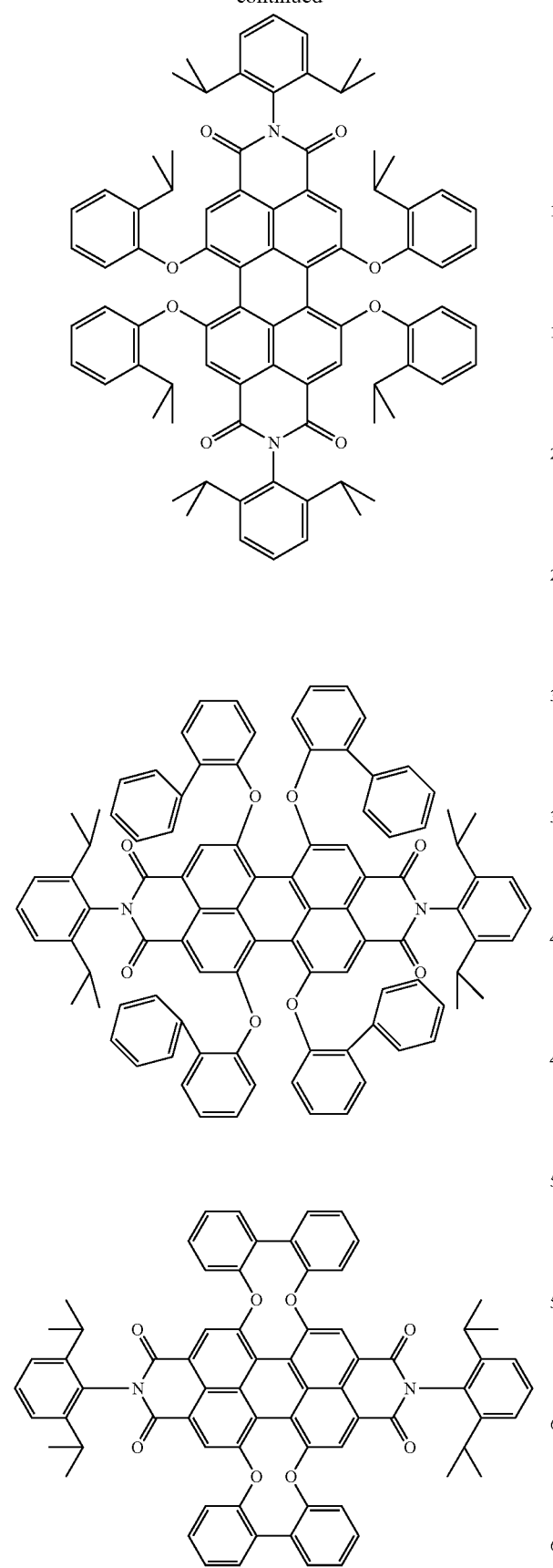
104
-continued
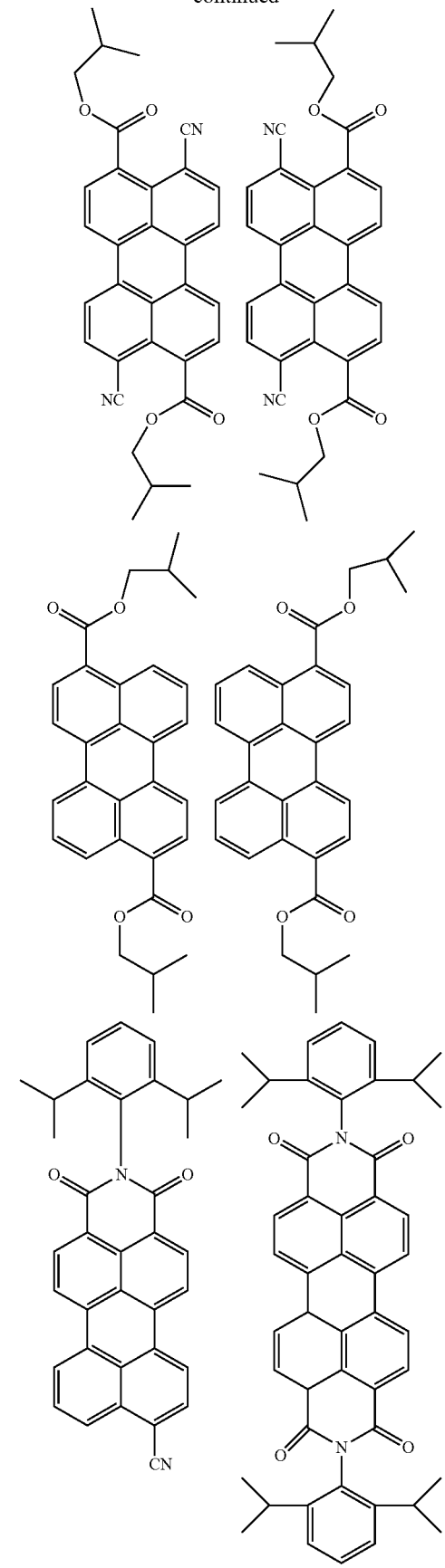

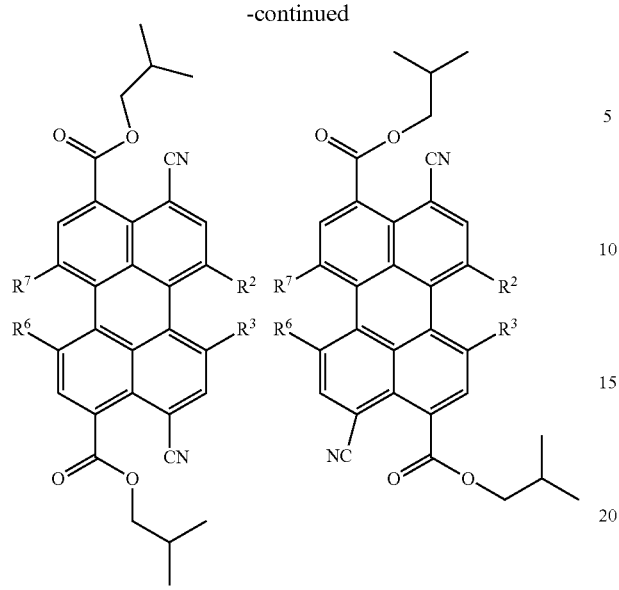
in which three of the $R^2$, $R^3$, $R^6$ and $R^7$ substituents are hydrogen and one of the $R^2$, $R^3$, $R^6$ and $R^7$ substituents is cyano;
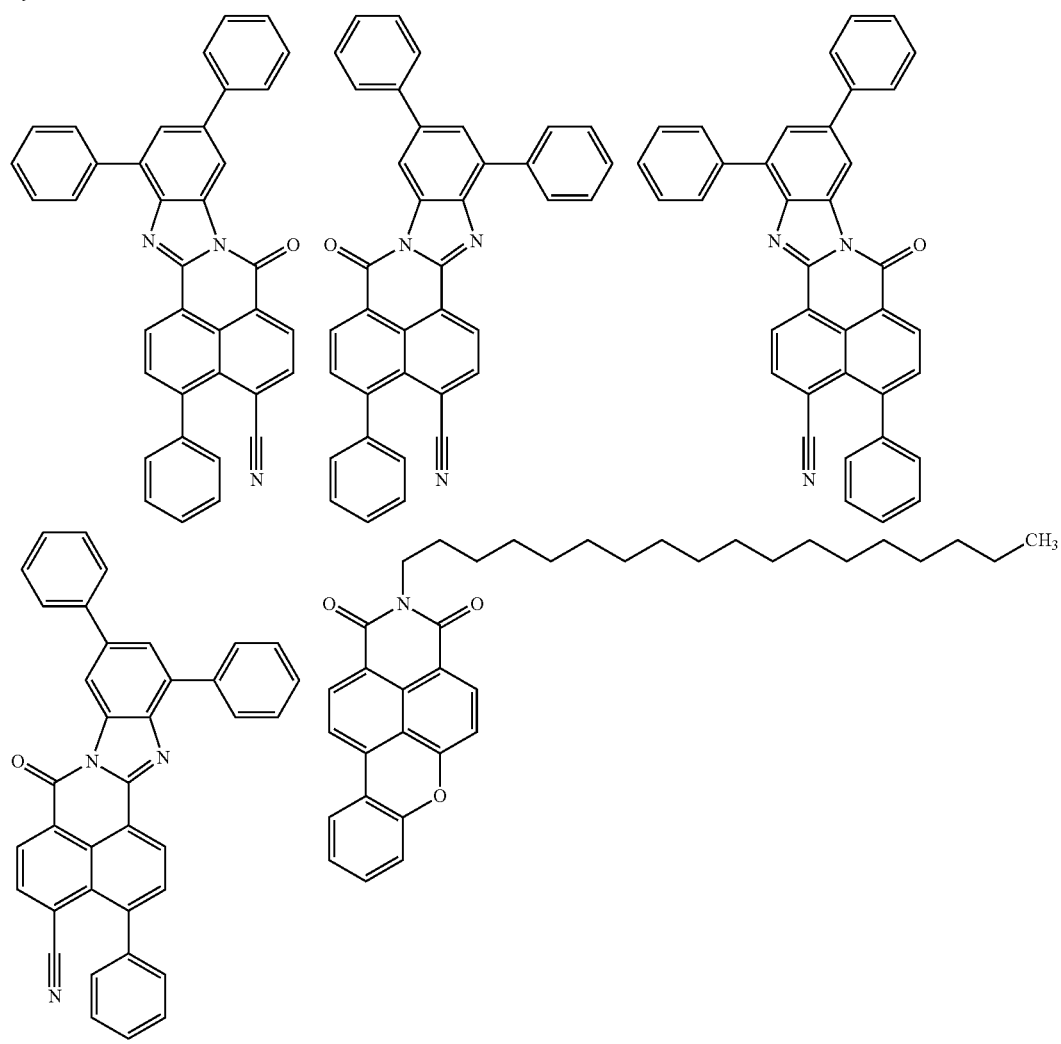

-continued
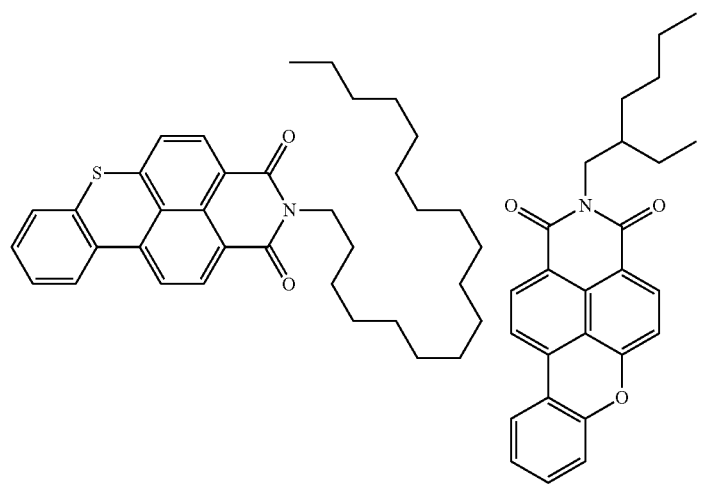
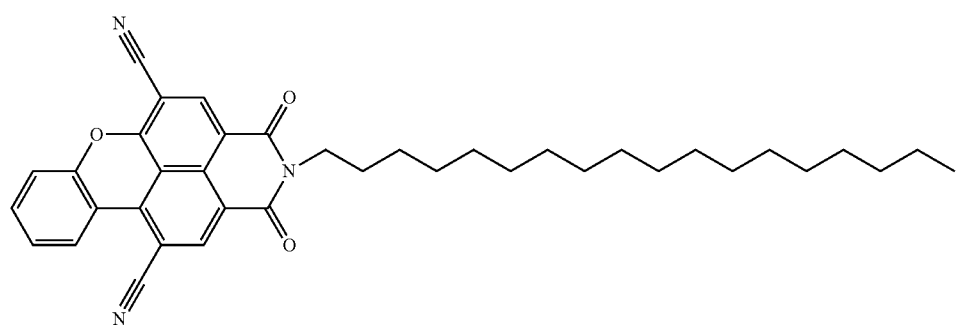
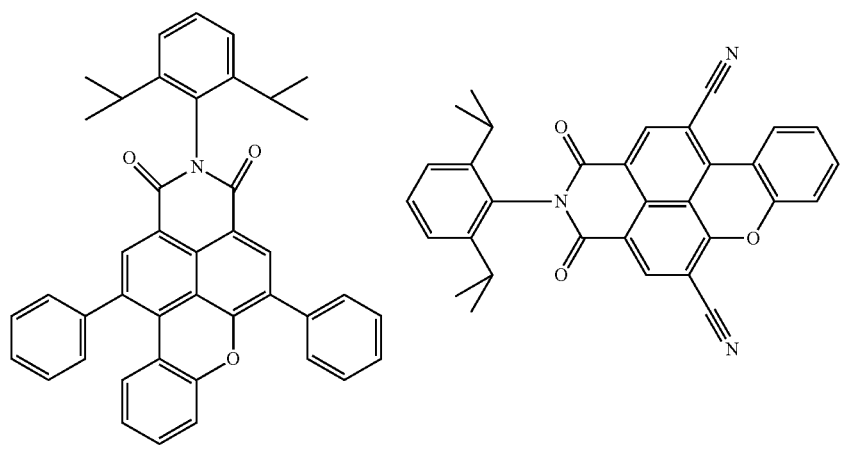

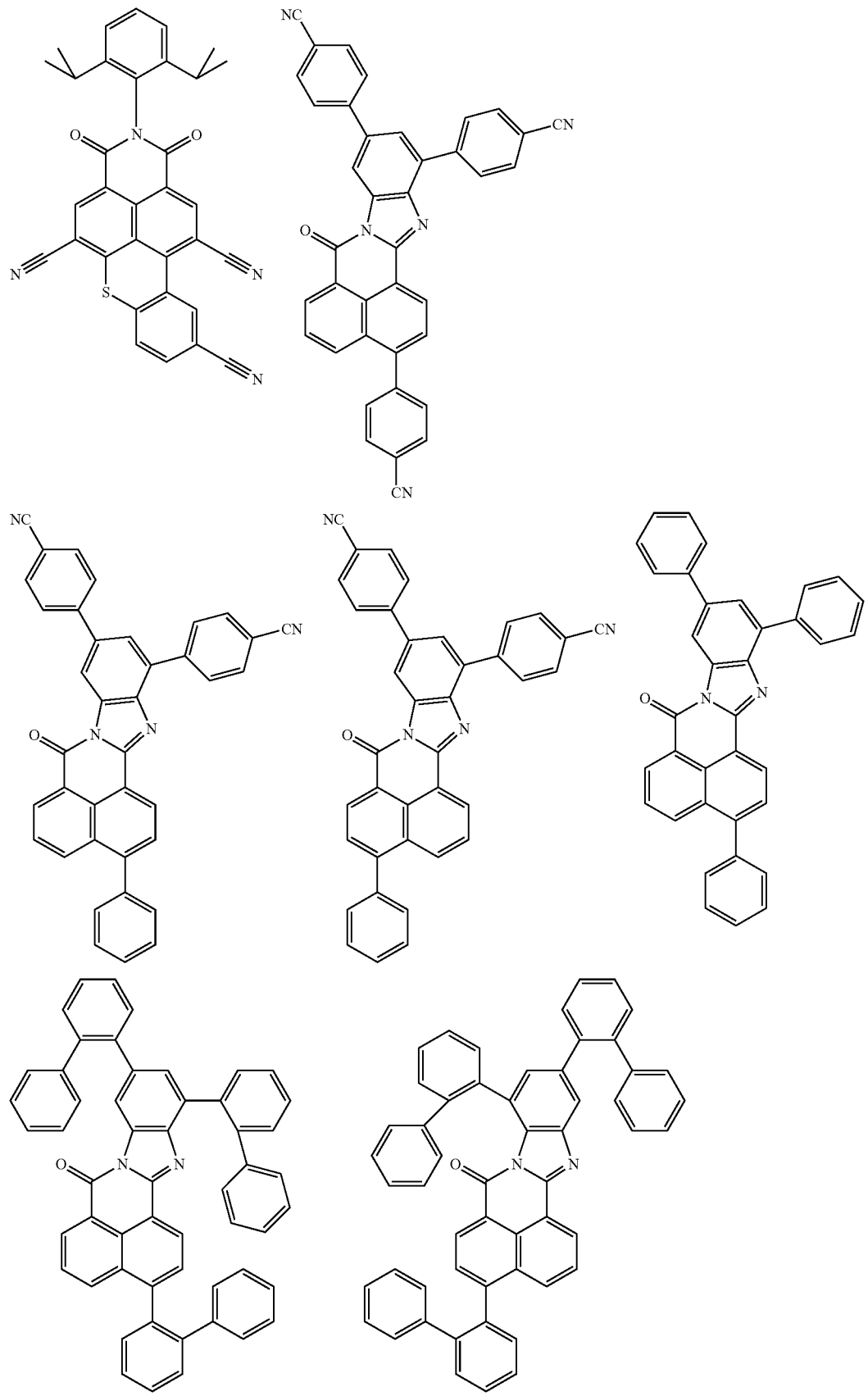

-continued

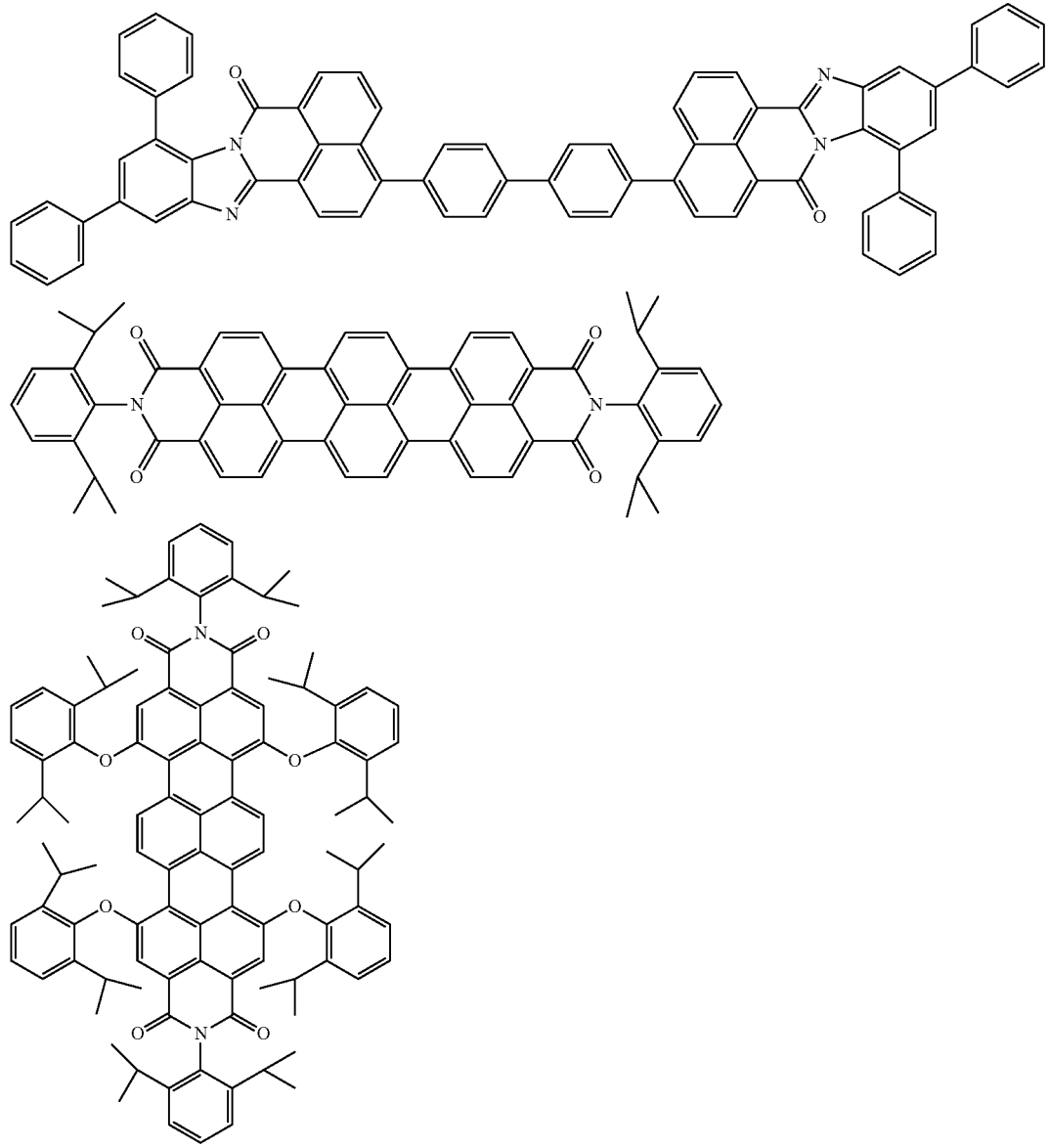

In a specific embodiment, the organic fluorescent colorants may be a combination of yellow and red emitting colorants, or a combination of yellow and orange emitting colorants, or a combination of yellow-green and red emitting colorants. It may be also beneficial to use more than two organic fluorescent colorants, such as yellow, yellow-green and red emitting colorants or yellow, yellow-green and orange emitting colorants.

In a specific embodiment, the organic fluorescent colorant(s) (B) as defined above is (are) embedded in the polymeric matrix material.

The concentration of the organic fluorescent colorant(s) (B) as defined above in the polymer matrix is set as a function of the thickness of the frequency converter and the type of polymer. If a thin polymer layer is used, the concentration of the organic fluorescent colorant(s) is generally higher than in the case of a thick polymer layer. Typically, the amount of organic fluorescent colorant(s) (B) in the polymer also depends on the correlated color temperature CCT to be achieved. A skilled person will appreciate that by increasing the concentration of yellow fluorescent colorant(s) and red fluorescent colorant(s), the light emitted from the LED is tuned to longer wavelength to obtain white light with a required CCT.

Typically, the concentration of the red organic fluorescent colorant(s) according to the present invention is usually in the range from 0.0001 to 0.5% by weight, preferably 0.001 to 0.1% by weight, based on the amount of polymer used. The concentration of (a) yellow or yellow-green organic fluorescent colorant(s) typically is 0.002 to 0.5% by weight, preferably 0.003 to 0.4% by weight, based on the amount of the polymer used.

It may be advantageous, for example in view of CCT or color rendering index (CRI), to use a mixture of yellow fluorescent colorant(s) and red fluorescent colorant(s). The ratio of yellow or yellow-green emitting organic fluorescent colorant(s) to red organic fluorescent colorant(s) is typically in the range from 1:1 to 25:1, preferably 2:1 to 20:1, more preferably 2:1 to 15:1, such as 10:1 or 3:1 or 4:1. A skilled person will readily appreciate that the ratio of the colorants depends on the chosen light source. For a desired CCT, the ratio of yellow dye/red colorant is much greater, if the light is generated by a blue LED with a center wavelength of emission between 420 nm and 480 nm in comparison to the ratio of yellow colorant/red colorant if the light is generated by a white LED having a CCT between 6 000 to 20 000 K.

Pigments/Scattering Bodies

In a special embodiment, the frequency converter additionally comprises at least one inorganic white pigment as a scattering body.

According to any of the above embodiments, the frequency converter can additionally comprise at least one inorganic white pigment as a scattering body. Likewise, according to any of the above embodiments, the frequency converter can additionally comprise at least one organic scattering body.

In a preferred embodiment, at least one of the layers or matrices comprising organic fluorescent colorants comprises scattering bodies for light.

Suitable scattering bodies are inorganic white pigments, for example titanium dioxide, barium sulphate, lithopone, zinc oxide, zinc sulphide, calcium carbonate with a mean particle size to DIN 13320 of 0.01 to 10 µm, preferably 0.1 to 1 µm, more preferably 0.15 to 0.4 µm, especially scattering bodies based on $TiO_2$. These scattering bodies are included typically in an amount of 0.01 to 2.0% by weight, preferably 0.05 to 1% by weight, more preferably 0.1 to 0.5% by weight, based in each case on the polymer of the layer comprising scattering bodies.

Suitable organic light scattering bodies include those based on poly(acrylates); poly (alkyl methacrylates), for example poly(methyl methacrylate) (PMMA); poly (tetrafluoroethylene) (PTFE); silicone-based scattering agents, for example hydrolyzed poly(alkyl trialkoxysilanes), and mixtures thereof. The size of these light scattering bodies (average diameter-weight average) is usually in the range from 0.5 to 50 µm, preferably 1 to 10 µm. These light scattering bodies are typically included in an amount of 1 to 10% by weight, based in each case on the polymer of the layer comprising scattering bodies. Useful light scattering bodies are for example a mixture of 3-5% by weight of PMMA based scattering agent and 1.5 to 2% by weight of silicone based scattering bodies.

Also suitable are light-scattering compositions which contain polymeric particles based on vinyl acrylate with a core/shell morphology in combination with $TiO_2$ as described in EP-A 634 445.

If the frequency converters comprise more than one organic fluorescent colorant, it is possible in one embodiment of the invention for a plurality of fluorescent colorants to be present alongside one another in one layer.

In another embodiment, the various fluorescent colorants are present in various layers.

In a special embodiment, the frequency converter has a multi-layer structure, preferably a two-layer structure, wherein each layer comprises at least one organic fluorescent colorant. In this embodiment, one of the layers or more than one but not all of the layers or all of the layers comprise a scattering body, preferably $TiO_2$.

In one embodiment, the frequency converters consist of a plurality of polymer layers which have been laminated together to form a composite and wherein the various fluorescent colorants and/or scattering bodies may be present in different polymer layers.

In a further embodiment, at least one polymer layer of the frequency converter has been mechanically reinforced with glass fibers.

Suitable frequency converters may be in any desired geometric arrangement. The frequency converters may, for example, be in the form of films, sheets or plaques. Equally, the matrix containing organic fluorescent colorants may be in droplet form or hemispherical form or in the form of lenses with convex and/or concave, flat or spherical surfaces. In one embodiment of the invention, the polymer layers (matrices) comprising at least one organic fluorescent colorant are 25 to 1000 micrometers (µm) thick, preferably 35 to 400 µm and particularly 50 to 300 µm.

In another embodiment, the polymer layers comprising organic fluorescent colorants are 0.2 to 5 mm thick, preferably 0.3 to 3 mm and more preferably 0.4 to 1 mm. Particular preferably, the polymer layers comprising organic fluorescent colorants are 400 to 900 µm and in particular 400 to 850 µm thick.

If the frequency converters consist of one layer or they have a laminate structure, the individual layers, in a preferred embodiment, are continuous and do not have any holes or interruptions.

Inventive frequency converters may optionally comprise further constituents, such as a backing layer.

Backing layers serve to impart mechanical stability to the frequency converter. The type of material for the backing layers is not crucial, provided that it is transparent and has the desired mechanical strength. Suitable materials for backing layers are, for example, glass or transparent rigid organic polymers, such as polycarbonate, polystyrene or polymethacrylates or polymethyl methacrylates.

Backing layers generally have a thickness of 0.1 mm to 10 mm, preferably 0.2 mm to 5 mm, more preferably 0.3 mm to 2 mm.

In one embodiment of the invention, inventive frequency converters have at least one barrier layer against oxygen and/or water, as disclosed in WO 2012/152812. Examples of suitable barrier materials for barrier layers are, for example, glass, quartz, metal oxides, $SiO_2$, a multilayer system composed of alternating layers of $Al_2O_3$ and $SiO_2$ layers, titanium nitride, $SiO_2$/metal oxide multilayer materials, polyvinyl alcohol, polyacrylonitrile, polyvinylidene chloride (PVDC), liquid crystal polymers (LCP), polystyrene-acrylonitrile (SAN), polybutylene terephthalate (PBT), polybutylene naphthalate (PBN), polyethylene terephthalate (PET), polyethylene naphthalate (PEN), polyvinyl butyrate (PBT), polyvinyl chloride (PVC), polyamides, polyoxymethylenes, polyimides, polyetherimides, epoxy resins, polymers which derive from ethylene-vinyl acetate (EVA) and polymers which derive from ethylene-vinyl alcohol (EVOH).

A preferred material for barrier layers is glass or a multilayer system composed of alternating layers of $Al_2O_3$ and $SiO_2$ layers.

Preferably, suitable barrier layers have low permeability for oxygen.

More preferably, suitable barrier layers have low permeability for oxygen and water.

DESCRIPTION OF THE DRAWINGS

Embodiments of the present invention are now described with reference to the drawings.

FIG. 1 shows a schematic representation of an embodiment of the data transmission system according to the invention including an embodiment of a transmitter according to the present invention.

With reference to FIG. 1, an embodiment of the transmitter 1 according to the present invention is described:

The transmitter comprises a radiation source 2 for generating and emitting first electromagnetic radiation 3. The radiation source 2 is a LED emitting blue light, wherein the center wavelength of emission is between 400 nm and 480 nm, in particular between 440 nm and 470 nm.

Furthermore, the transmitter 1 comprises a frequency converter 4 that is positioned in the direction of the first electromagnetic radiation 3 emitted by the radiation source 2, so that the first electromagnetic radiation 3 irradiates the frequency converter 4. The frequency converter 4 is arranged in a remote arrangement from the radiation source 2. In the present embodiment, the distance between the radiation source 2 and the frequency converter is 0.1-10 cm.

According to one embodiment, the radiation source 2 and the frequency converter 4 may be arranged within a housing 5. The housing 5 is partly transparent for electromagnetic radiation to be emitted by the transmitter. According to a preferred embodiment, the radiation source 2 and the frequency converter 4 are not arranged within a housing 5. The frequency converter 4 is applied to the inside surface of the transparent part of the housing 5. In particular, the frequency converter 4 is formed by extrusion, printing, coating or molding.

The frequency converter 4 converts at least a part of the first electromagnetic radiation 3 emitted by the radiation source 2 into second electromagnetic radiation 6. The second electromagnetic radiation 6 is different from the first electromagnetic radiation 3. The frequency converter 4 is adapted to convert a first wavelength of the first electromagnetic radiation 3 into a second wavelength of the second electromagnetic radiation 6, wherein the second wavelength is longer than the first wavelength.

The second electromagnetic radiation 6 has a band spectrum comprising wavelengths in the range from 450 nm to 700 nm, so that the frequency converter 4 converts the blue light emitted by the radiation source 2 into a band spectrum within the visible spectral range forming white light. The bandwidth of the first electromagnetic radiation, i. e. the blue light emitted by the blue LED, is narrower than the bandwidth of the second electromagnetic radiation. Therefore, the emitted blue light is broadened to white light.

The white light generated by the frequency converter 4 is finally emitted by the transmitter 1. Transmitter 1 therefore emits electromagnetic radiation in the visible spectral range.

Furthermore, the transmitter 1 comprises a control unit 7 for controlling the radiation source 2. In particular, the radiation source 2 may be turned on and turned off by the control unit 7. Furthermore, the control unit 7 may control the intensity of the blue light emission of the blue LED forming the radiation source 2. For example, the intensity may be controlled by pulse width modulation (PWM).

Moreover, the transmitter 1 comprises a modulator 8 being adapted to modulate the first electromagnetic radiation emitted by the radiation source 2 depending on data to be transmitted. In the present embodiment, the modulator 8 is coupled to the control unit 7. The modulator 8 transfers a modulation signal to control unit 7. Control unit 7 then applies this modulation signal to the control of the radiation source 2. It is noted that the modulation signal is independent from the pulse width modulation for controlling the light intensity. The data to be transmitted are coded by the modulation signal. In particular, intensity modulation may be used to transmit the data, i. e. the intensity of the first electromagnetic radiation 3 emitted by the radiation source 2 varies depending on the data to be transmitted. However, the variations are so small, so that they are imperceptible for the viewer.

Furthermore, the modulator 8 is coupled to a data source 9. Data source 9 transfers the data to be transmitted to the modulator 8 that converts such data into a modulation signal that can be used by the control unit.

Therefore, the blue LED forming the radiation source 2 emits blue light as first electromagnetic radiation 3 that is modulated in accordance with the data to be transmitted. Such modulated blue light is converted by the frequency converter 4 into modulated white light that forms modulated second electromagnetic radiation 6. Therefore, the frequency converter 4 of the present embodiment may also be designated as light converter or frequency converter.

The frequency converter 4 has particular properties that will be described in further detail below. One property of the frequency converter 4 is that the converted electromagnetic radiation that is white light in the present embodiment is modulated in correspondence to the modulation of the first electromagnetic radiation 3. The modulation used for data transmission is maintained by the frequency converter 4. As it will be described in further detail below, fluorescence is used for frequency conversion by the frequency converter 4. However, the fluorescence decay time is rather short, so that the modulation is not blurred.

The value of the luminous flux of the second electromagnetic radiation 6, i.e. of the white light, may be at least in the range from 100 lm to 30 000 lm. Therefore, an illumination device is formed comprising the transmitter 1 for transmitting data on the one hand and for emitting illumination light on the other hand. Such illumination device may be used wherever a luminaire, a lamp or any other lighting device may conventionally be used.

In addition, the illumination device may also be dimmed, so that a lower luminous flux that is not perceptible may also be generated, so that data transmission may also be carried out when the illumination device is not used for lighting.

In the following, an embodiment of a data transmission system in accordance with the present invention is described:

The data transmission system comprises the transmitter 1 as described above. Furthermore, the data transmission system comprises a receiving unit 10. The receiving unit 10 comprises a receiver 11 to detect at least a part of the modulated second electromagnetic radiation 6 emitted by the transmitter 1. Therefore, the receiver 11 is located to be irradiated by the second electromagnetic radiation 6. Furthermore, an optical filter 12 may be arranged before the receiver 11 for filtering the modulated second electromagnetic radiation 6 emitted by the transmitter 1. The receiver 11 may be a photodetector, a solar cell or a camera, such as a camera of a computer or smartphone.

The receiving unit 10 further comprises a data analyzer 13 that is coupled to the receiver 11. The data analyzer 13 is adapted to extract data from the detected modulated second electromagnetic radiation 6 as it is known in the art.

It is noted that the modulation applied by the modulator 8 may be applied differently. In the above described embodiment, the modulator 8 is coupled to the control unit 7, so that the modulation is directly applied to the radiation source 2 by means of intensity variations. According to other embodiments, the modulator 8 may also be located between the radiation source 2 and the frequency converter 4. In this case, unmodulated first electromagnetic radiation is generated and emitted by the radiation source 2. The first unmodulated electromagnetic radiation 3 is then modulated by the modulator, so that modulated first electromagnetic radiation 3 is generated that irradiates the frequency converter 4. As described above, the frequency converter 4 then converts the modulated first electromagnetic radiation 3 into modulated second electromagnetic radiation 6 that is in particular white light of an illumination device.

In other embodiments, the modulator may even be integrated in the frequency converter 4. However, in this case, the frequency converter 4 must be an active element that may be controlled by the modulator.

In the following, an example of a frequency converter 4 is described in detail that is used in the embodiment of the transmitter 1 and the data transmission system using transmitter 1:

LIST OF REFERENCE SIGNS

1 transmitter
2 radiation source
3 first electromagnetic radiation
4 frequency converter
5 housing
6 second electromagnetic radiation
7 control unit
8 modulator
9 data source
10 receiving unit
11 receiver
12 infrared filter
13 analysing unit

EXAMPLES

The following figures and examples serve to illustrate the invention and should not be interpreted as limiting.

The following dyes 1 to 24 were employed in the examples.

Dye 1: (Colorant from Group B13)

N, N'-bis(2,6-diisopropylphenyl)-1,6,7,12-tetra-phenoxyperylene-3,4:9,10-tetracarboximide Dye 1 can be purchased from, e.g. from BASF SE.
Dye 2: (Colorant from Group B12)

diisobutyl 4,10-dicyanoperylene-3,9-dicarboxylate mixture with diisobutyl 4,9-dicyanoperylene-3,10-dicarboxylate

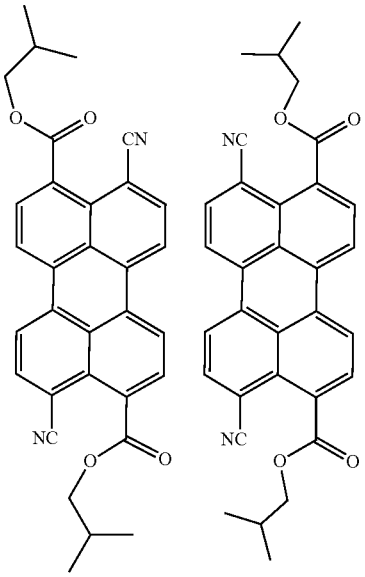

Dye 2 can be purchased, e.g. from BASF SE.
Dye 3: (Colorant from Group B8)

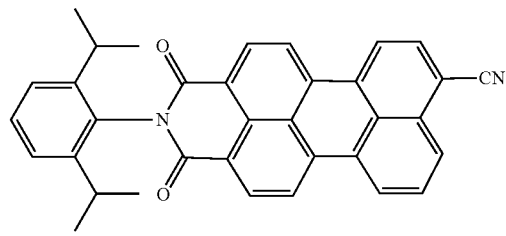 [SMILES: CC(C)c1cccc(C(C)C)c1N1C(=O)c2ccc3c4cccc5c(C#N)ccc(c6ccc(c2c36)C1=O)c54]

Dye 3 can be purchased, e.g. from BASF SE.
Dye 4: (Colorant from Group B8)

N,N'-Bis(2,6-diisopropylphenyl)-3,4,9,10-perylenetetracarboxylic diimide

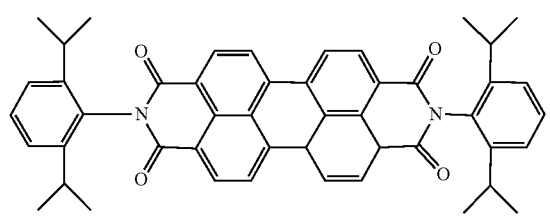 [SMILES: CC(C)c1cccc(C(C)C)c1N1C(=O)c2ccc3c4c(ccc(c24)C1=O)C1C=CC2C(=O)N(c4c(C(C)C)cccc4C(C)C)C(=O)c4ccc-3c1c42]

Dye 4 can be purchased, e.g. from BASF SE.
Dye 5: (Colorant from Group B13)

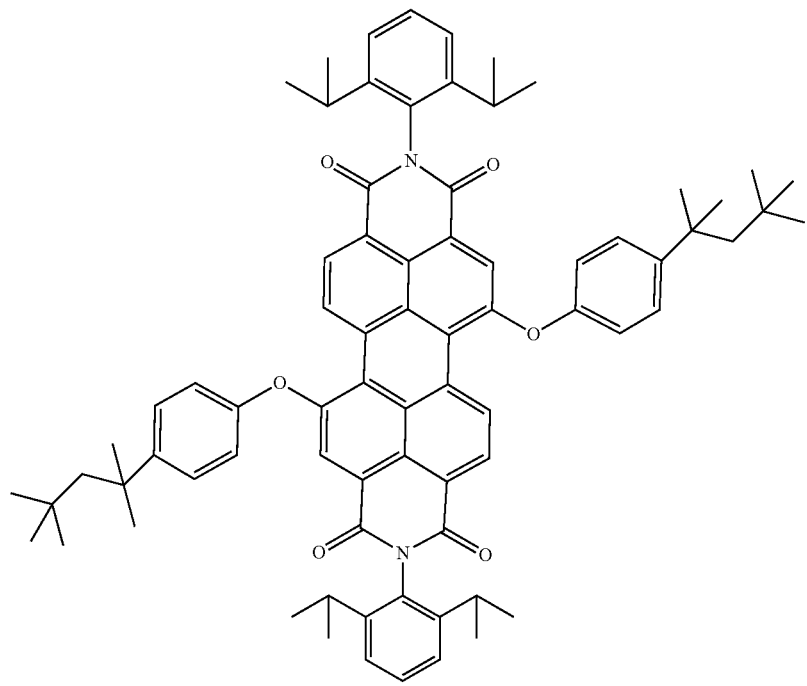 [SMILES: CC(C)c1cccc(C(C)C)c1N1C(=O)c2ccc3c4c(Oc5ccc(C(C)(C)CC(C)(C)C)cc5)cc5c6c(ccc(c7c(Oc8ccc(C(C)(C)CC(C)(C)C)cc8)cc(c2c37)C1=O)c64)C(=O)N(c1c(C(C)C)cccc1C(C)C)C5=O]

Dye 5 can be prepared in analogy to the methods described in EP 3072887.

Dye 6: (Colorant from Group B13)

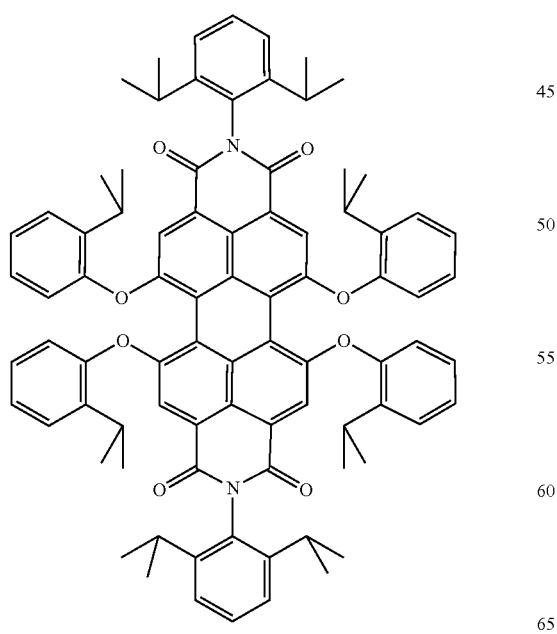

A mixture of 2.2 g (2.6 mmol) of 1,6,7,12-tetrachloro-N,N'-2,6-diisopropylphenyl-perylene-3,4,9,10-tetracarboxylic acid diimide, 4.25 g (31.2 mmol) of 2-isopropylphenol, 2.52 g (18.2 mmol) of $K_2CO_3$ and 170 mL of N-methylpyrrolidone were heated to 90° C. for 17 hours. Afterwards, the mixture was heated to 110° C. for 10 hours. Further 2.12 g (15.6 mmol) of 2-isopropylphenol and 1.26 g of $K_2CO_3$ were added and heating continued for 23 hours. Further 2.12 g (15.6 mmol) of 2-isopropylphenol and 1.26 g of $K_2CO_3$ were added and heating continued for 6 hours. The product was precipitated with 1 L of diluted HCl. After extraction with dichloromethane 7.5 g of a liquid crude material was obtained which was further purified by column chromatography using toluene dicholoromethane. 0.28 g of pure title compound were isolated.

Rf (petroleum ether/ethylacetate 8:1)=0.3.
Lambda max emission: 616 nm (in polycarbonate).
Dye 7: (Colorant from Group B11)

diisobutyl perylene-3,9-dicarboxylate mixture with diisobutyl perylene-3,10-dicarboxylate Dye 10: (Colorant from Group B3)
Mixture of Compounds (10.a) and (10.b)

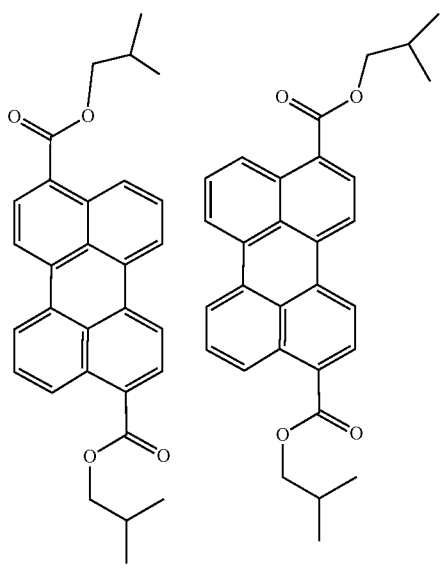

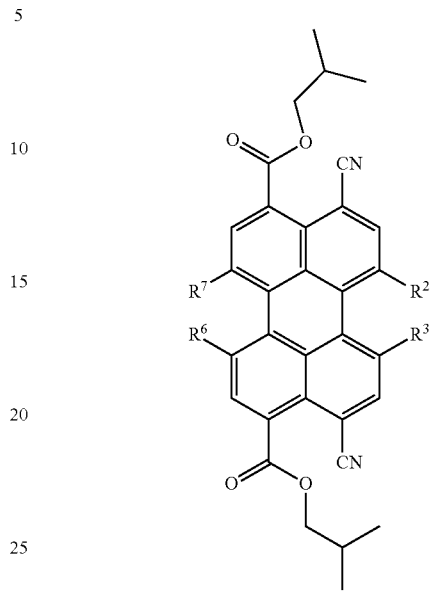

(10.a)

Dye 7 can be purchased, e.g. from BASF SE.

Dye 8: (Colorant from Group B5)

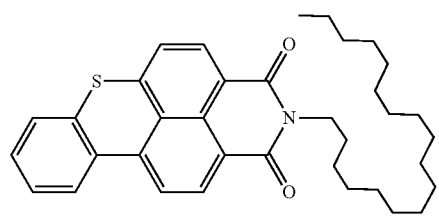 [SMILES: CCCCCCCCCCCCCCCCCCn1c(=O)c2ccc3sc4ccccc4c4ccc(c1=O)c2c34]

Dye 8 can be prepared as described in WO 2014/131628.

Dye 9: (Colorant from Group B7)

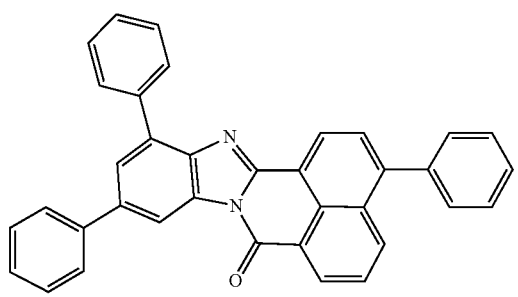 [SMILES: O=c1c2cccc3c(-c4ccccc4)ccc(c32)c2nc3c(-c4ccccc4)cc(-c4ccccc4)cc3n12]

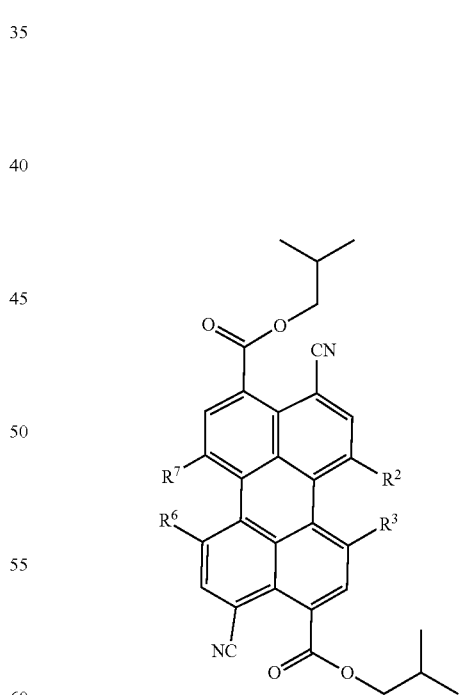

(10.b)

in which
three of the $R^2$, $R^3$, $R^6$ and $R^7$ substituents are hydrogen; and
one of the $R^2$, $R^3$, $R^6$ and $R^7$ substituents is cyano.

Dye 9 can be prepared as described in example 10 of WO 2012/168395.

Dye 10 can be prepared as described in example 3 of WO 2015/169935.

Dye 11: (Colorant from Group B1)

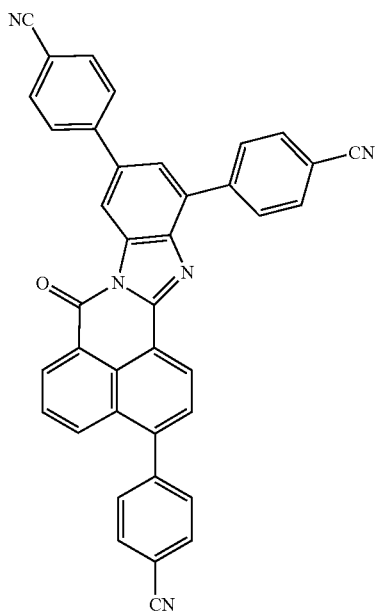 [SMILES: N#Cc1ccc(-c2cc(-c3ccc(C#N)cc3)c3nc4c5ccc(-c6ccc(C#N)cc6)c6cccc(c(=O)n4c3c2)c65)cc1]

11.1 Preparation of

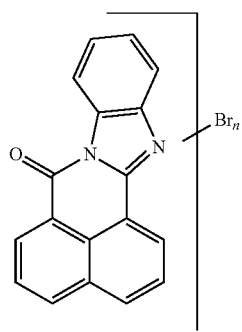

n = 3

Following the procedure described in example 6 of WO 2012/168395, a mixture of the title compound and of the corresponding mono- and di- and tetrabrominated compounds were obtained. The tribrominated compound constitutes about 40% by weight.

11.2 Preparation of the Title Compound

A mixture of 2.5 g (0.005 mol) g of the tribrominated compound of example 11.1, 4.41 g (0.03 mol) of 4-cyanophenylboronic acid, 2.07 g (0.015 mol) of potassium carbonate dissolved in 5 mL of water and 0.174 g (0.00015 mol) of tetrakistriphenylphosphinepalladium(0) was heated at 90° C. for 4 hours. After cooling to room temperature, the residue was filtered off, washed with methanol and water and dried in vacuum to give 2.29 g of a crude product. The compound was purified by column chromatography (silica gel; toluene/ethyl acetate 20:1) to afford 0.92 g (32%) of a yellow solid.

$R_f$ (toluene/ethyl acetate 10:1)=0.3.
Lambda max emission=508 nm (polycarbonate).

Dye 12: (Colorant from Group B2)

Mixture of

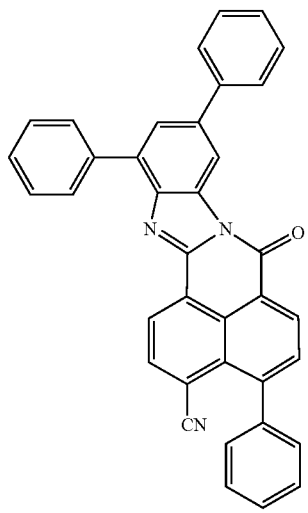

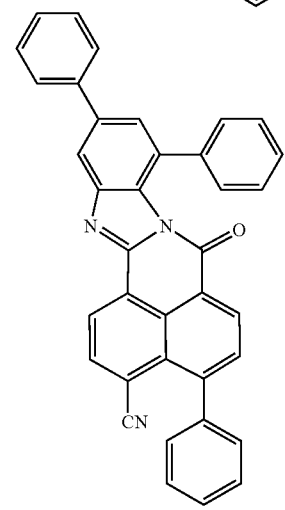

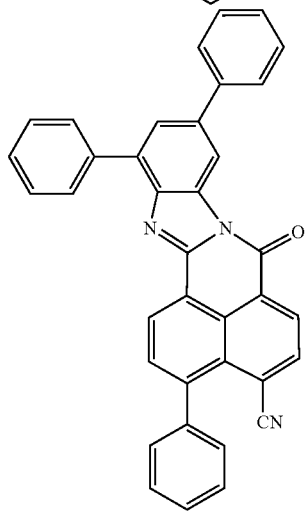

-continued

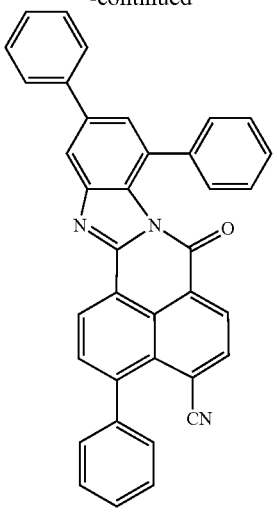

Dye 12 can be prepared as described in example 3 of WO 2015/019270.
Dye 13: (Colorant from Group B5)

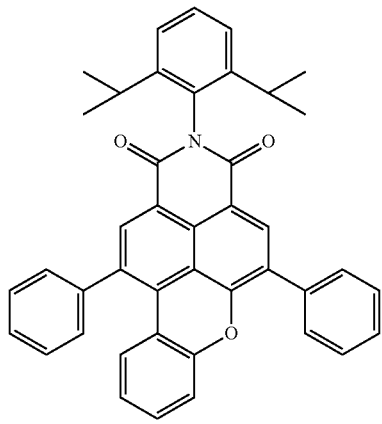 [SMILES: CC(C)c1cccc(C(C)C)c1-n1c(=O)c2cc(-c3ccccc3)c3oc4ccccc4c4c(-c5ccccc5)cc(c1=O)c2c34]

Dye 13 can be prepared as described in WO 2014/131628 (compound 2401).
Dye 14: (Colorant from Group B13)

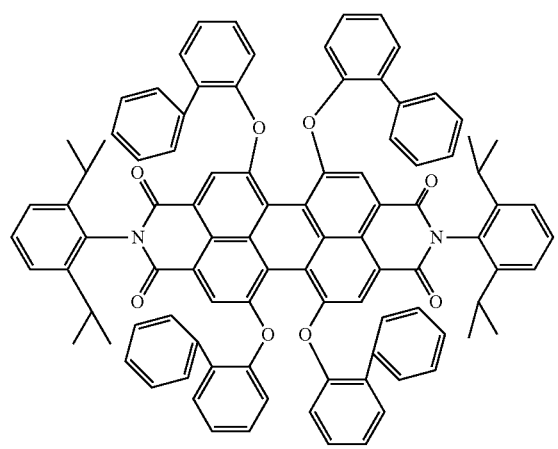 [SMILES: CC(C)c1cccc(C(C)C)c1N1C(=O)c2cc(Oc3ccccc3-c3ccccc3)c3c4c(Oc5ccccc5-c5ccccc5)cc5c6c(cc(Oc7ccccc7-c7ccccc7)c(c7c(Oc8ccccc8-c8ccccc8)cc(c2c37)C1=O)c64)C(=O)N(c1c(C(C)C)cccc1C(C)C)C5=O]

A mixture of 5 g (5.9 mmol) of N,N'-(2,6-diisopropylphenyl)-1,6,7,12,-tetrachloro-perylenetetracarboxylic diimide, 4.23 g of (24.9 mmol) biphenyl-2-ol, 138.21 g (16.9 mmol) of potassium carbonate and 30 mL of N-methyl-2-pyrrolidone (NMP) were stirred at room temperature for 24 h and then for 48 h at 115° C. After cooling to 80° C., the reaction mixture was added tropwise to a mixture of 10 mL of acetic acid and 20 mL of water within 15 min, cooled to room temperature over a period of 2 h and then filtered. The residue was washed with 300 mL of a mixture of ethanol/water (1:1) and then with 600 mL of a mixture of ethanol/water/NMP (4:4:1). The residue was dissolved in a mixture of 35 mL of ethanol and 5 mL of NMP under reflux, then cooled to room temperature and separated to obtain 5.6 g (62%) of a red dye which was purified by chromatography using cyclohexane/ethyl acetate. The yield was 2.06 g (23%). Rf (cylohexane/ethyl acetate 10:1)=0.29.

Dye 15: (Colorant from Group B14)

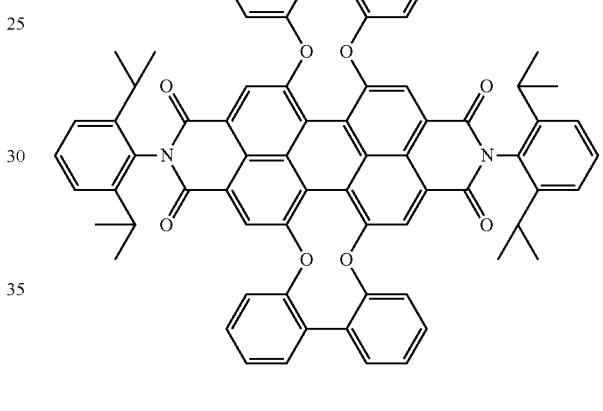

Dye 15 can be prepared as described in example 1 of WO 2017/121833 A1.

Dye 16: (Colorant from Group B5)

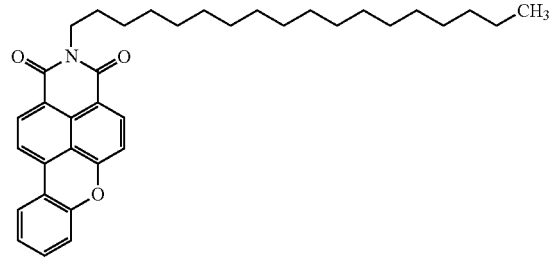 [SMILES: CCCCCCCCCCCCCCCCCCn1c(=O)c2ccc3oc4ccccc4c4ccc(c1=O)c2c34]

Dye 16 can be prepared in analogy to the compounds described in WO 2014/131628.
Dye 17: (Colorant from Group B4)
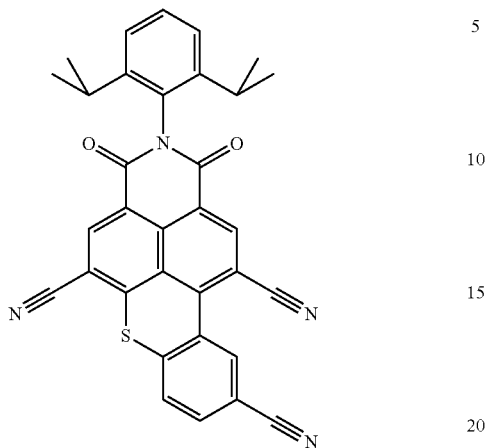
Dye 17 can be prepared as described in example 6 of WO 2016/151068.
Dye 18: (Colorant from Group B4)
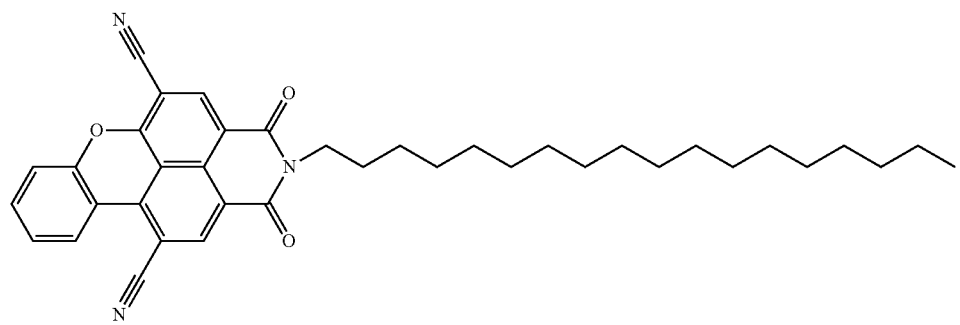 [SMILES: CCCCCCCCCCCCCCCCCCn1c(=O)c2cc(C#N)c3oc4ccccc4c4c(C#N)cc(c1=O)c2c34]
Dye 18 can be prepared as described in example 5 of WO 2016/151068.
Dye 19: (Colorant from Group B1)
Mixture of Compounds
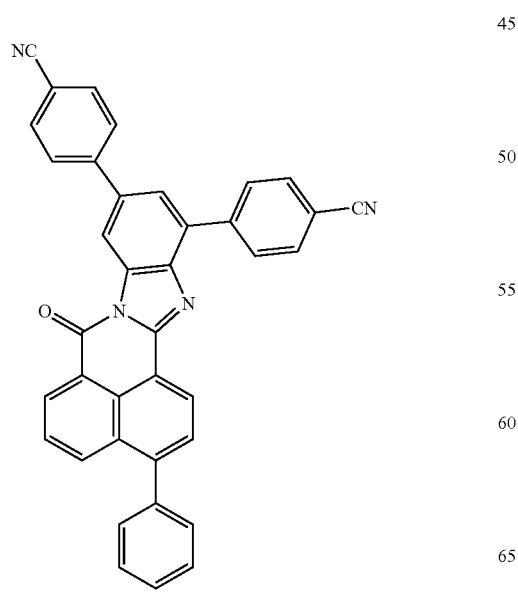

-continued

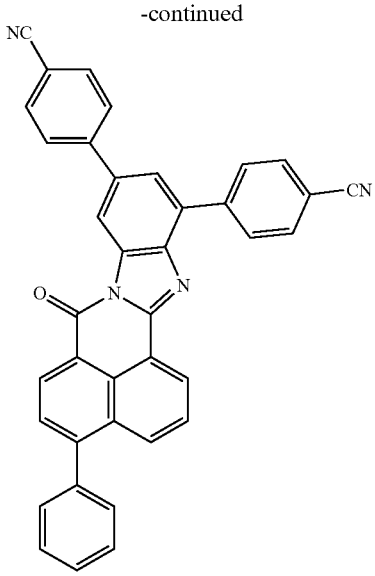

19.1 2,4-Dibromo-6-nitroaniline

A mixture of 10 g (0.072 mol) of 2-nitroaniline, 100 mL of glacial acid, 14.5 mL (0.29 mol; 46.4 g) of bromine were heated at about 45° C. After 2 hours, further 3.0 mL (0.06 mol) of bromine were added, and the reaction mixture was stirred for two further hours. Excess bromine was outgassed. To the reaction mixture water was added. The precipitate was sucked off, washed with water and dried to give 21.0 g (98%) of a yellow solid.

$R_f$ (toluene/ethyl acetate 10:1)=0.8.

19.2 4-[4-Amino-3-(4-cyanophenyl)-5-nitro-phenyl]benzonitrile

A mixture of 367 mL of toluene, 19.45 g (0.066 mol) of the compound of 19.1, 21.72 g (0.242 mol) of 4-cyanophenylboronic acid, 31.6 g (0.114 mol) of potassium carbonate dissolved in 50 mL of water, 6.02 g (0.0066 mol) of tris(dibenzylidene-acetone)dipalladium and 26 mL (0.0264 mol) of a tri-tert-butylphosphine solution in toluene were heated under nitrogen at 80 to 90° C. for 3 hours. The reaction mixture was cooled to room temperature. The precipitate was filtered, washed with water and dried to 21.6 g (96%) of a yellow solid.

$R_f$ (toluene/ethyl acetate 10:1)=0.29.

19.3 4-[3,4-Diamino-5-(4-cyanophenyl)phenyl]benzonitrile

A mixture of 19.9 g (0.0584 mol) of the compound of 19.2, 400 mL of ethanol, 100 mL of N-methylpyrrolidone and 44.0 g (0.2328 mol) of zinc(II) chloride were heated under reflux at 85° C. for 2 hours. After cooling to room temperature and filtration, ethanol was removed from the filtrate by distillation. The title compound was precipitated by addition of water and ethanol. The precipitate was filtered off, washed with hot water and dried in vacuum to give 25.9 g (143%) of a yellow compound containing inorganic salts.

$R_f$ (toluene/ethyl acetate 10:1)=0.1.

19.4 Mixture of

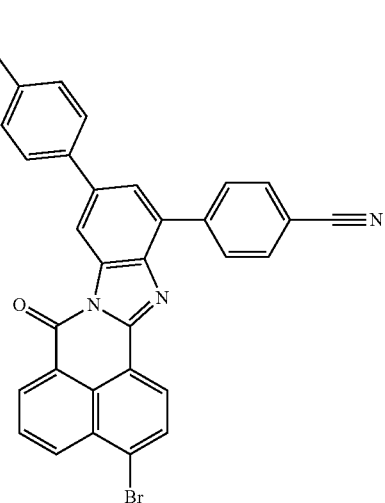

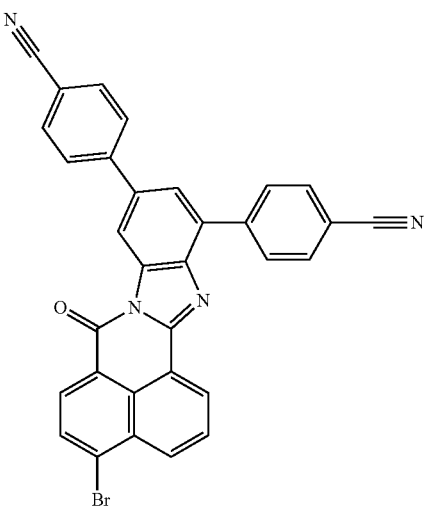

A mixture of 250 mL of quinoline, 8.8 g (0.032 mol) of 4-bromo-1,8-naphthalic anhydride, 11.0 g (0.032 mol; 90% purity) of the mixture from 19.3, 6.0 g (0.032 mol) of zinc acetate was heated at 130° C. for 2 hours under nitrogen. After cooling to room temperature, 200 mL of methanol were added. The mixture was stirred over night followed by filtration. The residue was washed with methanol and water. 11.45 g (65%) of a yellow precipitate were obtained.

$R_f$ (toluene/ethyl acetate 10:1)=0.5.

19.5 Mixture of the Title Compounds

A mixture of 11.0 g (0.02 mol) of the mixture of compounds from 19.4, 2.68 g (0.02 mol) of phenylboronic acid, 5.52 g (0.04 mol) of potassium carbonate, 30 mL of water, 250 mL of toluene and 0.23 g (0.0002 mol) of tetrakistriphenylphosphinepalladium was heated at 90° C. for 2 hours. After cooling to room temperature, the residue was filtered off, washed with methanol and water and dried in vacuum to give 10.5 (95%) of a yellow-black residue. This residue was dissolved in 400 mL of toluene by heating under reflux, 2.0 g of activated charcoal were added, the mixture was stirred for 30 minutes followed by hot filtration. The filtrate was allowed to cool up over night and the precipitate was filtered off. Yield: 2.3 g of the title compound which is free of palladium.

$R_f$ (toluene/ethyl acetate 10:1)=0.5.

Lambda max emission: 519 nm (in polycarbonate).

Dye 20: (Colorant from Group B5)

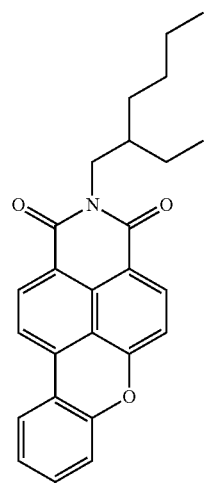 [SMILES: CCCCC(CC)Cn1c(=O)c2ccc3oc4ccccc4c4ccc(c1=O)c2c34]

Dye 20 can be prepared as described in WO 2014/131628.

Dye 21: (Colorant from Group B15)

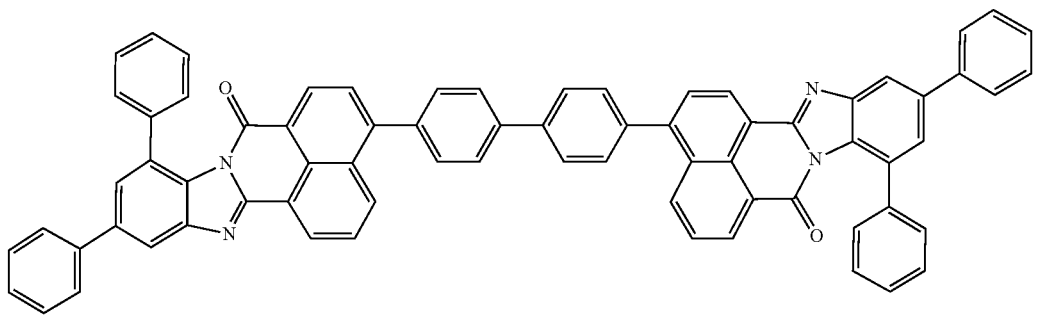

Dye 21 can be prepared in analogy to the methods described in WO 2012/168395.

Dye 22: (Colorant from Group B7)

Mixture of

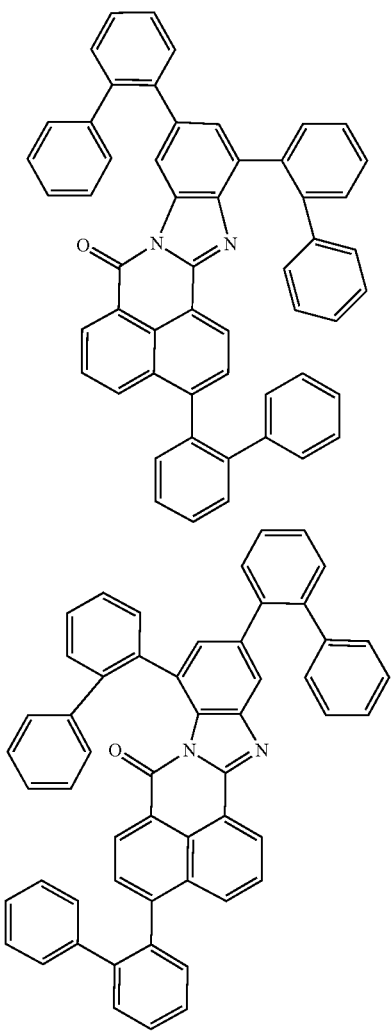

Dye 22 can be prepared as described in WO 2012/168395.

Dye 23: (Colorant from Group B16)

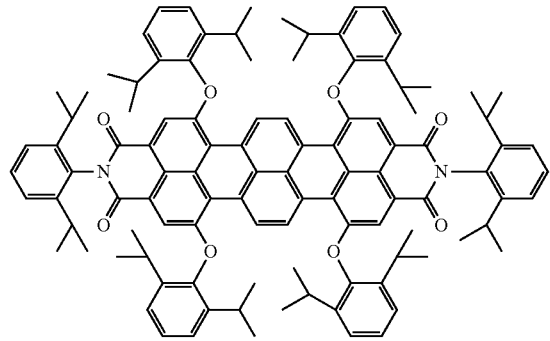 [SMILES: CC(C)c1cccc(C(C)C)c1Oc1cc2c3c(cc(Oc4c(C(C)C)cccc4C(C)C)c4c5ccc6c7c(Oc8c(C(C)C)cccc8C(C)C)cc8c9c(cc(Oc%10c(C(C)C)cccc%10C(C)C)c(c%10ccc(c1c34)c5c%106)c97)C(=O)N(c1c(C(C)C)cccc1C(C)C)C8=O)C(=O)N(c1c(C(C)C)cccc1C(C)C)C2=O]

Dye 23 can be prepared as described in example 2 of WO 2007/006717.

Dye 24: (Colorant from Group B16)

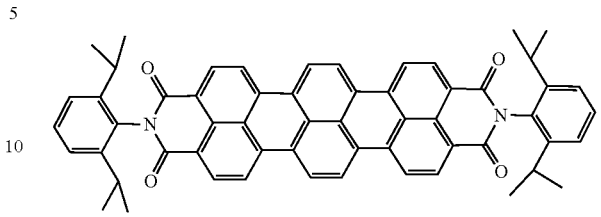

Dye 24 can be prepared as described in Chem. Eur. J. 1997, 3, pages 219-225.

Production of the Frequency Converters for Testing of the Dyes:

The afore-mentioned fluorescent dyes were used to produce frequency converters by incorporation into a polymer matrix by the method described in the following. The polymers used were polymethylmethacrylate (PMMA, Plexiglas® 6N from Evonik), polystyrene (PS, 168 N from BASF) and polycarbonate (PC, Macrolon® 2808 from Bayer). About 2.5 g of polymer and 0.008% to 0.06% by weight of the dye was dissolved in about 5 mL of methylene chloride, and 0.5% by weight of $TiO_2$ (Kronos 2220) were dispersed therein, based in each case on the amount of polymer used. The exact composition of each converter is described in table 1. The solutions/dispersion obtained were coated onto a glass surface using an applicator frame (from Ericsen, wet film thickness 400 μm). After the solvent had dried off, the film was detached from the glass and dried in a vacuum drying cabinet at 50° C. overnight. Two circular film pieces of 80 to 85 μm thickness having a diameter of 15 mm were punched out of each film, and used as analysis samples.

Measurement of Quantum Yields:

Fluorescence quantum yields (QY) of the analysis samples were measured with the C9920-02 quantum yield measuring system from Hamamatsu. This was done by illuminating each of the samples with light of 445 to 455 nm in an integrating sphere (Ulbricht sphere). By comparison with the reference measurement in the Ulbricht sphere without sample, the unabsorbed fraction of the excitation light and the fluorescent light emitted by the sample are determined by means of a CCD spectrometer. Integration of the intensities of the spectrum of the unabsorbed excitation light and of that of the emitted fluorescent light gives the degree of absorption and fluorescence intensity, respectively, and thus the fluorescence quantum yield of each sample can be calculated. All measurements were performed at room temperature.

Determination of the Excited-State Lifetime $\tau_v$ and the Emissive Lifetime $\tau_0$:

The excited-state lifetime ($\tau_v$) of the prepared thin films is measured by exciting the thin films with a pulsed diode laser with an excitation wavelength of 450 nm (Picoquant) operated at 10 kHz (85 μW, 105 μW/cm$^2$) and detecting the emission with time correlated single photon counting (TCSPC). This wavelength was chosen in order to be close to the lighting application, where a blue LED with 450 nm emission maximum is used. A mono-exponential fit to the decay curve was used to determine the excited-state lifetime ($\tau_v$). All measurements were performed at room temperature.

The emissive lifetime $\tau_0$ is calculated by $\tau_0 = \tau_v/QY$. This value is important to compare between different materials as only radiative decay processes are considered here. The following table 1 summarizes the results. Excitation was at 450 nm, the decay rate was determined at the emission maximum which is given in the second column. Some of the materials were measured in different matrices, and some samples were also measured without adding $TiO_2$ to the film to see the influence of the scattering bodies.

TABLE 1

| Frequency converter | Emission maximum [nm] | $\tau_v$ [ns] | $\tau_0$ [ns] | QY [%] |
|---|---|---|---|---|
| 0.03% dye 1 in PC | 606 | 6.0 | 6.8 | 88.7 |
| 0.03% dye 1 in PS | 600 | 5.9 | 6.5 | 90.5 |
| 0.03% dye 2 in PS | 520 | 4.0 | 4.3 | 92.7 |
| 0.03% dye 3 in PS | 520 | 4.7 | 5.3 | 88.5 |
| 0.03% dye 4 in PS | 540 | 5.1 | 5.5 | 91.9 |
| 0.03% dye 4 in PS | 576 | 4.9 | 5.3 | 91.9 |
| 0.03% dye 4 in PMMA | 540 | 5.1 | 5.4 | 94.8 |
| 0.03% dye 4 in PMMA | 576 | 4.9 | 5.2 | 94.8 |
| 0.03% dye 4 in PMMA | 618 | 5.0 | 5.3 | 94.8 |
| 0.04% dye 5 in PC | 576 | 5.3 | — | — |
| 0.03% dye 5 in PS | 566 | 4.9 | 5.2 | 94.3 |
| 0.015% dye 6 in PS | 600 | 5.3 | 5.5 | 95.2 |
| 0.05% dye 7 in PMMA | 520 | 6.0 | 6.4 | 93.2 |
| 0.03% dye 7 in PC | 540 | 5.6 | 6.0 | 92.8 |
| 0.02% dye 7 in PS | 540 | 5.4 | 5.8 | 92.7 |
| 0.02% dye 8 in PMMA | 525 | 6.7 | 7.6 | 88.6 |
| 0.02% dye 9 in PS | 520 | 4.9 | 5.7 | 85.8 |
| 0.02% dye 9 in PC | 520 | 5.2 | 5.9 | 88.1 |
| 0.01% dye 10 in PMMA | 506 | 5.5 | 6.1 | 90.0 |
| 0.01% dye 10 in PMMA | 530 | 5.8 | 6.4 | 90.0 |
| 0.01% dye 10 in PC | 508 | 5.2 | 5.8 | 89.3 |
| 0.01% dye 10 in PC | 533 | 5.3 | 6.0 | 89.3 |
| 0.01% dye 10 in PS | 534 | 5.3 | 5.9 | 89.9 |
| 0.01% dye 10 in PS | 506 | 5.2 | 5.8 | 89.9 |
| 0.04% dye 11 in PC | 560 | 4.7 | 5.3 | 87.9 |
| 0.04% dye 11 in PS | 560 | 4.6 | 5.3 | 86.6 |
| 0.01% dye 12 in PS | 550 | 5.3 | 6.0 | 87.4 |
| 0.01% dye 12 in PC | 540 | 5.3 | 6.1 | 86.7 |
| 0.01% dye 13 in PS | 540 | 7.1 | 7.8 | 90.4 |
| 0.01% dye 13 in PC | 540 | 7.1 | 7.7 | 91.8 |
| 0.03% dye 14 in PC | 560 | 6.5 | 6.9 | 94.7 |
| 0.03% dye 14 in PS | 560 | 6.4 | 6.8 | 95.2 |
| 0.035% dye 15 in PC | 573 | 5.8 | 6.0 | 97.4 |
| 0.035% dye 15 in PC | 610 | 6.0 | 6.1 | 97.4 |
| 0.035% dye 15 in PS | 610 | 6.0 | 6.0 | 99.4 |
| 0.035% dye 15 in PS | 573 | 6.0 | 6.0 | 99.4 |
| 0.0176% dye 16 in PC | 530 | 5.4 | 5.7 | 94.7 |
| 0.012% dye 16 in PS | 525 | 5.2 | 5.6 | 93.6 |
| 0.0192% dye 17 in PC | 535 | 7.5 | 9.0 | 82.9 |
| 0.017% dye 17 in PS | 535 | 7.3 | 8.8 | 83.4 |
| 0.123% dye 18 in PC | 502 | 7.1 | 7.6 | 93.7 |
| 0.123% dye 18 in PC | 532 | 7.6 | 8.1 | 93.7 |
| 0.02% dye 19 in PC | 520 | 4.4 | 4.7 | 92.1 |
| 0.012% dye 20 in PS | 525 | 5.4 | 5.7 | 93.8 |
| 0.016% dye 20 in PC | 525 | 5.5 | 5.8 | 94.3 |
| 0.008% dye 21 in PC | 540 | 4.7 | 6.0 | 78.5 |
| 0.034% dye 22 in PC | 520 | 5.5 | 6.4 | 86.3 |

In addition, for the dyes 23 and 24 excitation was done at 635 nm, as they absorb very little at 450 nm. The following table 2 summarizes the results.

TABLE 2

| Frequency converter | Emission maximum [nm] | $\tau_v$ [ns] | $\tau_0$ [ns] | QY [%] |
|---|---|---|---|---|
| 0.04% dye 23 in PS | 715 | 4.2 | 6.8 | 88.7 |
| 0.06% dye 23 in PC | 715 | 3.9 | 6.5 | 90.5 |
| 0.04% dye 24 in PC | 688 | 4.4 | 10.5 | 42.0 |
| 0.04% dye 24 in PS | 680 | 4.1 | 8.0 | 51.0 |
| 0.04% dye 24 in PS | 720 | 4.3 | 8.5 | 51.0 |

Frequency Converter Films with Two Dyes

Frequency converter films with two dyes (1 and 9) were prepared and measured. The films C1-C5 were prepared by extrusion, C6 and C7 by doctor-blading. The following table 3 summarizes the concentration of the components which were mixed in PC as matrix polymer.

TABLE 3

| Example | dye 9 [weight %] | dye 1 [weight %] | $TiO_2$ [weight %] | Film thickness [µm] |
|---|---|---|---|---|
| C1 | 0.0115 | 0.0036 | 0.25 | 240 |
| C2 | 0.0136 | 0.0042 | 0.25 | 270 |
| C3 | 0.0136 | 0.0042 | 0.25 | 300 |
| C4 | 0.0136 | 0.0042 | 0.25 | 300 |
| C5 | 0.0156 | 0.0048 | 0.25 | 300 |
| C6 | 0.129 | 0.009 | 0.5 | 137 |
| C7 | 0.140 | 0.009 | 0.5 | 137 |

LED 1 and LED 2, respectively, were used as light source for pumping the converter film.

The cool-white LEDs 1 with CCT of 9108 K were inserted into a transparent plastic tube of T8 format. Rectangular pieces of the converter films are shaped to semitubes and inserted into the tube. The converter film therefore covers the cool white LEDs.

LED 2: A down-light equipped with blue LEDs (450 nm) inside a mixing chamber are totally covered by a planar, circular platelet of the converter film with 61 mm diameter.

The light irradiated from the surface of these devices was subjected to the photometric measurement, where the total light irradiated from the device was measured by a photometric measurement tool equipped with an integrating sphere, ISP 500-100, and the CCD detector CAS 140CT-156 (from Instrument Systems, Munich). The measured radiance spectrum was used to derive all relevant photometric data, such as CCT (=correlated color temperature) in Kelvin [K], distance of color point from Planck-curve (BBL), average color rendering index CRI and color rendering index for reference color no. 9 (R9), efficacy data, etc. The results are given in the table 4 below, C1-C5 was optimized and measured with cool-white LED 1, C6 and C7 with blue LED 2. All measurements were performed at room temperature.

TABLE 4

| | CIE-x | CIE-y | CIE-u' | CCT [K] | distance from BBL (duv) | average CRI ($R_a$) | R9 |
|---|---|---|---|---|---|---|---|
| LED 1 | 0.2933 | 0.2785 | 0.2038 | 9108 | −1.34E−02 | 77.66 | 28.76 |
| C1 | 0.4326 | 0.4023 | 0.2486 | 3059 | 1.18E−04 | 90.07 | 33.40 |
| C2 | 0.4575 | 0.4082 | 0.2620 | 2714 | −6.75E−04 | 92.55 | 38.84 |
| C3 | 0.4680 | 0.4105 | 0.2678 | 2590 | −6.40E−04 | 93.31 | 42.76 |
| C4 | 0.4695 | 0.4106 | 0.2687 | 2570 | −6.83E−04 | 93.19 | 43.42 |
| C5 | 0.4786 | 0.4100 | 0.2749 | 2454 | −1.35E−03 | 92.23 | 47.24 |
| LED 2 | 0.1539 | 0.0235 | 0.2069 | | | | |
| C6 | 0.4277 | 0.4014 | 0.2457 | 3140 | 3.06E−04 | 93.65 | 67.54 |
| C7 | 0.4335 | 0.4022 | 0.2491 | 3044 | −2.65E−04 | 93.30 | 66.25 |

For these frequency converter films, the decay time was measured as described above (it is not possible to determine the fluorescence quantum yield for an individual colorant in a mixture and thus the emissive lifetime $\tau_0$ cannot be calculated). Small peak maximum changes in the fluorescence spectra were observed for the different colorant concentrations. The emission was measured both at the maximum of the yellow and the red dye, respectively. As the red dye is also excited by re-absorption from the yellow emission, its decay time is longer. The results are shown in table 5.

TABLE 5

| | Emission maximum [nm] | $\tau_v$ [ns] |
|---|---|---|
| C1 | 530 | 5.3 |
| | 600 | 7.2 |
| C2 | 520 | 5.4 |
| | 600 | 7.7 |
| C3 | 520 | 5.4 |
| | 600 | 7.8 |
| C4 | 520 | 5.3 |
| | 600 | 7.8 |
| C5 | 520 | 5.4 |
| | 600 | 8.0 |
| C6 | 518 | 5.4 |
| | 600 | 6.4 |
| C7 | 518 | 5.4 |
| | 600 | 6.5 |

Lifetime of the Colorants Under Irradiation Conditions

The photostability of the colorants in polymer matrix of the frequency converter used according to the invention were investigated by measuring the T80 values. The measurements were performed at room temperature. T80 in days is the time that the product of quantum yield and absorption decreases to 80% of its initial value. To this end, PC-polymer-films doped with fluorescent colorants according to the present invention and 0.5% by weight of $TiO_2$ were prepared as described above. For comparison purpose, a frequency converter comprising Super Yellow and 0.5% by weight of $TiO_2$ in PS was prepared by doctor blading, since it was not possible to prepare a frequency converter comprising Super Yellow in PC. The concentration of Super Yellow was 1%, film thickness: ca 20 μm. The concentration of the dyes 1 to 22 and of comparison colorant Super Yellow was chosen in a way so that they absorb about 50% of incoming blue light. The concentration of the dyes 23 and 24 was chosen in a way so that they absorb about 50% of incoming light at at 635 nm.

Dyes 1 to 22 and comparison colorant Super Yellow were illuminated with blue light illumination (450 nm) at 120 mW/cm², whereas dyes 23 and 24 were illuminated with white light at 100 mW/cm² as their absorption at 450 nm is negligible. The results are summarized in table 6.

TABLE 6

| Frequency converter | T80 [days] |
|---|---|
| 0.036% dye 1 in PC | 252 |
| 0.01% dye 2 in PC in N2 atmosphere | 9 |
| 0.03% dye 3 in PC in N2 atmosphere | >30 |
| 0.04% dye 4 in PC | 32 |
| 0.04% dye 5 in PC in N2 atmosphere | >30 |
| 0.03% dye 6 in PC | 255 |
| 0.03% dye 7 in PC in N2 atmosphere | >15 |
| 0.02% dye 8 in PC | 8 |
| 0.015% dye 9 in PC | 20 |
| 0.01% dye 10 in PC in N2 atmosphere | 10 |
| 0.04% dye 11 in PC | 15 |
| 0.01% dye 12 in PC | 24 |
| 0.02% dye 13 in PC | 6 |
| 0.048% dye 14 in PC | 200 |
| 0.04% dye 15 in PC | 211 |
| 0.019% dye 17 in PC | 8 |
| 0.123% dye 18 in PC | 14 |
| 0.022% dye 19 in PC | 14 |
| 0.008% dye 21 in PC | 8 |
| 0.034% dye 22 in PC | 20 |
| 0.06% dye 23 in PC | >500 |
| 0.04% dye 24 in PC | >500 |
| 1% Super Yellow# in PS | <1 |

Comparison, Super Yellow; PDY132, available from Aldrich (https://www.sigmaaldrich-.com/catalog/product/aldrich/900438?lang=de&region=DE), conjugated copolymer of poly para-phenylene vinylene As can be seen from table 6, the colorants used according to the present invention have a long lifetime under real irradiation conditions, since the measurements were done in films and therefore are real application values. The T80 values are much longer for the colorants used according to the present invention than for the prior art colorant Super Yellow.

The invention claimed is:

1. A transmitter for transmitting data and for emitting electromagnetic radiation in a visible spectral range, said transmitter comprising:
a radiation source for generating and emitting a first electromagnetic radiation and
a modulator adapted to modulate the first electromagnetic radiation depending on the data to be transmitted and generate a modulated first electromagnetic radiation,
wherein the transmitter further comprises
a frequency converter for converting at least a part of the modulated first electromagnetic radiation into a modulated second electromagnetic radiation, said modulated second electromagnetic radiation being different from the modulated first electromagnetic radiation,
wherein the frequency converter comprises a polymeric matrix material and at least one organic fluorescent colorant B selected from:
(B1) a naphthoylbenzimidazole compound of formula (I)

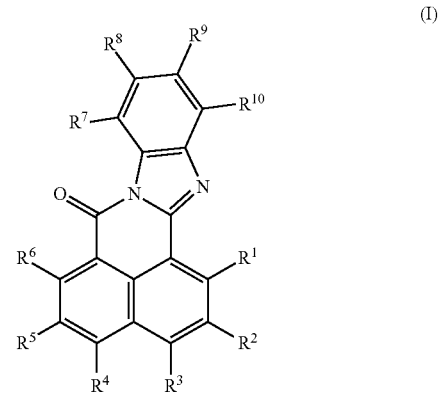

wherein
at least one of the radicals $R^1$, $R^2$, $R^3$, $R^4$, $R^5$, $R^6$, $R^7$, $R^8$, $R^9$ and $R^{10}$ independently of each other is aryl which comprises one, two or three cyano groups and 0, 1, 2, 3 or 4 substituents $R^{Ar}$ and the remaining radicals $R^1$, $R^2$, $R^3$, $R^4$, $R^5$, $R^6$, $R^7$, $R^8$, $R^9$ and $R^{10}$ independently of each other are selected from hydrogen or aryl which is unsubstituted or carries 1, 2, 3, 4 or 5 substituents $R^{Ar}$, where
$R^{Ar}$ independently of each other and independently of each occurrence is selected from halogen,
$C_1$-$C_{30}$-alkyl, $C_2$-$C_{30}$-alkenyl, $C_2$-$C_{30}$-alkynyl, where the three latter radicals are unsubstituted or comprise one or more $R^a$ groups,
$C_3$-$C_8$-cycloalkyl, 3- to 8-membered heterocyclyl, where the two latter radicals are unsubstituted or comprise one or more $R^b$ groups,
aryl or heteroaryl, where the two latter radicals are unsubstituted or comprise one or more $R^c$ groups,
where
$R^a$ independently of each other and independently of each occurrence is selected from cyano, halogen, $C_3$-$C_8$- cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^b$ independently of each other and independently of each occurrence is selected from cyano, halogen, $C_1$-$C_{18}$-alkyl, $C_3$-$C_8$-cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^c$ independently of each other and independently of each occurrence is selected from cyano, halogen, $C_1$-$C_{18}$-alkyl, $C_3$-$C_8$-cycloalkyl, 3- to 8-membered heterocyclyl, aryl or heteroaryl, where $C_3$-$C_8$-cycloalkyl, 3- to 8-membered heterocyclyl are unsubstituted or bear one or more $R^{b1}$ groups, and where aryl and heteroaryl are unsubstituted or bear one or more $R^{c1}$ groups;

$R^{b1}$ independently of each other and independently of each occurrence is selected from halogen, $C_1$-$C_{18}$-alkyl or $C_1$-$C_{18}$-haloalkyl, $R^{c1}$ independently of each other and independently of each occurrence is selected from halogen, $C_1$-$C_{18}$-alkyl or $C_1$-$C_{18}$-haloalkyl;

and mixtures thereof, (B2) a cyanated naphthoylbenzimidazole compound of formula (II)

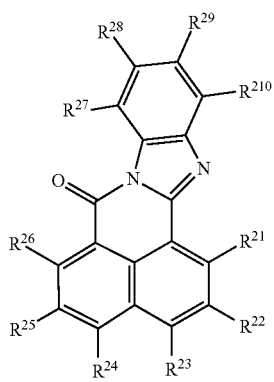

(II)

wherein $R^{21}$, $R^{22}$, $R^{23}$, $R^{24}$, $R^{25}$, $R^{26}$, $R^{27}$, $R^{28}$, $R^{29}$ and $R^{210}$ are each independently hydrogen, cyano or aryl which is unsubstituted or has one or more identical or different substituents $R^{2Ar}$, where each $R^{2Ar}$ is independently selected from cyano, hydroxyl, mercapto, halogen, $C_1$-$C_{20}$-alkoxy, $C_1$-$C_{20}$-alkylthio, nitro, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, $C_1$-$C_{30}$-alkyl, $C_2$-$C_{30}$-alkenyl, $C_2$-$C_{30}$-alkynyl, where the three latter radicals are unsubstituted or bear one or more $R^{2a}$ groups, $C_3$-$C_8$-cycloalkyl, 3- to 8-membered heterocyclyl, where the two latter radicals are unsubstituted or bear one or more $R^{2b}$ groups, aryl, U-aryl, heteroaryl or U-heteroaryl, where the four latter radicals are unsubstituted or bear one or more $R^{2b}$ groups, where each $R^{2a}$ is independently selected from cyano, hydroxyl, mercapto, halogen, $C_1$-$C_{20}$-alkoxy, $C_1$-$C_{20}$-alkylthio, nitro, —$NR^{2Ar2}R^{Ar3}$, —$NR^{2Ar2}COR^{2Ar3}$, —$CONR^{2Ar2}R^{Ar3}$, —$SO_2NR^{2Ar2}R^{Ar3}$, —$COOR^{2Ar2}$, —$SO_3R^{2Ar2}$, $C_3$-$C_8$-cycloalkyl, 3- to 8-membered heterocyclyl, aryl or heteroaryl, where the cycloalkyl, heterocyclyl, aryl and heteroaryl radicals are unsubstituted or bear one or more $R^{2b}$ groups, and where 2 radicals $R^{2a}$ bound at the same carbon atom may form together a group =O;

each $R^{2b}$ is independently selected from cyano, hydroxyl, mercapto, halogen, $C_1$-$C_{20}$-alkoxy, $C_1$-$C_{20}$-alkylthio, nitro, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, $C_1$-$C_{18}$-alkyl, $C_2$-$C_{18}$-alkenyl, $C_2$-$C_{18}$-alkynyl, $C_3$-$C_8$-cycloalkyl, 3- to 8-membered heterocyclyl, aryl or heteroaryl, where the four latter radicals are unsubstituted or bear one or more $R^{2b1}$ groups, and where 2 radicals $R^{2b}$ bound at the same carbon atom may form together a group =O;

each $R^{2b1}$ is independently selected from cyano, hydroxyl, mercapto, nitro, halogen, —$NR^{2Ar2}R^{2Ar3}$, —$NR^{2Ar2}COR^{2Ar3}$, —$CONR^{2Ar2}R^{2Ar3}$, —$SO_2NR^{2Ar2}R^{2Ar3}$, —$COOR^{2Ar2}$, —$SO_3R^{2Ar2}$, —$SO_3R^{2Ar2}$, $C_1$-$C_{18}$-alkyl, $C_2$-$C_{18}$-alkenyl, $C_2$-$C_{18}$-alkynyl, $C_1$-$C_{12}$-alkoxy, or $C_1$-$C_{12}$-alkylthio, and where 2 radicals $R^{2b1}$ bound at the same carbon atom may form together a group =O;

U is an —O—, —S—, —$NR^{2Ar1}$—, —CO—, —SO— or —$SO_2$— moiety;

$R^{2Ar1}$, $R^{2Ar2}$, $R^{2Ar3}$ are each independently hydrogen, $C_1$-$C_{18}$-alkyl, 3- to 8-membered cycloalkyl, 3- to 8-membered heterocyclyl, aryl or heteroaryl, where alkyl is unsubstituted or bears one or more $R^{2a}$ groups, where 3- to 8-membered cycloalkyl, 3- to 8-membered heterocyclyl, aryl and heteroaryl are unsubstituted or bear one or more $R^{2b}$ groups;

with the proviso that the compound of formula (II) comprises at least one cyano group, and mixtures thereof, (B3) a cyanated perylene compound of formula (III)

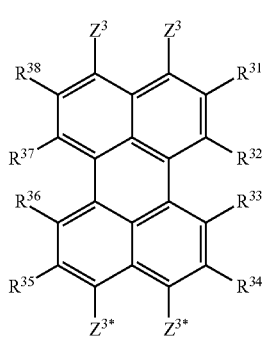

(III)

in which one of the $Z^3$ substituents is cyano and the other $Z^3$ substituent is $CO_2R^{39}$, $CONR^{310}R^{311}$, $C_1$-$C_{18}$-alkyl, $C_2$-$C_{18}$-alkenyl, $C_2$-$C_{18}$-alkynyl, $C_3$-$C_{12}$-cycloalkyl or $C_6$-$C_{14}$-aryl, where $C_1$-$C_{18}$-alkyl, $C_2$-$C_{18}$-alkenyl, $C_2$-$C_{18}$-alkynyl are unsubstituted or bear one or more identical or different $Z^{3a}$ substituents, $C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents;

one of the $Z^{3*}$ substituents is cyano and the other $Z^{3*}$ substituent is $CO_2R^{39}$, $CONR^{310}R^{311}$, $C_1$-$C_8$-alkyl, $C_2$-$C_{18}$-alkenyl, $C_2$-$C_{18}$-alkynyl, $C_3$-$C_{12}$-cycloalkyl or $C_6$-$C_{14}$-aryl, where $C_1$-$C_{18}$-alkyl, $C_2$-$C_{18}$-alkenyl, $C_2$-$C_{18}$-alkynyl are unsubstituted or bear one or more identical or different $Z^{3a}$ substituents, $C_3$-$C_{12}$-cycloalkyl is unsubstituted or bears one or more identical or different $Z^{3b}$ substituents, and $C_6$-$C_{14}$-aryl is unsubstituted or bears one or more identical or different $Z^{3Ar}$ substituents;

$R^{31}$, $R^{32}$, $R^{33}$, $R^{34}$, $R^{35}$, $R^{36}$, $R^{37}$ and $R^{38}$ are each independently selected from hydrogen, cyano, bromine or chlorine, with the proviso that 1, 2, 3, 4, 5, 6, 7 or 8 of the $R^{31}$, $R^{32}$, $R^{33}$, $R^{34}$, $R^{35}$, $R^{36}$, $R^{37}$ or $R^{38}$ substituents are cyano;

where $R^{39}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

$R^{310}$ and $R^{311}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, where $C_1$-$C_{10}$-alkyl, $C_2$-$C_{10}$-alkenyl, $C_2$-$C_{10}$-alkynyl are unsubstituted or bear one or more identical or different $R^{3a}$ substituents, $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3a}$ is independently halogen, hydroxyl, $NR^{310a}R^{311a}$, $C_1$-$C_{10}$-alkoxy, $C_1$-$C_{10}$-haloalkoxy, $C_1$-$C_{10}$-alkylthio, $C_3$-$C_{12}$-cycloalkyl, $C_6$-$C_{14}$-aryl, $C(=O)R^{39a}$;

$C(=O)OR^{39a}$ or $C(O)NR^{310a}R^{311a}$ where $C_3$-$C_{12}$-cycloalkyl is unsubstituted or bears one or more identical or different $R^{3b}$ substituents and $C_6$-$C_{14}$-aryl is unsubstituted or bears one or more identical or different $R^{3Ar}$ substituents;

each $Z^{3b}$ and each $Z^{3Ar}$ is independently halogen, hydroxyl, $NR^{310a}R^{311a}$, $C_1$-$C_{10}$-alkyl, $C_1$-$C_{10}$-alkoxy, $C_1$-$C_{10}$-haloalkoxy, $C_1$-$C_{10}$-alkylthio, $C(=O)R^{39a}$; $C(=O)OR^{39a}$ or $C(O)NR^{310a}R^{311a}$;

each $R^{3a}$ is independently halogen, hydroxyl, $C_1$-$C_{10}$-alkoxy, $C_3$-$C_{12}$-cycloalkyl or $C_6$-$C_{14}$-aryl;

each $R^{3b}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

each $R^{3Ar}$ is independently halogen, hydroxyl, $C_1$-$C_{10}$-alkyl, $C_1$-$C_{10}$-alkoxy, $C_1$-$C_{10}$-haloalkoxy, $C_1$-$C_{10}$-alkylthio, $C_2$-$C_{10}$-alkenyl, $C_2$-$C_{10}$-alkynyl, $C_3$-$C_{12}$-cycloalkyl or $C_6$-$C_{14}$-aryl;

$R^{39a}$ is hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl; and $R^{310a}$, $R^{311a}$ are each independently hydrogen, $C_1$-$C_{10}$-alkyl, $C_2$-$C_{10}$-alkenyl, $C_2$-$C_{10}$-alkynyl, $C_3$-$C_{12}$-cycloalkyl or $C_6$-$C_{14}$-aryl, and mixtures thereof;

(B4) a cyanated compound of formula (IV)

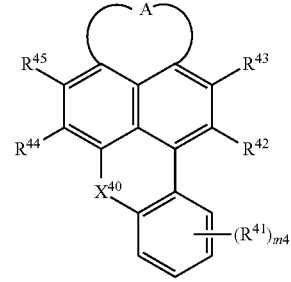

(IV)

wherein m4 is 0, 1, 2, 3 or 4;

each $R^{41}$ independently from each other is selected from bromine, chlorine, cyano, $-NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy or $C_6$-$C_{24}$-aryl-$C_1$-$C_{10}$-alkylene, where the rings of cycloalkyl, heterocycloalkyl, heteroaryl, aryl, aryloxy in the six last-mentioned radicals are unsubstituted or substituted with 1, 2, 3, 4 or 5 identical or different radicals $R^{41a}$ and where $C_1$-$C_{24}$-alkyl, $C_1$-$C_{24}$-haloalkyl, $C_1$-$C_{24}$-alkoxy, and the alkylene moiety of $C_6$-$C_{24}$-aryl-$C_1$-$C_{10}$-alkylene may be interrupted by one or more groups selected from O, S or $NR^{4c}$;

at least one of the radicals $R^{42}$, $R^{43}$, $R^{44}$ and $R^{45}$ is CN, and the remaining radicals, independently from each other, are selected from hydrogen, chlorine or bromine;

$X^{40}$ is O, S, SO or $SO_2$;

A is a diradical selected from diradicals of the general formulae (A.1), (A.2), (A.3), or (A.4)

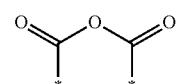

(A.1)

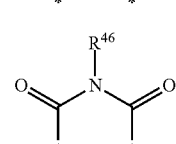

(A.2)

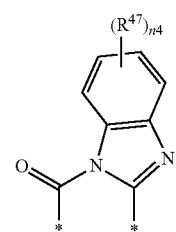

(A.3)

-continued

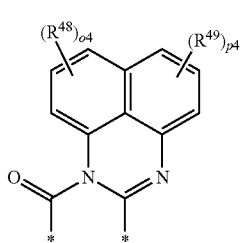
(A.4)

wherein
* in each case denotes the point of attachments to the remainder of the molecule;
n4 is 0, 1, 2, 3 or 4;
o4 is 0, 1, 2 or 3;
p4 is 0, 1, 2 or 3;
$R^{46}$ is hydrogen, $C_1$-$C_{24}$-alkyl, $C_1$-$C_{24}$-haloalkyl, $C_3$-$C_{24}$-cycloalkyl, $C_6$-$C_{24}$-aryl or $C_6$-$C_{24}$-aryl-$C_1$-$C_{10}$-alkylene, where the rings of cycloalkyl, aryl, and aryl-alkylene in the three last-mentioned radicals are unsubstituted or substituted with 1, 2, 3, 4 or 5 identical or different radicals $R^{46a}$, and where $C_1$-$C_{24}$-alkyl, $C_1$-$C_{24}$-haloalkyl and the alkylene moiety of $C_6$-$C_{24}$-aryl-$C_1$-$C_{10}$-alkylene may be interrupted by one or more heteroatoms or heteroatomic groups selected from O, S and $NR^{4c}$;
each $R^{47}$ independently from each other is selected from bromine, chlorine, cyano, —$NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{47a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S and $NR^{4c}$;
each $R^{48}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{48a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S or $NR^{4c}$;
each $R^{49}$ independently from each other is selected from bromine, chlorine, cyano, $NR^{4a}R^{4b}$, $C_1$-$C_{24}$-alkyl, $C_1$-$C_{24}$-haloalkyl, $C_1$-$C_{24}$-alkoxy, $C_1$-$C_{24}$-haloalkoxy, $C_3$-$C_{24}$-cycloalkyl, heterocycloalkyl, heteroaryl, $C_6$-$C_{24}$-aryl, $C_6$-$C_{24}$-aryloxy, $C_6$-$C_{24}$-aryl-$C_1$-$C_{10}$-alkylene, where the rings of cycloalkyl, heterocycloalkyl, heteroaryl, aryl and aryl-alkylene in the six last-mentioned radicals are unsubstituted or substituted with 1, 2, 3, 4 or 5 identical or different radicals $R^{49a}$ and where $C_1$-$C_{24}$-alkyl, $C_1$-$C_{24}$-haloalkyl, $C_1$-$C_{24}$-alkoxy, $C_1$-$C_{24}$-haloalkoxy, and the alkylene moiety of $C_6$-$C_{24}$-aryl-$C_1$-$C_{10}$-alkylene may be interrupted by one or more groups selected from O, S or $NR^{4c}$;

$R^{41a}$, $R^{46a}$, $R^{47a}$, $R^{48a}$, $R^{49a}$ are independently of one another selected from $C_1$-$C_{24}$-alkyl, $C_1$-$C_{24}$-fluoroalkyl, $C_1$-$C_{24}$-alkoxy, fluorine, chlorine or bromine;
$R^{4a}$, $R^{4b}$, $R^{4c}$ are independently of one another are selected from hydrogen, $C_1$-$C_{20}$-alkyl, $C_3$-$C_{24}$-cycloalkyl, heterocycloalkyl, heteroaryl or $C_6$-$C_{24}$-aryl;
and mixtures thereof, (B5) a benz(othi)oxanthene compound of formula (V)

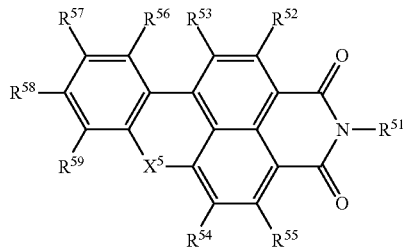
(V)

wherein
$X^5$ is oxygen or sulfur;
$R^{51}$ is $C_1$-$C_{24}$-alkyl which is unsubstituted or substituted by one or more $R^{51a}$ groups or $R^{51}$ is phenyl which is unsubstituted or comprises 1, 2, 3, 4 or 5 substituents selected from halogen, $R^{511}$, $OR^{552}$, $NHR^{552}$ and $NR^{552}R^{557}$;
$R^{51a}$ is independently of each other and independently of each occurrence selected from cyano, halogen, $C_3$-$C_8$-cycloalkyl, 3- to 8-membered heterocyclyl, aryl or heteroaryl, where $C_3$-$C_8$-cycloalkyl, 3- to 8-membered heterocyclyl, aryl and heteroaryl are unsubstituted or bear one or more substituents selected from halogen, $C_1$-$C_{18}$-alkyl and $C_1$-$C_{18}$-haloalkyl;
$R^{52}$, $R^{53}$, $R^{54}$, $R^{55}$, $R^{56}$, $R^{57}$, $R^{58}$ and $R^{59}$ are independently of each other selected from hydrogen, halogen, $R^{553}$, $OR^{553}$, $NHR^{553}$ or $NR^{553}R^{554}$;
wherein
$R^{511}$ is selected from $C_1$-$C_{20}$-alkyl, $C_6$-$C_{24}$-aryl or heteroaryl;
$R^{552}$ and $R^{557}$ are independently of each other selected from $C_1$-$C_{18}$-alkyl, $C_6$-$C_{24}$-aryl or heteroaryl; and
$R^{553}$ and $R^{554}$ are independently of each other selected from $C_1$-$C_{18}$-alkyl, $C_6$-$C_{24}$-aryl or heteroaryl;
and mixtures thereof, (B6) a benzimidazoxanthenisoquinoline compound of formulae (VIA) or (VIB)

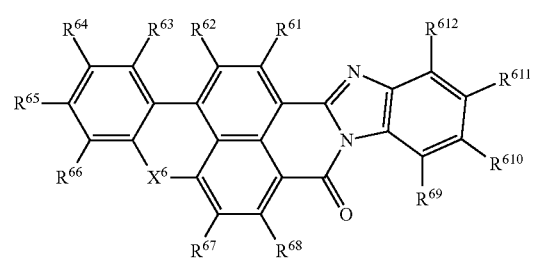
(VIA)

-continued (VIB)

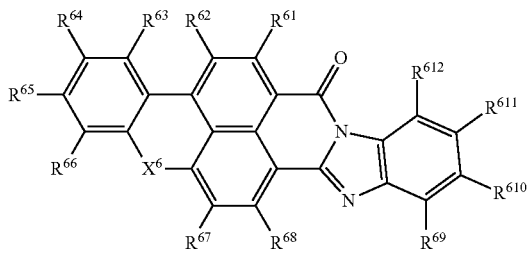

wherein

X⁶ is oxygen or sulfur;

$R^{61}, R^{62}, R^{63}, R^{64}, R^{65}, R^{66}, R^{67}, R^{68}, R^{69}, R^{610}, R^{611}$ and $R^{612}$ are independently of each other selected from hydrogen, halogen, $R^{661}$, $OR^{661}$, $NR^{661}$ or $NR^{661}R^{662}$;

wherein each $R^{661}$ is selected from $C_1$-$C_{18}$-alkyl, $C_6$-$C_{24}$-aryl or heteroaryl; and each $R^{662}$ is selected from $C_1$-$C_{18}$-alkyl, $C_6$-$C_{24}$-aryl or heteroaryl;

and mixtures thereof;

(B7) fluorescent compound comprising at least one structural unit of formula (VII)

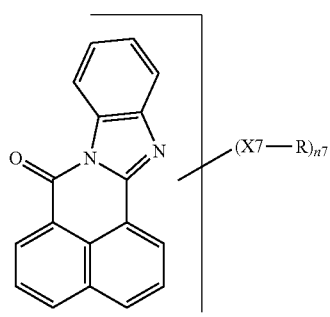

(VII)

where one or more CH groups of the six-membered ring of the benzimidazole structure shown may be replaced by nitrogen and where the symbols are each defined as follows:

n7 is a number from 0 to (10-p7) for each structural unit of the formula (VII);

where p7 is the number of CH units which have been replaced by nitrogen in the six-membered ring of the benzimidazole structure shown;

X7 is a chemical bond, O, S, SO, SO₂, NR⁷¹; and

R is an aliphatic radical, cycloaliphatic radical, aryl, heteroaryl, each of which may bear substituents, an aromatic or heteroaromatic ring or ring system, each of which is fused to other aromatic rings of the structural unit of the formula (VII), is F, Cl, Br, CN, H when X7 is not a chemical bond;

where two R radicals may be joined to give one cyclic radical and where X7 and R, when n7>one, may be the same or different;

$R^{71}$ is each independently hydrogen, $C_1$-$C_{18}$-alkyl or cycloalkyl, the carbon chain of which may comprise one or more —O—, —S—, —CO—, —SO— and/or —SO₂-moieties and which may be mono- or polysubstituted;

aryl or heteroaryl which may be mono- or polysubstituted;

and mixtures thereof, (B8) a perylene compound of formulae (VIII) or (IX)

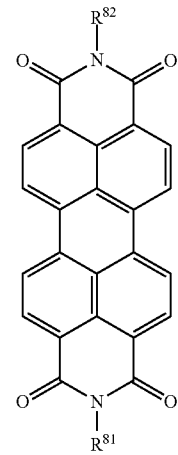

(VIII)

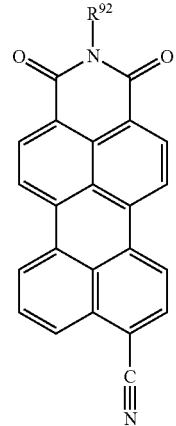

(IX)

where $R^{81}$, $R^{82}$ are each independently $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{10}$-alkyl;

$R^{92}$ is $C_1$-$C_3O$-alkyl, $C_3$-$C_8$-cycloalkyl, aryl, heteroaryl, aryl-$C_1$-$C_{10}$-alkylene, where the aromatic ring in the three latter radicals is unsubstituted or mono- or polysubstituted by $C_1$-$C_{10}$-alkyl;

(B9) a naphthalene monoimide compound of formula (X)

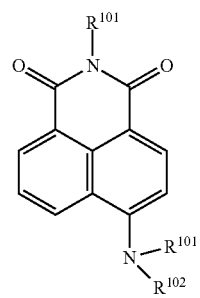

(X)

wherein each $R^{101}$ independently of each other is hydrogen, $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{10}$-alkyl;

$R^{102}$ is hydrogen, $C_1$-$C_{30}$-alkyl, $C_2$-$C_{30}$-alkyl which is interrupted by one or more oxygen, $C_3$-$C_8$-cycloalkyl, $C_6$-$C_{10}$-aryl, heteroaryl, $C_6$-$C_{10}$-aryl-$C_1$-$C_{10}$-alkylene, where the aromatic ring in the three latter radicals is unsubstituted or mono- or polysubstituted by $C_1$-$C_{10}$-alkyl;

(B10) 7-(diethylamino)-3-(5-methylbenzo[d]oxazol-2-yl)-2H-chromen-2-one;

(B11) a perylene compound of formulae (XIA) or (XIB)

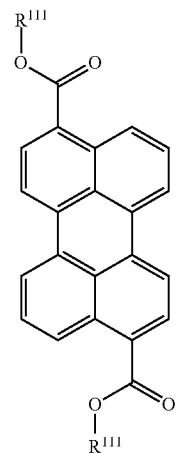

(XIA)

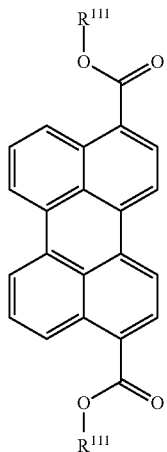

(XIB)

wherein each $R^{111}$ independently of each other is $C_1$-$C_{18}$ alkyl, $C_4$-$C_8$ cycloalkyl, which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl;

and mixtures thereof;

(B12) a cyanated perylene compound of formulae (XIIA) or (XIIB)

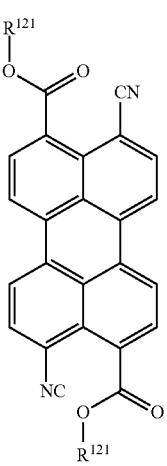

(XIIA)

-continued

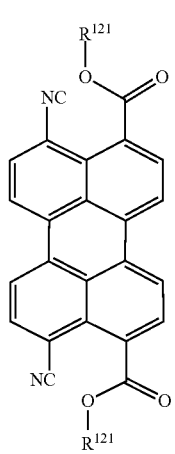

(XIIB)

wherein
each $R^{121}$ independently of each other is $C_1$-$C_{18}$ alkyl, $C_4$-$C_8$ cycloalkyl, which may be mono- or polysubstituted by halogen or by linear or branched $C_1$-$C_{18}$ alkyl, or phenyl or naphthyl which may be mono- or polysubstituted by halogen or by linear or branched $C_1$-$C_{18}$ alkyl;
and mixtures thereof,
(B13) a perylene bisimide compound of formula (XIII)

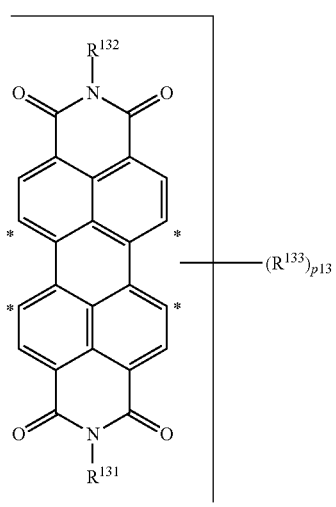

(XIII)

wherein
p13 is 1, 2, 3 or 4;
$R^{131}$ and $R^{132}$ independently of each other are $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl,
$C_2$-$C_2O$-alkyl, which is interrupted by one or more oxygen,
$C_3$-$C_5$-cycloalkyl, which is unsubstituted or substituted by 1, 2 or 3 $C_1$-$C_{10}$-alkyl, or
$C_6$-$C_{10}$-aryl which is unsubstituted or substituted by 1, 2 or 3 $C_1$-$C_{10}$-alkyl;
each $R^{133}$ independently of each other is fluorine, chlorine, $C_1$-$C_{16}$-alkyl, $C_2$-$C_{16}$-alkyl interrupted by one or more oxygen, $C_1$-$C_{16}$-alkoxy, $C_6$-$C_{10}$-aryloxy which is unsubstituted or mono- or polysubstituted by fluorine, chlorine, $C_1$-$C_{16}$-alkyl, $C_2$-$C_{16}$-alkyl interrupted by one or more oxygen, $C_1$-$C_{16}$-alkoxy or $C_6$-$C_{10}$-aryl, which is unsubstituted or substituted by 1, 2 or 3 radicals selected from $C_1$-$C_6$-alkyl, $C_1$-$C_6$-alkoxy-$C_1$-$C_6$-alkyl and $C_1$-$C_6$-alkoxy,
where the $R^{133}$ radicals are at the positions indicated by *;
and mixtures thereof,
(B14) a perylene compound of formula (XIV)

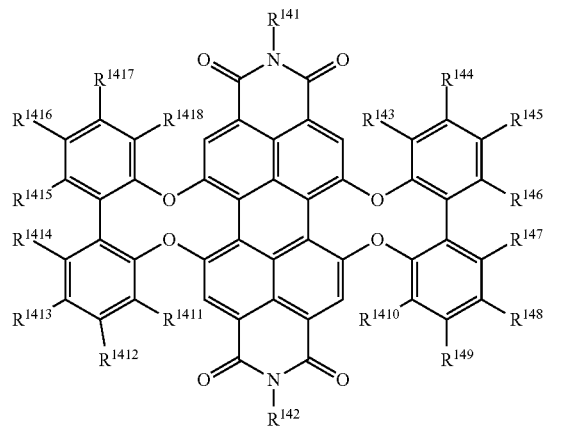

(XIV)

wherein
$R^{141}$ and $R^{142}$, independently of each other, are selected from hydrogen,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkyloxy, $C_6$-$C_{24}$-aryl or $C_6$-$C_{24}$-aryloxy;
$R^{143}$, $R^{144}$, $R^{145}$, $R^{146}$, $R^{147}$, $R^{148}$, $R^{149}$, $R^{1410}$, $R^{1411}$, $R^{1412}$, $R^{1413}$, $R^{1414}$, $R^{1415}$, $R^{1416}$, $R^{1417}$ and $R^{1418}$ independently of each other, are selected from hydrogen, halogen, cyano, hydroxyl, mercapto, nitro, —N$E^{141}E^{142}$, —NR$^{141}$COR$^{A142}$, —CONR$^{Ar141}$R$^{Ar142}$, —SO$_2$NR$^{A141}$R$^{A142}$, —COOR$^{Ar141}$, —SO$_3$R$^{Ar142}$,
in each case unsubstituted or substituted $C_1$-$C_{30}$-alkyl, polyalkyleneoxy, $C_1$-$C_{30}$-alkoxy, $C_1$-$C_{30}$-alkylthio, $C_3$-$C_{20}$-cycloalkyl, $C_3$-$C_{20}$-cycloalkoxy, $C_6$-$C_{24}$-aryl, $C_6$-$C_{24}$-aryloxy or $C_6$-$C_{24}$-arylthio,
where $R^{143}$ and $R^{144}$, $R^{144}$ and $R^{145}$, $R^{145}$ and $R^{146}$, $R^{146}$ and $R^{147}$, $R^{147}$ and $R^{148}$, $R^{148}$ and $R^{149}$, $R^{149}$ and $R^{1410}$, $R^{1411}$ and $R^{1412}$, $R^{1412}$ and $R^{1413}$, $R^{1413}$ and $R^{1414}$, $R^{1414}$ and $R^{1415}$, $R^{1415}$ and $R^{1416}$, $R^{1416}$ and $R^{1417}$ and/or $R^{1417}$ and $R^{1418}$ together with the carbon atoms of the biphenylyl moiety to which they are bonded, may also form a further fused aromatic or non-aromatic ring system wherein the fused ring system is unsubstituted or substituted;
where
$E^{141}$ and $E^{142}$, independently of each other, are hydrogen, unsubstituted or substituted $C_1$-$C_{18}$-alkyl, unsubstituted or substituted $C_2$-$C_{18}$-alkenyl, unsubstituted or substituted $C_2$-$C_{18}$-alkynyl, unsubstituted or substituted $C_3$-$C_{20}$-cycloalkyl or unsubstituted or substituted $C_6$-$C_{10}$-aryl;
$R^{Ar141}$ and $R^{Ar142}$, each independently of each other, are hydrogen, unsubstituted or substituted $C_1$-$C_{18}$-alkyl, unsubstituted or substituted $C_3$-$C_{20}$-cycloalkyl, unsubstituted or substituted heterocyclyl, unsubstituted or substituted $C_6$-$C_{20}$-aryl or unsubstituted or substituted heteroaryl;
and mixtures thereof
(B15) a compound of the formula (XV)

which is unsubstituted or substituted by 1, 2 or 3 radicals selected from $C_1$-$C_6$-alkyl, $C_1$-$C_6$-alkoxy-$C_1$-$C_6$-alkyl and $C_1$-$C_6$-alkoxy,
where the $R^{163}$ radicals are at the positions indicated by *;
and mixtures thereof.

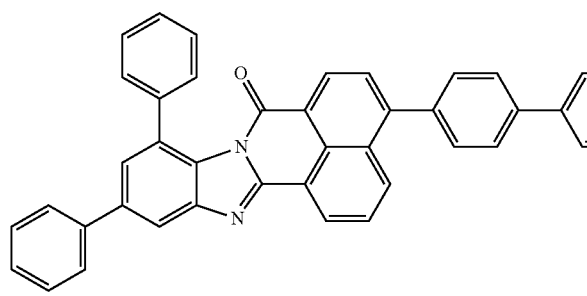

(XV)

(B16) a terrylene bisimide compound of formula (XVI)

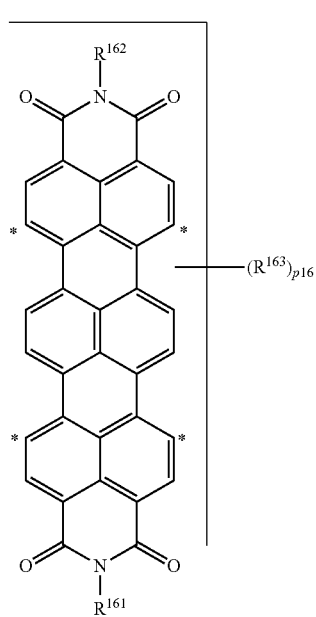

(XVI)

wherein
p16 is 0, 1, 2, 3 or 4;
$R^{161}$ and $R^{162}$ independently of each other are $C_1$-$C_{10}$-alkyl, which is unsubstituted or substituted by $C_6$-$C_{10}$-aryl which in turn is unsubstituted or substituted by 1, 2 or 3 $C_1$-$C_{10}$-alkyl,
$C_2$-$C_{20}$-alkyl, which is interrupted by one or more oxygen,
$C_3$-$C_5$-cycloalkyl, which is unsubstituted or substituted by 1, 2 or 3 $C_1$-$C_{10}$-alkyl, or
$C_6$-$C_{10}$-aryl which is unsubstituted or substituted by 1, 2 or 3 $C_1$-$C_{10}$-alkyl;
$R^{163}$ if present, independently of each other is fluorine, chlorine, $C_1$-$C_{16}$-alkyl, $C_2$-$C_{16}$-alkyl interrupted by one or more oxygen, $C_1$-$C_{16}$-alkoxy, $C_6$-$C_{10}$-aryloxy which is unsubstituted or mono- or polysubstituted by fluorine, chlorine, $C_1$-$C_{16}$-alkyl, $C_2$-$C_{16}$-alkyl interrupted by one or more oxygen, $C_1$-$C_{16}$-alkoxy or $C_6$-$C_{10}$-aryl, 2. The transmitter of claim 1, wherein the first electromagnetic radiation comprises at least one wavelength in a spectral range between 350 nm and 500 nm.

3. The transmitter of claim 1, wherein the radiation source is a light emitting diode (LED) or a laser diode.

4. The transmitter of claim 3, wherein the radiation source is a blue LED with a center wavelength of emission between 400 nm and 480 nm.

5. The transmitter of claim 3, wherein the radiation source is selected from the group consisting of a UV-LED, an RGB LED system, an organic LED and a cool white LED, said cool white LED having a correlated color temperature between 4 000 K and 20 000 K.

6. The transmitter of claim 1, wherein the frequency converter comprises at least one colorant B selected from the groups B1, B2, B3, B4, B5, B7, B8, B11, B12, B13, B14, B15, B16 or mixtures thereof.

7. The transmitter of claim 1, wherein the frequency converter comprises a combination of organic fluorescent colorants selected from a compound of group B7 and a compound of group B13.

8. The transmitter of claim 1, wherein the polymeric matrix material of the frequency converter is selected from a polystyrene, polycarbonate, polymethylmethacrylate, polymethacrylate, polyvinylpyrrolidone, polyvinyl acetate, polyvinyl chloride, polybutene, silicone, polyacrylate, epoxy resin, polyvinyl alcohol, poly(ethylene vinylalcohol)-copolymer, polyacrylonitrile, polyvinylidene chloride, polystyrene acrylonitrile (SAN), polybutylene terephthalate, polyethylene terephthalate, polyvinyl butyrate, polyvinyl chloride, polyamide, polyoxymethylene, polyimide, polyetherimide, 2,5-furandicarboxylate polyester or mixtures thereof.

9. The transmitter of claim 1, wherein the frequency converter additionally comprises at least one scattering body.

10. The transmitter of claim 1, wherein the frequency converter has a fluorescence decay time (excited-state lifetime) in a range from 0.1 to 9 ns.

11. The transmitter of claim 1, wherein the frequency converter is arranged in a remote arrangement from the radiation source, wherein a distance to the radiation source is in a range from 0.01 to 10 cm.

12. The transmitter of claim 1, wherein the frequency converter is formed by extrusion, printing, coating or moulding.

13. The transmitter of claim 1, wherein the modulator is coupled to the radiation source and wherein the modulator is adapted to control the radiation source so that an intensity of at least a part of the first electromagnetic radiation emitted by the radiation source varies depending on the data to be transmitted.

14. An illumination device, comprising the transmitter of claim 1 transmitting modulated second electromagnetic radiation in the visible spectral range
   wherein the illumination device is adapted to generate a value of a luminous flux of the modulated second electromagnetic radiation being at least in a range from 100 lm to 30 000 lm.

15. A data transmission system, comprising:
   the transmitter of claim 1;
   a receiver, adapted to detect at least a part of the modulated second electromagnetic radiation emitted by the transmitter; and
   a data analyzer for extracting data from the modulated second electromagnetic radiation detected by the receiver.

* * * * *